United States Patent
Kiuchi et al.

(10) Patent No.: US 8,379,186 B2
(45) Date of Patent: Feb. 19, 2013

(54) PATTERN FORMATION APPARATUS, PATTERN FORMATION METHOD, AND DEVICE MANUFACTURING METHOD

(75) Inventors: Tohru Kiuchi, Tokyo (JP); Hideo Mizutani, Yokohama (JP)

(73) Assignee: Nikon Corporation, Tokyo (JP)

( * ) Notice: Subject to any disclaimer, the term of this patent is extended or adjusted under 35 U.S.C. 154(b) by 409 days.

(21) Appl. No.: 12/833,632

(22) Filed: Jul. 9, 2010

(65) Prior Publication Data

US 2011/0013162 A1   Jan. 20, 2011

Related U.S. Application Data

(60) Provisional application No. 61/226,433, filed on Jul. 17, 2009.

(51) Int. Cl.
G03B 27/46 (2006.01)
G03B 27/58 (2006.01)
(52) U.S. Cl. ................. 355/64; 355/72; 355/77
(58) Field of Classification Search .............. 355/50, 355/53, 64, 72, 77
See application file for complete search history.

(56) References Cited

U.S. PATENT DOCUMENTS

| 5,196,745 | A | 3/1993 | Trumper |
| 5,652,645 | A | 7/1997 | Jain |
| 6,243,160 | B1 | 6/2001 | Takano |
| 6,552,775 | B1 | 4/2003 | Yanagihara et al. |
| 6,778,257 | B2 | 8/2004 | Bleeker et al. |
| 8,235,695 | B2 * | 8/2012 | Kiuchi et al. ............. 425/174.4 |
| 2003/0076482 | A1 | 4/2003 | Inoue |
| 2006/0066715 | A1 | 3/2006 | Fukui |
| 2008/0165334 | A1 | 7/2008 | Kumazawa et al. |
| 2011/0012294 | A1 * | 1/2011 | Kiuchi et al. ............. 264/446 |
| 2011/0013162 | A1 * | 1/2011 | Kiuchi et al. ............. 355/53 |

FOREIGN PATENT DOCUMENTS

WO   WO 2011/007896 A1   1/2011

OTHER PUBLICATIONS

PCT International Search Report, mailed on Oct. 14, 2010, for International Application No. PCT/JP2010/062292.
PCT Written Opinion of the International Searching Authority, mailed Oct. 14, 2010, for International Application No. PCT/JP2010/062292.

* cited by examiner

*Primary Examiner* — Thomas R Artman
(74) *Attorney, Agent, or Firm* — Finnegan, Henderson, Farabow, Garrett & Dunner, LLP

(57) ABSTRACT

When a segmented region $SA_i$ of a sheet S is scan-exposed, a stage $SST_1$ adsorbs, at a standby position at the +X end portion of a scan region AS, a rear surface portion corresponding to the segmented region $SA_i$ of the sheet S onto a holding surface of a sheet holder $SH_1$, and moves in the X axis direction (the –X direction) with a predetermined stroke in synchronization with a mask (a mask stage). At this time, illumination beams corresponding to the parts of a pattern of the mask are irradiated onto the sheet S via projection optical systems. Thereby, the pattern is transferred (formed). After scan-exposure on the segmented region $SA_i$, a stage $SST_2$ moves to a standby position within the XY plane. After the stage $SST_2$ adsorbs a rear surface portion corresponding to the next segmented region $SA_{i+1}$ of the sheet S onto a holding surface of a sheet holder $SH_1$, an exposure is performed by the scan-exposure method similarly to the above, to thereby form the pattern.

40 Claims, 26 Drawing Sheets

PATTERN FORMATION APPARATUS, PATTERN FORMATION METHOD, AND DEVICE MANUFACTURING METHOD

CROSS-REFERENCE TO RELATED APPLICATION

This application is a non-provisional application claiming priority to and the benefit of U.S. provisional application No. 61/226,433, filed Jul. 17, 2009. The entire contents of which are incorporated herein by reference.

BACKGROUND

1. Field of the Invention

The present invention relates to a pattern formation apparatus, a pattern formation method, and a device manufacturing method. More particularly, the present invention relates to a pattern formation apparatus and a pattern formation method that form a pattern on a plurality of regions on the surface of a long sheet material by means of scanning exposure, and to a device manufacturing method that uses the pattern formation method to manufacture electronic devices.

2. Description of Related Art

Flat display panels such as liquid display panels and plasma display panels are increasingly growing in size. For example, in the case of liquid display panels, glass substrates (large substrates) with edges more than 3 m long have come to be used for their manufacture in order to efficiently produce a plurality of screen segments in a batch. As a result, in stage apparatuses that hold a substrate, the larger the substrate is, the larger the stage apparatus becomes. In stage apparatuses that process substrates that weigh tens of kilograms, the weight of the movable portions has come to be nearly 10 tons, and the weight of the entire apparatus has come to be over 100 tons. Therefore, in the near future, the substrates are expected to be further larger, resulting in difficulty in their manufacture and transfer. In addition, it is certain that the stage apparatuses will become further larger, requiring heavy investment in building an infrastructure.

On the other hand, there is known an exposure apparatus that uses a rolled-sheet-like recording medium as a substance to be exposed. The exposure apparatus is adopted mainly in the manufacturing field of printed wiring boards. If such an exposure apparatus is used in the manufacture of, for example, liquid display elements, a variety of problems involved in the aforementioned enlarging of the glass substrates are eliminated. Therefore, the exposure apparatus is expected to be one of the options for the future exposure apparatuses for manufacturing liquid crystal elements.

Exposure apparatuses for a conventional sheet-like recording medium include those disclosed Patent Documents (U.S. Pat. No. 5,652,645, U.S. Patent Application No. 2006/0066715, and U.S. Pat. No. 6,243,160). However, if any of the exposure apparatuses is used as it is for manufacturing liquid display elements, it is difficult to achieve desired accuracy and throughput.

SUMMARY

According to a first aspect of the present invention, there is provided a first pattern formation apparatus that forms a predetermined pattern in a plurality of regions on a surface of a long sheet material by use of a scan exposure in which the sheet material is scan-moved along a first axis parallel to a longitudinal direction of the sheet material while energy beams corresponding to the pattern are irradiated onto the sheet material, including first and second movable stages each of which has a reference surface capable of adsorbing a rear surface portion of the sheet material and which is movable within a two-dimensional plane parallel to the reference surface including the first axis, in which the first movable stage adsorbs, at a predetermined adsorption position, a rear surface portion corresponding to a first region of the sheet material onto the reference surface, and moves in a direction parallel to the first axis with a predetermined stroke, and in which the second movable stage moves to the predetermined adsorption position within the two-dimensional plane, and adsorbs a rear surface portion corresponding to a second region of the sheet material onto the reference surface.

According to this, the first movable stage adsorbs, at a predetermined adsorption position, a rear surface portion corresponding to the first region of the sheet material onto the reference surface, and moves in a direction parallel to the first axis. At this time, energy beams corresponding to a predetermined pattern are irradiated onto the sheet material. This exposes the first region of the sheet material to form a pattern thereon. The second movable stage moves to the predetermined adsorption position within the two-dimensional plane, and adsorbs a rear surface portion corresponding to the second region of the sheet material onto the reference surface. After the adsorption of the rear surface portion corresponding to the second region of the sheet material onto the reference surface, the sheet material is moved in the direction parallel to the first axis with a predetermined stroke. As a result, during the movement, it is possible to expose the second region of the sheet material to form the pattern thereon. This makes it possible to form the pattern sequentially on the first and second regions of the sheet material.

According to a second aspect of the present invention, there is provided a second pattern formation apparatus that forms a predetermined pattern in a plurality of regions on a surface of a long sheet material while energy beams corresponding to the pattern are irradiated onto the sheet material, including: a first feeding apparatus that feeds a long first sheet material from a first side to a second side in a direction parallel to a first axis within a two-dimensional plane; a second feeding apparatus that feeds a long second sheet material from the second side to the first side in the direction parallel to the first axis, at a position spaced from the first sheet material in a direction parallel to a second axis that crosses the first axis within the two-dimensional plane; and first and second movable stages each of which has a reference surface capable of adsorbing rear surface portions of the first and second sheet materials and which is movable within a two-dimensional plane parallel to the reference surface including the first axis, in which the first movable stage adsorbs, at a predetermined first adsorption position, a rear surface portion corresponding to a first region of the first sheet material onto the reference surface, and moves in a feed direction of the first sheet material with a predetermined stroke, while the second movable stage adsorbs, at a predetermined second adsorption position, a rear surface portion corresponding to a second region of the second sheet material onto the reference surface, and moves in a feed direction of the second sheet material with a predetermined stroke.

According to this, the first movable stage adsorbs, at a predetermined first adsorption position, a rear surface portion corresponding to the first region of the first sheet material onto the reference surface, and moves in the feed direction of the first sheet material with a predetermined stroke, while the second movable stage adsorbs, at a predetermined second adsorption position, a rear surface portion corresponding to the second region of the second sheet material onto the reference surface, and moves in the feed direction of the second sheet material with a predetermined stroke. Therefore, with the irradiation of energy beams corresponding to a predetermined pattern onto the first and second sheet materials when the first and second sheet materials of the first and second movable stages are moved in their feed directions, the first region of the first sheet material and the second region of the second sheet material are exposed substantially simultaneously, and the pattern is formed on both the regions.

According to a third aspect of the present invention, there is provided a pattern formation method of forming a predetermined pattern in a plurality of regions on a surface of a long sheet material by use of a scan exposure in which the sheet material is scan-moved along a first axis parallel to a longitudinal direction of the sheet material while energy beams corresponding to the pattern are irradiated onto the sheet material, in which a first movable stage adsorbs, at a predetermined adsorption position, a rear surface portion corresponding to a first region of the sheet material onto a reference surface, and moves in a direction parallel to the first axis with a predetermined stroke, and in which a second movable stage moves to the predetermined adsorption position within the two-dimensional plane, and adsorbs a rear surface portion corresponding to a second region of the sheet material onto the reference surface.

According to this, it is possible to form a pattern sequentially on the first and second regions of the sheet material.

According to a fourth aspect of the present invention, there is provided a device manufacturing method including: using the pattern formation method of the present invention to form patterns on a long sheet material; and subjecting the sheet material formed with the patterns to processing.

DESCRIPTION OF EMBODIMENTS

<First Embodiment>

Hereunder is a description of a first embodiment of the present invention, based on FIG. 1 to FIG. 18.

Figure 1:
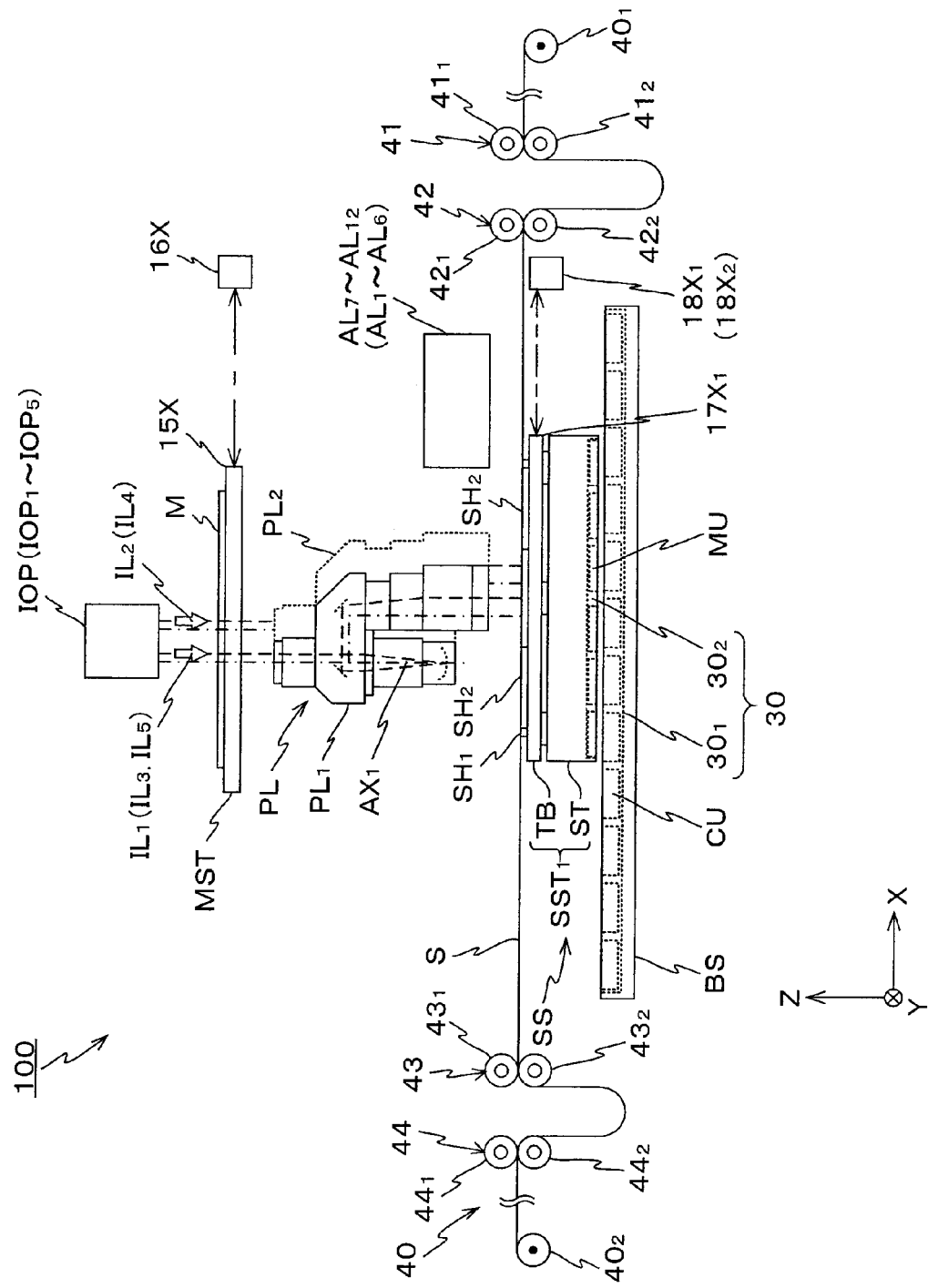
FIG. 1 is a diagram schematically showing a construction of an exposure apparatus according to a first embodiment.

FIG. 1 shows a schematic construction of an exposure apparatus 100 of the first embodiment. The exposure apparatus 100 is a multi-lens type projection exposure apparatus that uses a flexible sheet or film (hereinafter, generically referred to as a sheet) as an object to be exposed. That is, the exposure apparatus 100 is a so-called scanner. In the present embodiment, it is supposed that a sheet with a thickness of approximately 100 μm is used by way of example.

The exposure apparatus 100 includes: an illumination system IOP; a mask stage MST for holding a mask M; a projection optical system PL for projecting an image of a pattern formed on the mask M onto a sheet S; a stage apparatus SS including two sheet stages (hereinafter, each is referred to simply as a stage) $SST_1$, $SST_2$ (stage $SST_2$ omitted in FIG. 1; see FIG. 5) for holding the sheet S; a sheet transfer system 40 for transferring the sheet S; and a control system for these.

The sheet S for use in the exposure apparatus 100 of the present embodiment is a continuous long sheet. The sheet S is set in a state of being wound in a roll around a roller $40_1$. As will be described later, the sheet S is extracted from the roller $40_1$ by a sheet transfer system 40 (transfer roller portions 41 to 44 provided in the sheet transfer system 40), and is wound by a roller $40_2$ after passing through a region directly below the projection optical system PL. Furthermore, a surface of the sheet S is coated with a photosensitive material (a resist). In the present embodiment, the sheet S is extracted (fed) from the roller $40_1$, and is wound by the roller $40_2$, by way of example. However, the construction is not limited to this. A sheet that is fed from an apparatus for performing pre-exposure processing, for example, a resist coating apparatus for coating a resist and is supplied to an apparatus for performing post-exposure processing, for example, a development apparatus for carrying out development can be exposed by the exposure apparatus 100.

In the following description, a vertical direction parallel to the optical axes of the object plane side portion and the image plane side portion of the projection optical system PL (except for the intermediate portion between the two portions) (the up-down direction in FIG. 1) is made the Z axis direction, a scanning direction in which the mask M and the sheet S are relatively scanned with respect to the projection optical system PL within the plane orthogonal to the Z axis direction (the left-right direction in FIG. 1) is made the X axis direction, a direction orthogonal to both the Z axis and the X axis is made the Y axis direction, and rotation (inclination) directions about the X axis, the Y axis, and the Z axis are made the θx, the θy, and the θz directions, respectively.

The illumination system IOP includes a plurality of (five, in this case) illumination system modules (hereinafter, each is referred to simply as an illumination system) $IOP_1$ to $IOP_5$. Each of the illumination systems $IOP_1$ to $IOP_5$ includes: an extra-high voltage mercury lamp (light source) that emits ultraviolet beams; an elliptic mirror that collects the beams from the light source; a wavelength selection filter that is arranged on the optical path of the collected ultraviolet beam; an optical integrator; and an illumination optical system including a field stop (all of these are not shown in the figure). Via the wavelength selection filter, a bright line in the ultraviolet range, for example, the i-line (wavelength: 365 nm), the g-line (wavelength: 436 nm), the h-line (wavelength: 405 nm) or the like is extracted as one of illumination beams $IL_1$ to $IL_5$. The extracted illumination beams $IL_1$ to $IL_5$ are ejected outside the illumination system IOP ($IOP_1$ to $IOP_5$) (toward the mask M) respectively along optical axes $AX_1$ to $AX_5$ (see FIG. 2).

Figure 2:
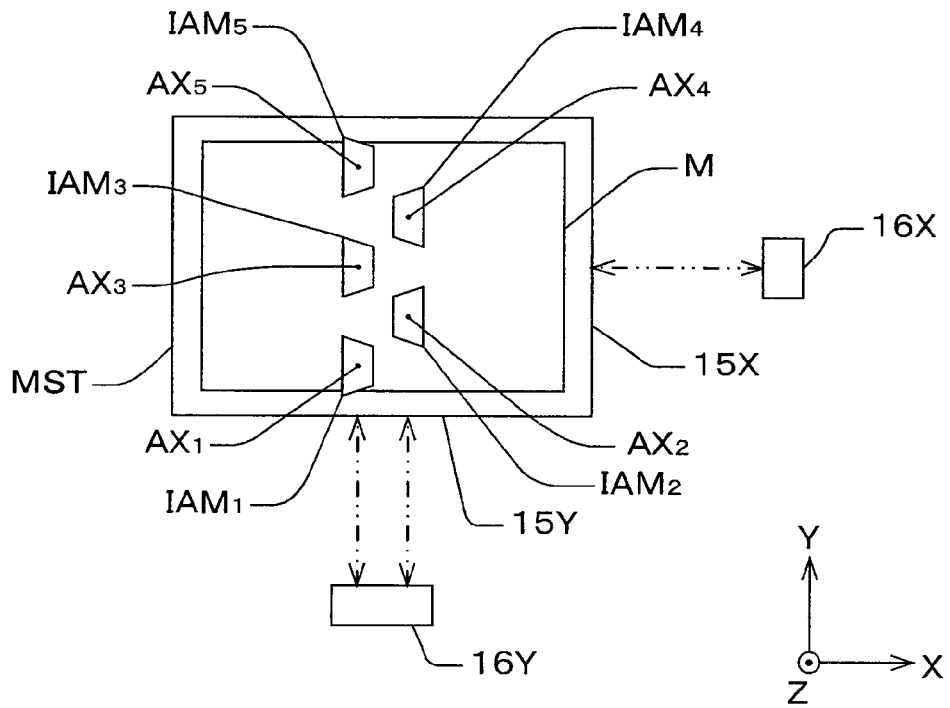
FIG. 2 is a plan view showing a schematic construction of a mask stage provided in the exposure apparatus of FIG. 1 and an arrangement of the illumination regions thereof.
Figure 3:
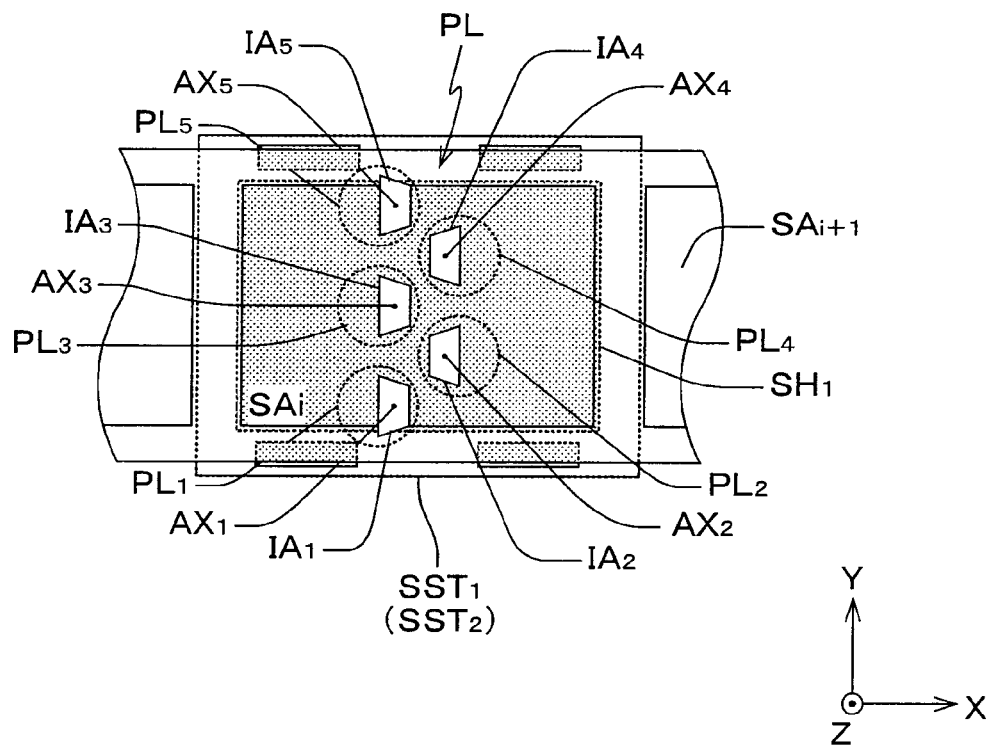
FIG. 3 is a plan view showing an arrangement of a projection optical system provided in the exposure apparatus of FIG. 1 and projection regions (exposure regions) on a sheet.

The optical axes $AX_1$, $AX_3$, $AX_5$ are mutually spaced apart by a predetermined distance in the Y axis direction within the XY plane (pattern surface of the mask M), as shown in FIG. 2. The optical axes $AX_2$, $AX_4$ are arranged respectively between the optical axes $AX_1$, $AX_3$, and the optical axes $AX_3$, $AX_5$, spaced away from the optical axes $AX_1$, $AX_3$, $AX_5$ on the +X side by a predetermined distance. That is, the optical axes $AX_1$ to $AX_5$ are arranged within the XY plane in a zigzag manner.

The illumination systems $IOP_1$ to $IOP_5$ respectively use illumination beams $IL_1$ to $IL_5$ to illuminate illumination regions $IAM_1$ to $IAM_5$ on the mask M around the optical axes $AX_1$ to $AX_5$ with a uniform luminance. Each illumination region has a shape of an isosceles trapezoid defined by a field stop in the corresponding illumination optical system (not shown in the figure). Details of the construction of the illumination system IOP ($IOP_1$ to $IOP_5$) are disclosed in, for example, U.S. Pat. No. 6,552,775, and the like.

The mask stage MST is arranged below (on the −Z side of) the illumination system IOP, as shown in FIG. 1. On the mask stage MST, there is fixed a rectangular mask M with a rectangular pattern region formed on its pattern surface (the surface on the −Z side) by, for example, vacuum attraction. The mask stage MST is capable of being finely driven within the XY plane and is also capable of being driven in the scanning direction (the X axis direction) at a predetermined scanning speed with a predetermined stroke by a mask stage drive system MSD including a linear motor or the like (not shown in FIG. 1; see FIG. 8).

Positional information of the mask stage MST within the XY plane is always measured with a resolution of, for example, approximately 0.25 to 1 nm by laser interferometers (hereinafter, each is referred to simply as an interferometer) 16X, 16Y that constitute part of a mask stage interferometer system 16 (see FIG. 8). The +X side surface and the −Y side surface of the mask stage MST are mirror-finished, to thereby form reflection surfaces 15X, 15Y, as shown in FIG. 2. The interferometer 16X irradiates a plurality of length measuring beams along optical paths parallel to the X axis onto the reflection surface 15X, and receives reflected beams off the reflection surface 15X, to thereby measure a position in the X axis direction (an X position) and a rotation in the θz direction of the mask stage MST. A substantial length measurement axis of the interferometer 16 is parallel to the X axis that is orthogonal to the optical axis $AX_3$. The interferometer 16Y irradiates two length measuring beams along optical paths parallel to the Y axis that are orthogonal respectively to the optical axes $AX_1$ and $AX_2$ onto the reflection surface 15Y, and receives reflected beams off the reflection surface 15Y, to thereby measure a position in the Y axis direction (a Y position) of the mask stage MST. Note that, instead of the aforementioned reflection surfaces 15X, 15Y, movement mirrors made of flat mirrors may be fixed on the mask stage MST.

Figure 8:
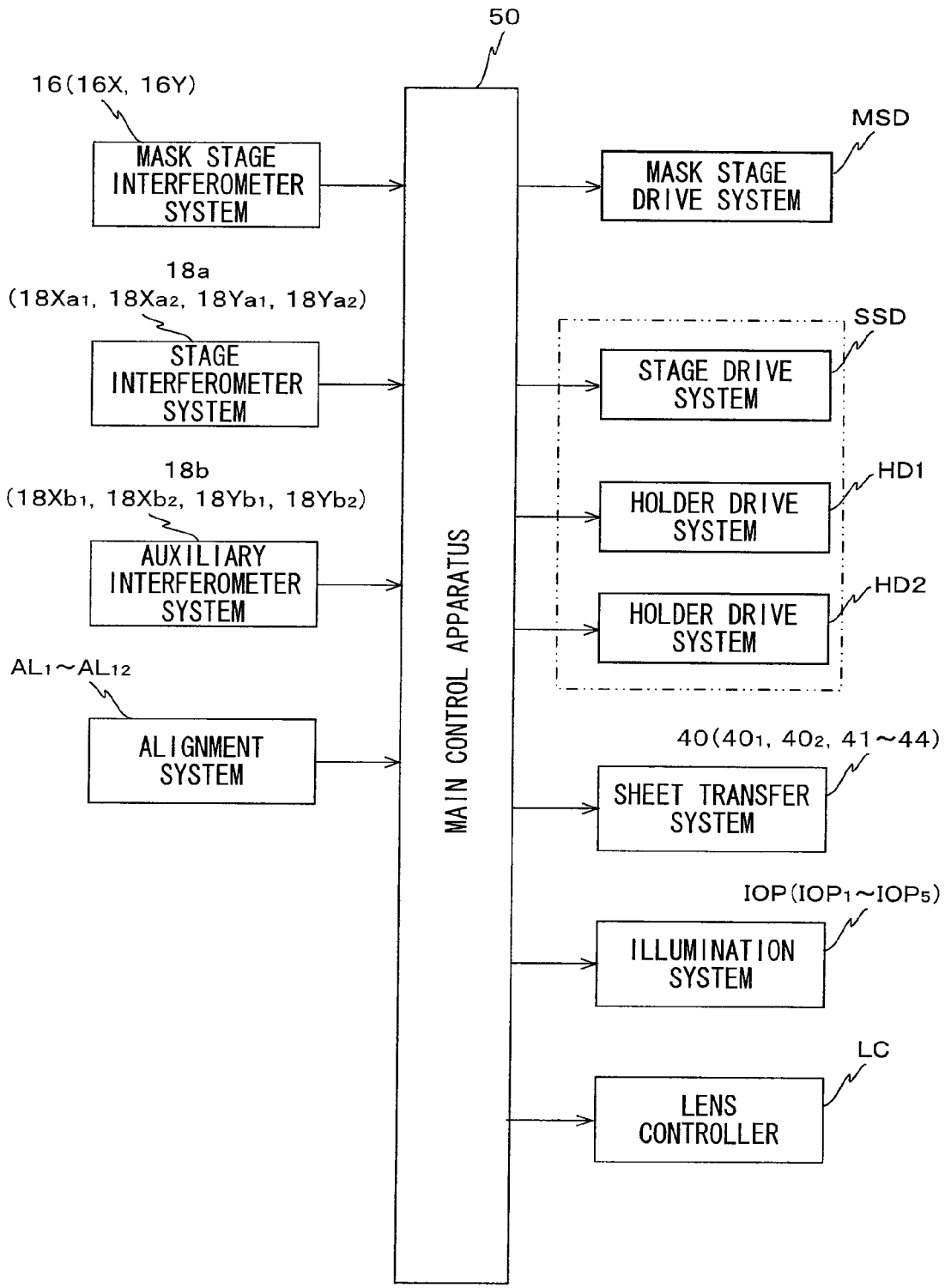
FIG. 8 is a block diagram showing an input/output relationship of a main control apparatus provided in the exposure apparatus of FIG. 1.

Measurement information from the interferometers 16X, 16Y is supplied to a main control apparatus 50 (see FIG. 8). Based on the measurement information from the interferometers 16X, 16Y (the positional information on the mask stage MST), the main control apparatus 50 controls the mask stage MST via the mask stage drive system MSD.

The projection optical system PL is arranged below (on the −Z side of) the mask stage MST, as shown in FIG. 1. The projection optical system PL of the present embodiment is, as shown for example in FIG. 3, includes five projection optical system modules (hereinafter, each is referred to simply as a projection optical system) $PL_1$ to $PL_5$ that are staggered correspondingly to the arrangement of the optical axes $AX_1$ to $AX_5$. In FIG. 1, the projection optical systems $PL_3$, $PL_5$, and $PL_4$ are positioned on the side behind the projection optical systems $PL_1$ and $PL_2$. As each of the projection optical systems $PL_1$ to $PL_5$, for example a bilateral telecentric catadioptric system that forms an equal-size erect image on the image plane is used.

With the aforementioned arrangement of the projection optical systems $PL_1$ to $PL_5$ (the optical axes $AX_1$ to $AX_5$), the projection regions $IA_1$ to $IA_5$ on the sheet S on which the images of the patterns are projected by the projection optical systems $PL_1$ to $PL_5$ are arranged in a zigzag manner, similarly to the illumination regions $IAM_1$ to $IAM_5$. Here, the projection regions $IA_1$ to $IA_5$ have a shape of an isosceles trapezoid similar to that of the illumination regions $IAM_1$ to $IAM_5$. With the arrangement and the shape of the projection regions $IA_1$ to $IA_5$, the images of the pattern (the partial images) in the illumination regions $IAM_1$ to $IAM_5$ on the mask M are projected onto the projection regions $IA_1$ to $IA_5$ on the sheet S respectively via the projection optical systems $PL_1$ to $PL_5$ while the mask M and the sheet S are synchronously driven in the scanning direction (the X axis direction). Thereby, the partial images projected onto the sheet S are synthesized into a single image (a synthesized image) equal to the pattern formed on the mask M. Accordingly, through scanning exposure, the pattern on the mask M is transferred onto (a single shot region (segmented region) $SA_i$ of) the sheet S via the projection optical systems $PL_1$ to $PL_5$. Note that details of the scanning exposure will be described later.

In the present embodiment, optical systems that project an equal-size erect image are adopted as the projection optical systems $PL_1$ to $PL_5$. Therefore, the shapes and the arrangement (positional relationship) of the projection regions $IA_1$ to $IA_5$ are the same as the shapes and the arrangement (positional relationship) of the illumination regions $IAM_1$ to $IAM_5$. Details of the construction of the projection optical system PL of the present embodiment are disclosed in, for example, U.S. Pat. No. 6,552,775, and the like.

The exposure apparatus 100 includes a lens controller LC (see FIG. 8) that corrects distortion (positional displacement and/or shape error) of the projected images projected onto the sheet S by the projection optical systems $PL_1$ to $PL_5$. The lens controller LC drives at least one of the optical element groups (lens groups) that respectively constitute the projection optical systems $PL_1$ to $PL_5$ in a direction parallel to the optical axes $AX_1$ to $AX_5$ and in an optional inclination direction with respect to the XY plane vertical to the optical axes $AX_1$ to $AX_5$. This corrects distortion (shift, rotation, magnification (scaling), and the like) of the pattern's partial images projected onto the projection regions $IA_1$ to $IA_5$ on the sheet S. Instead of or in addition to the drive of the aforementioned optical group(s), the lens controller LC may change a pressure of a gas in an airtight chamber formed in the interior of each of the projection optical systems $PL_1$ to $PL_5$, or additionally change the wavelength of the illumination beam.

The stage apparatus SS is arranged below (on the −Z side of) the projection optical system PL ($PL_1$ to $PL_5$), as shown in FIG. 1. The stage apparatus SS includes: a base member BS that is supported on the floor substantially horizontally by a vibration absorption mechanism (not shown in the figure); two stages $SST_1$, $SST_2$ (stage $SST_2$ not shown in FIG. 1; see FIG. 5 and the like) that move on the base member BS while holding the sheet S; a stage drive system SSD (not shown in FIG. 1; see FIG. 8) that drives the stages $SST_1$, $SST_2$; and a stage interferometer system 18a (see FIG. 8) and an auxiliary interferometer system 18b (see FIG. 8) that measure positional information of the stages $SST_1$, $SST_2$. In FIG. 1, the sheet S is adsorbedly held on the stage $SST_1$.

As shown in FIG. 1, each of the stages $SST_1$, $SST_2$ includes: a stage main unit ST that is floatingly supported above the base member BS by a plurality of non-contact bearings (for example, air bearings (not shown in the figure)) provided on its bottom surface; a Z leveling apparatus 38 (see FIG. 4A) arranged on the stage main unit ST; and a table TB supported by the Z leveling apparatus 38 at three points.

Figure 4A:
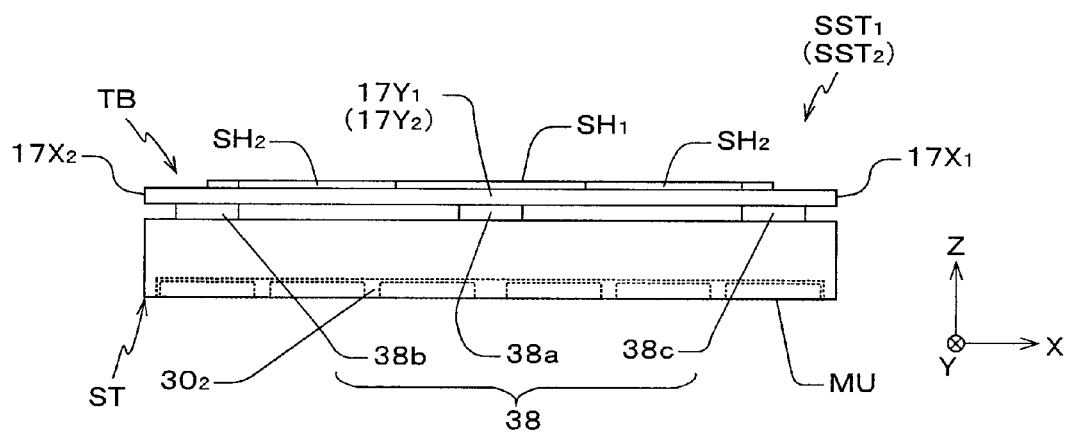
FIG. 4A and FIG. 4B are respectively a side view and a plan view showing a schematic construction of a stage.
Figure 4B:
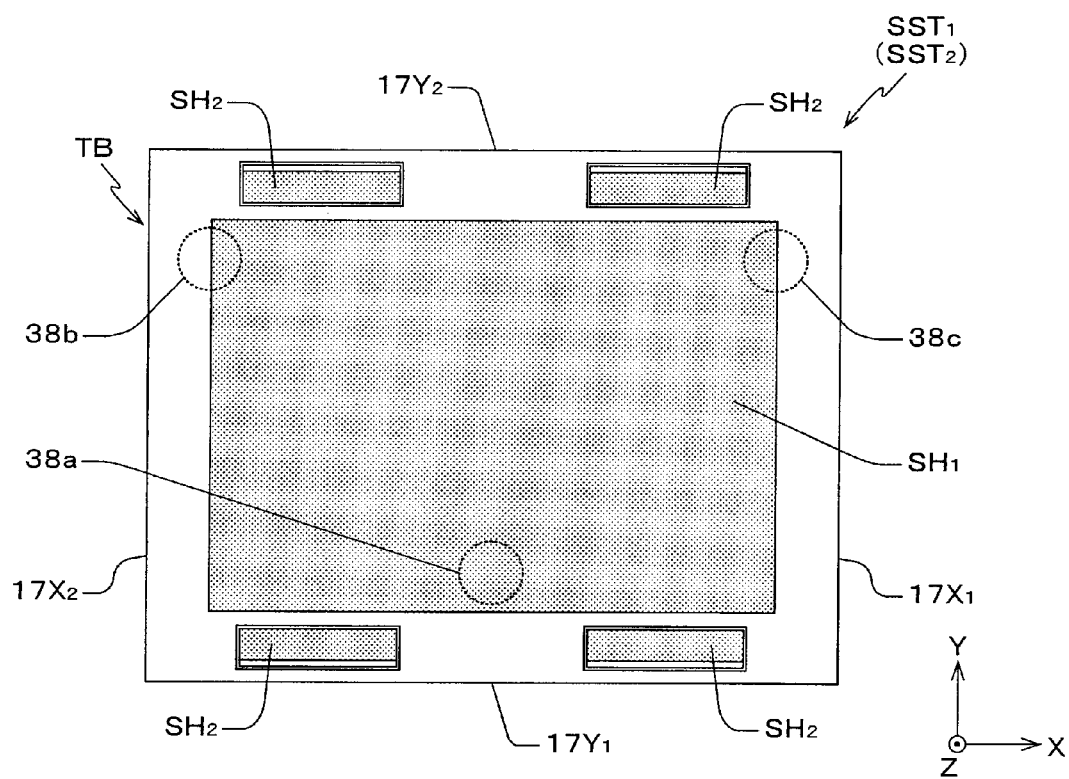

As shown in FIG. 4B, the Z leveling apparatus 38 has three Z drive mechanisms 38a, 38b, and 38c, which each include for example a voice coil motor or the like, arranged at three points not in a line on the stage main unit ST. The Z leveling apparatus 38 allows the table TB to be finely driven on the stage main unit ST in directions of three degrees of freedom of: the Z axis direction, the θx direction, and the θy direction.

The stages $SST_1$, $SST_2$ are driven on the base member BS in the X axis direction, the Y axis direction, and the Oz direction by the flat motor 30 shown in FIG. 1.

The flat motor 30 is made of: a stator $30_1$ arranged in the interior of the base member BS; movers $30_2$ fixed in the bottom portions of the stage main units ST of the stages $SST_1$, $SST_2$. The stator $30_1$ includes a plurality of armature coils (a coil unit CU) arrayed in a matrix in the interior of the base member BS. The mover $30_2$ includes a plurality of permanent magnets (a magnet unit MU) arrayed in a matrix in the bottom portion of stage main unit ST of each of the stages $SST_1$, $SST_2$ so as to face the top surface of the base member BS. Here, the plurality of permanent magnets are arrayed so that adjacent magnetic surfaces are opposite in polarity. With the plurality of armature coils (the coil unit CU) and the plurality of permanent magnets (the magnet unit MU), the flat motor 30 on the Lorentz electromagnetic force drive system as disclosed in, for example, U.S. Pat. No. 5,196,745 and the like is constructed.

The coil unit CU is covered with a flat-plate-like member (not shown in the figure) that functions as a top surface of the base member BS. The top surface of the flat-plate-like member functions as a guide surface for the stages $SST_1$, $SST_2$ when they are moved.

The flat motor 30 is not limited to a moving magnet type, but may be a moving coil type. Furthermore, the flat motor 30 is not limited to a flat motor on the Lorentz electromagnetic force drive system, but may be a flat motor on a system such as a variable magnetic resistance drive system or a magnetic float system. In the latter case, it is not necessary to provide a non-contact bearing on the bottom surface of the stage main unit ST.

The tables TB of the stages $SST_1$, $SST_2$ are independently driven in directions of six degrees of freedom of: the X axis direction, the Y axis direction, the Z axis direction, the θx direction, the θy direction, and the θz direction on the base member BS by the stage drive system SSD including the flat motor 30 and the Z leveling apparatus 38 (see FIG. 8).

In the central portion of each table TB, there is provided a sheet holder $SH_1$ for adsorbingly holding the sheet S, as shown in FIG. 4A and FIG. 4B. The sheet holder $SH_1$ has a rectangular holding surface that is substantially parallel to the XY plane and is slightly larger than the segmented regions arranged on the sheet S. The sheet holder $SH_1$ holds the sheet S on its holding surface in a flat manner. Here, in order to adsorbingly hold the sheet S, a pinchuck holder with a sufficiently narrow spacing between pins (pitch), in which the pins are low, for example, with a height of approximately 200 µm, is adopted as the sheet holder $SH_1$.

On the top surface of the table TB, there are provided four auxiliary sheet holders $SH_2$ for adsorbingly holding a rear surface of the sheet S at both sides in its width direction (the Y axis direction orthogonal to its length direction). To be more specific, on the ±Y sides of the sheet holder $SH_1$, two auxiliary sheet holders $SH_2$, which are elongated in the X axis direction, are respectively spaced apart by a predetermined distance in the X axis direction. Each auxiliary sheet holder $SH_2$ has an oblong holding surface, and is capable of being finely driven in the Y axis direction and the Z axis direction by holder drive systems HD1, HD2 (see FIG. 8) provided in the table TB. As will be described later, the auxiliary sheet holders $SH_2$ are used in an auxiliary manner when the sheet S is held on the sheet holder $SH_1$ in a flat manner. Here, the holder drive system HD1 is provided in the stage $SST_1$, and the holder drive system HD2 is provided in the stage $SST_2$.

The +X side surface, the −Y side surface, the −X side surface, and the +Y side surface of the table TB are mirror-finished to form reflection surfaces $17X_1$, $17Y_1$, $17X_2$, and $17Y_2$, respectively. The reflection surfaces $17X_1$, $17Y_1$, $17X_2$, and $17Y_2$ are used for the position measurements of the stages $SST_1$, $SST_2$ by the later-described stage interferometer system and auxiliary interferometer system. Instead of the aforementioned reflection surfaces $17Y_1$, $17Y_2$, movement mirrors made of flat mirrors may be fixed on the table TB. Furthermore, instead of the reflection surfaces $17X_1$, $17X_2$, movement mirrors made of retroreflectors or flat mirrors may be fixed on the table TB.

Figure 5:
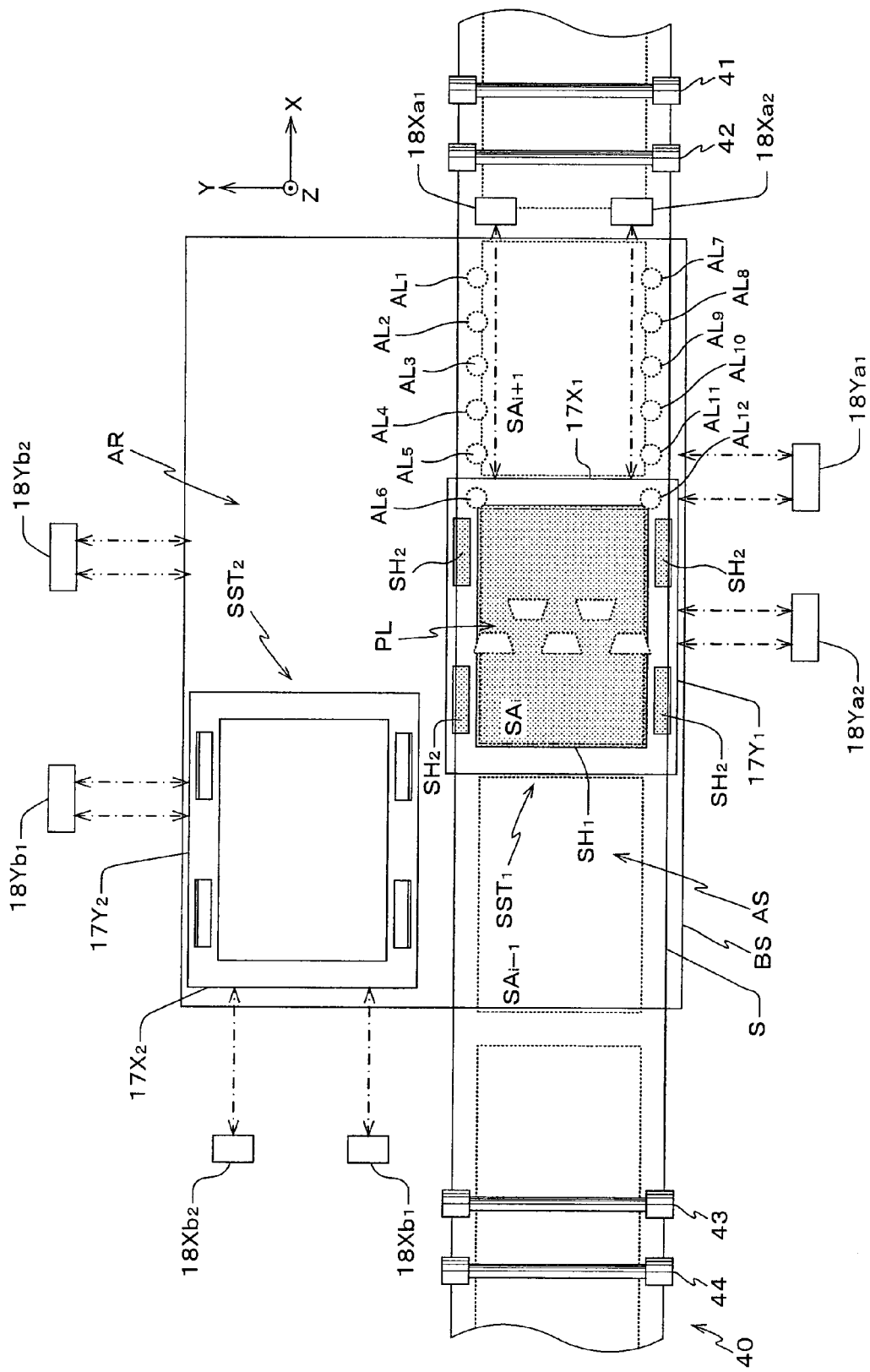
FIG. 5 is a plan view showing a schematic construction of a stage apparatus provided in the exposure apparatus of FIG. 1.

As shown in FIG. 5, the stage interferometer system 18a (see FIG. 8) includes interferometers $18Xa_1$, $18Xa_2$, $18Ya_1$, and $18Ya_2$, and always measures the positional information within the XY plane (including the rotation information in the θz direction) of the stage $SST_1$ or $SST_2$ (the table TB) that is positioned in a region AS, which is a half region on the −Y side of the top surface of the base member BS, (hereinafter, referred to as a scan region) (see FIG. 5) with a resolution of, for example, 0.25 to 1 nm. In FIG. 5, the stage $SST_1$ is positioned in the scan region AS.

On the other hand, the auxiliary interferometer system 18b (see FIG. 8) includes interferometers $18Xb_1$, $18Xb_2$, $18Yb_1$, and $18Yb_2$, and always measures the positional information within the XY plane (including the rotation information in the θz direction) of the stage $SST_1$ or $SST_2$ (table TB) that is positioned in a region AR, which is a half region on the +Y side of the top surface of the base member BS, (hereinafter, referred to as a avoiding region (retraction region)) (see FIG. 5) with a resolution of, for example, 0.25 to 1 nm. In FIG. 5, the stage $SST_2$ is positioned in the avoiding region AR.

The interferometers $18Xa_1$, $18Xa_2$ and $18Ya_1$, $18Ya_2$ are arranged respectively on the +X side and the −Y side of the scan region AS (the projection optical system PL) so as to be capable of respectively facing the reflection surfaces $17X_1$ and $17Y_1$ of the stage $SST_1$ or $SST_2$ positioned in the scan region AS. The interferometers $18Xb_1$, $18Xb_2$ and $18Yb_1$, $18Yb_2$ are arranged respectively on the −X side and the +Y side of the avoiding region AR so as to be capable of respectively facing the reflection surfaces $17X_2$ and $17Y_2$ of the stage $SST_1$ or $SST_2$ positioned in the avoiding region AR.

The interferometers $18Xa_1$, $18Xa_2$ each irradiate a length measuring beam parallel to the X axis onto the reflection surface $17X_1$ of the stage $SST_1$ positioned in the scan region AS, and receive a reflected beam off the reflection surface $17X_1$, to thereby measure the X position of the stage $SST_1$. The interferometers $18Ya_1$, $18Ya_2$ each irradiate two length measuring beams parallel to the Y axis onto the reflection surface $17Y_1$, and receive reflected beams off the reflection surface $17Y_1$, to thereby measure the Y position of the stage $SST_1$. Here, one of the two length measuring beams of the interferometer $18Ya_2$ is irradiated onto the reflection surface $17Y_1$ along an optical path parallel to the Y axis orthogonal to the optical axes $AX_1$, $AX_3$, and $AX_5$. The other of the two length measuring beams of the interferometer $18Ya_2$ is irradiated onto the reflection surface $17Y_1$ along an optical path parallel to the Y axis orthogonal to the optical axes $AX_2$, $AX_4$. The two length measuring beams of the interferometer $18Ya_1$ irradiated onto the reflection surface $17Y_1$ along an optical path parallel to the Y axis that passes through a center of detection of the adjacent alignment systems out of the alignment systems (described later).

The measurement information from the stage interferometer system 18a (the interferometers $18Xa_1$, $18Xa_2$, $18Ya_1$, and $18Ya_2$) is supplied to the main control apparatus 50 (see FIG. 8). In the case where the stage $SST_1$ is positioned in the scan region AS, the length measuring beams of at least one of the interferometers $18Ya_1$, $18Ya_2$, or the interferometer $18Yb_1$ are inevitably irradiated onto the corresponding reflection surface ($17Y_1$ or $17Y_2$) of the stage $SST_1$, irrespective of the X position of the stage $SST_1$. Therefore, the main control apparatus 50 uses the measurement information from any of the interferometers $18Ya_1$, $18Ya_2$, and $18Yb_1$ in accordance with the X position of the stage $SST_1$. In addition, the main control apparatus 50 measures the rotation of the stage $SST_1$ in the θz direction based on the measurement information from the interferometers $18Xa_1$, $18Xa_2$. In the case where the stage $SST_2$ is positioned in the scan region AS, its positional information is similarly measured.

The interferometers $18Xb_1$, $18Xb_2$ each irradiate a length measuring beam parallel to the X axis onto the reflection surface $17X_2$ of the stage $SST_2$ positioned in the avoiding region AR, and receive a reflected beam off the reflection surface $17X_2$, to thereby measure the X position of the stage $SST_2$. The interferometers $18Yb_1$, $18Yb_2$ each irradiate two length measuring beams parallel to the Y axis onto the reflection surface $17Y_2$ and receive reflected beams off the reflection surface $17Y_2$, to thereby measure the Y position of the stage $SST_2$.

The measurement information from the auxiliary interferometer system 18b (the interferometers $18Xb_1$, $18Xb_2$, $18Yb_1$, and $18Yb_2$) is supplied to the main control apparatus 50 (see FIG. 8). In the case where the stage $SST_2$ is positioned in the avoiding region AR, the length measuring beams of at least one of the interferometers $18Yb_1$, $18Yb_2$ are inevitably irradiated onto the reflection surface $17Y_2$ of the stage $SST_2$, irrespective of the X position of the stage $SST_2$. Therefore, the main control apparatus 50 uses the measurement information from either of the interferometers $18Yb_1$, $18Yb_2$ in accordance with the X position of the stage $SST_2$. In addition, the main control apparatus 50 measures the rotation of the stage $SST_2$ in the θz direction based on the measurement information from the interferometers $18Xb_1$, $18Xb_2$. In the case where the stage $SST_1$ is positioned in the avoiding region AR, its positional information is similarly measured.

The main control apparatus 50 controls the stages $SST_1$, $SST_2$ via the stage drive system SSD based on the positional information from the stage interferometer system 18a and the auxiliary interferometer system 18b.

As each of the interferometers $18Xa_1$, $18Xa_2$, $18Ya_1$, and $18Ya_2$, and each of the interferometers $18Xb_1$, $18Xb_2$, $18Yb_1$, and $18Yb_2$, a multiaxial interferometer that irradiates a plurality of length measuring beams spaced in the Z axis direction onto the reflection surface can be used. In this case, the main control apparatus 50 is capable of obtaining not only the positional information (the rotation information (including a yawing amount (a rotation amount θz in the θz direction)) of the stages $SST_1$, $SST_2$ (the tables TB) within the XY plane, but also the inclination information (a pitching amount (a rotation amount θx in the θx direction) and a rolling amount (a rotation amount θy in the θy direction)) of the stages $SST_1$, $SST_2$ (the tables TB) with respect to the XY plane.

The sheet transfer system 40 includes four transfer roller portions 41, 42, 43, and 44 that are arrayed in the X axis direction across the projection optical system PL, as shown in FIG. 1 and FIG. 5.

Each of the transfer roller portions 41, 42, 43, and 44 includes a pair of a pressure roller and a drive roller positioned vertically as shown in, for example, FIG. 6A to FIG. 6G Drive rollers $41_2$, $42_2$, $43_2$, and $44_2$ positioned on the lower side have their both ends rotatably supported by a support member (not shown in the figures) so that their top ends are positioned slightly above (on the +Z side of) the top surface (the holding surface of the sheet holder $SH_1$) of the stage $SST_1$ ($SST_2$) (see FIG. 1). The drive rollers $41_2$, $42_2$, $43_2$, and $44_2$ are rotationally driven by rotational motors (not shown in the figure). The pressure rollers $41_1$, $42_1$, $43_1$, and $44_1$ positioned on the upper side are pushed against their corresponding drive rollers from above (the +Z side) by spring mechanisms (not shown in the figure).

Figure 6A:
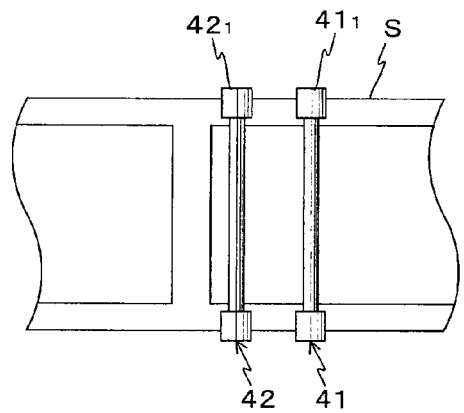
FIG. 6A is a plan view showing the vicinity of transfer roller portions 41, 42.
Figure 6B:
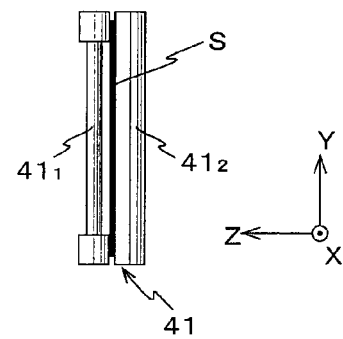
FIG. 6B is a side view showing the transfer roller portion 41.

As shown in FIG. 6B that illustrates the transfer roller portion 41, the pressure roller $41_1$ is a cylindrical roller with small steps in which the portion other than the end portions in the longitudinal direction has a smaller diameter than the end portions. The drive roller $41_2$ is a cylindrical roller with a constant diameter.

In each of the transfer roller portions 41, 42, 43, and 44, the sheet S is sandwiched, as shown in FIG. 6B that illustrates the transfer roller portion 41 as representative, between the pressure roller $41_1$ and the drive roller $41_2$. When the sheet S is sandwiched, the pressure roller $41_1$ is not in contact with the segmented region on the surface of the sheet S on which the pattern is to be formed. Each of the transfer roller portions 41, 42, 43, and 44 can be set to: a first state in which the sheet S is allowed to be sandwiched between the pressure roller ($41_1$) and the drive roller ($41_2$); and a second state in which the sheet S is allowed to be released from the sandwiching as a result of the pressure roller ($41_1$) being spaced from the drive roller ($41_2$) while resisting the pressing force of the spring mechanism. The switching between the first state and the second state in each of the transfer roller portions 41, 42, 43, and 44 is carried out by the main control apparatus 50. Note that at least one drive roller may be formed in a cylindrical shape with steps similarly to the pressure roller $41_1$.

The drive rollers $41_2$, $42_2$, $43_2$, and $44_2$ together with the rollers $40_1$, $40_2$ have their rotation and stopping controlled by the main control apparatus 50. As shown in FIG. 6B that representatively illustrates the transfer roller portion 41, when the drive roller ($41_2$) is rotated about the axis parallel to the Y axis (at the same time, the pressure roller $41_1$ is rotated in the reverse direction) with the transfer roller portion being in the first state, the sheet S is fed in the rotation direction.

Figure 6C:
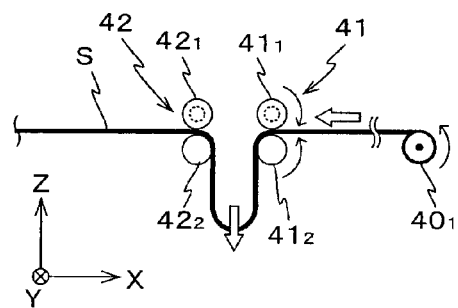
FIG. 6C to FIG. 6G are diagrams for explaining functions of a sheet transfer system.
Figure 6D:
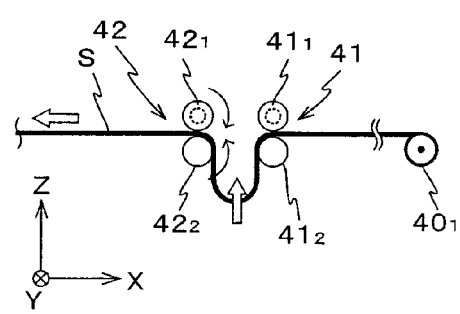

As shown in FIG. 6C, in the sheet transfer system 40, when the rollers $41_1$, $41_2$ of the transfer roller portions 41 are rotated in the direction of the arrows, the sheet S is extracted from the roller $40_1$ in the −X direction shown with an outlined arrow and fed toward the transfer roller portion 42. Here, when the rotation of the rollers $42_1$, $42_2$ of the transfer roller portion 42 are stopped at predetermined timing, a predetermined length (approximately a distance between the transfer roller portions 42, 43) of the sheet S is allowed to sag in a loop between the transfer roller portions 41, 42. Furthermore, as shown in FIG. 6D, in the sheet transfer system 40, when the rollers $42_1$, $42_2$ of the transfer roller portion 42 (and the rollers $43_1$, $43_2$ of the transfer roller portion 43) are rotated in the direction of the arrows in a state with the rotation of the rollers $41_1$, $41_2$ of the transfer roller portion 41 being stopped, the sheet S sagging in a loop is fed in the −X direction shown with an outlined arrow toward the region directly below the projection optical system PL.

Figure 6E:
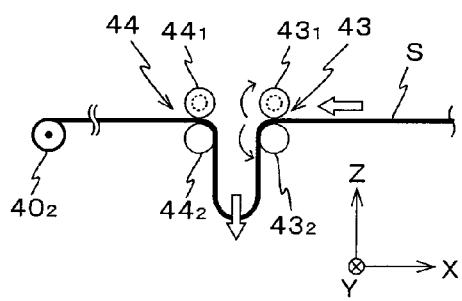
Figure 6F:
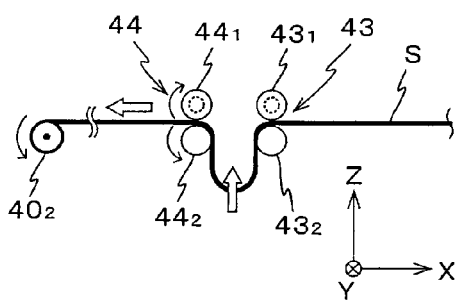

In the sheet transfer system 40, the sheet S is extracted from the region directly below the projection optical system PL by the rotation and stopping of the rollers of the transfer roller portions 43, 44, similarly to the above. That is, as shown in FIG. 6E, when the rollers $43_1$, $43_2$ of the transfer roller portion 43 are rotated in the direction of the arrows in a state with the rotation of the rollers $44_1$, $44_2$ of the transfer roller portion 44 being stopped, the sheet S is extracted from the region directly below the projection optical system PL, and then the extracted portion of the sheet S is allowed to sag in a loop between the transfer roller portions 43, 44. Subsequently, as shown in FIG. 6F, when the rollers $44_1$, $44_2$ of the transfer roller portion 44 are rotated in the direction of the arrows in a state with the rotation of the rollers $43_1$, $43_2$ of the transfer roller portion 43 being stopped, the sheet S sagging in a loop is fed to the −X side of the transfer roller portion 44, and is then wound by a winding roller $40_2$.

Figure 6G:
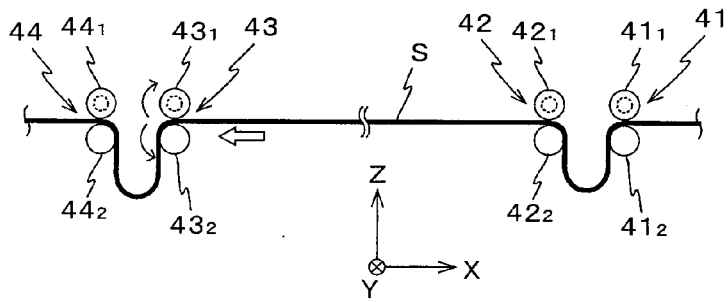

Furthermore, as shown in FIG. 6G, in the sheet transfer system 40, when the rollers of the transfer roller portion 43 are rotated in a state with the rotation of the rollers of the transfer roller portion 42 being stopped, or when the rollers of the transfer roller portion 42 are rotated in a direction reverse to that in FIG. 6D (hereinafter, referred to as a reverse direction) in a state with the rotation of the rollers of the transfer roller portion 43 being stopped, the sheet S is extended with a predetermined tension applied in the X axis direction. Then, the extended sheet S is adsorbedly held on the sheet holder $SH_1$ on the stage $SST_1$ ($SST_2$).

The sheet transfer system 40 further includes a measurement apparatus for measuring a feed amount of the sheet S (not shown in the figures), for example, a rotary encoder for measuring the rotation amounts of the drive rollers $41_2$, $42_2$, $43_2$, and $44_2$, or the like.

The transfer of the sheet S by the sheet transfer system 40, the holding of the sheet S by the stages $SST_1$, $SST_2$ during an exposure step, and the like will be described in detail later.

In addition, the exposure apparatus 100 of the present embodiment is provided with a plurality of (here, 12) off-axis-type alignment systems $AL_1$ to $AL_{12}$ for detecting the alignment marks affixed on the segmented regions on the sheet S. As shown in FIG. 5, the alignment systems $AL_1$ to $AL_6$ are arrayed along the X axis at positions on the +X side of the projection optical system PL so as to face the region along the +Y side end outside each segmented region on the sheet S. Furthermore, as shown in FIG. 5, the alignment systems $AL_7$ to $AL_{12}$ are arranged symmetrically to the alignment systems $AL_1$ to $AL_6$ about the X axis orthogonal to the optical axis of the projection region $IA_3$. The alignment systems $AL_7$ to $AL_{12}$ can face the region along the −Y side end outside the segmented region on the sheet S.

Figure 7:
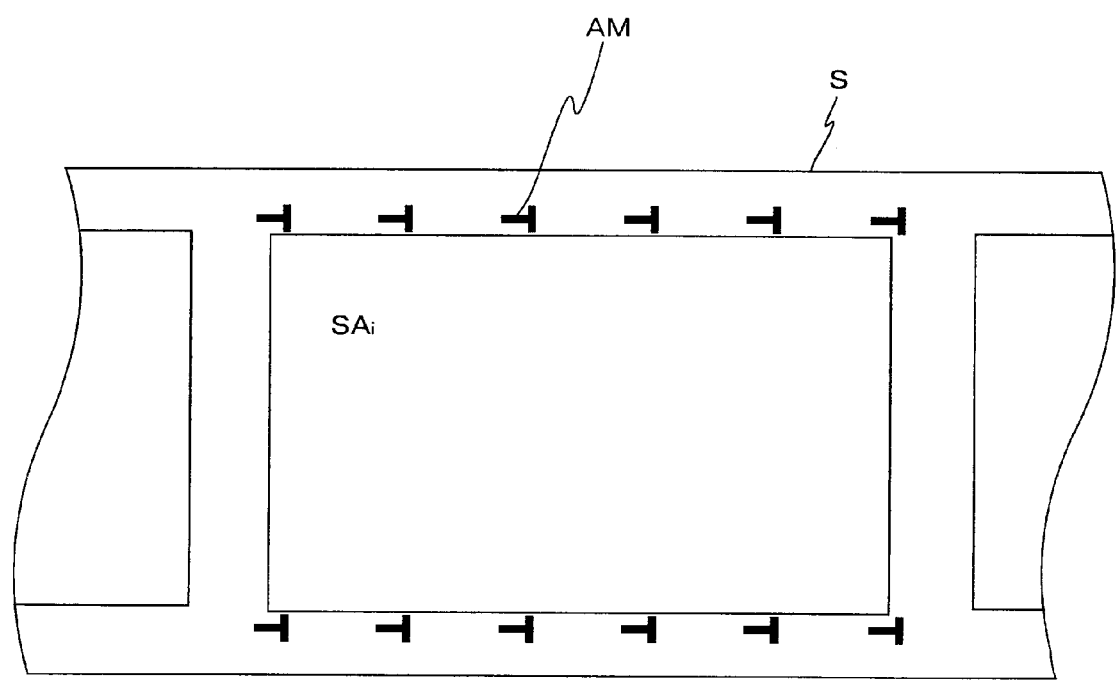
FIG. 7 is a diagram showing an exemplary arrangement of alignment marks affixed on each segmented region on a sheet S.
Figure 7:
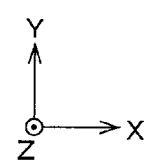

In the present embodiment, there are formed six alignment marks AM along a region on both sides of the sheet S in the Y axis direction outside each segmented regions, hence a total of 12 alignment marks AM, by way of example, as shown in FIG. 7. In order to detect the 12 alignment marks AM individually and simultaneously, the alignment systems $AL_1$ to $AL_{12}$ are provided. However, the arrangement is not limited to this. So long as alignment systems are movable in the X axis direction, it is permissible that at least one alignment system is provided instead of the alignment systems $AL_1$ to $AL_6$ and that at least one alignment system is provided instead of the alignment systems $AL_7$ to $AL_{12}$.

As the alignment systems $AL_1$ to $AL_{12}$, field image alignment (FIA) systems in an image processing scheme are adopted by way of example. The detection results from the alignment systems $AL_1$ to $AL_{12}$ (image information on index marks and detection target marks) are sent to the main control apparatus 50 via an alignment signal processing system (not shown in the figure). However, instead of the FIA systems, alignment sensors that irradiate coherent detection light onto a target mark and then detect scattered light or diffracted light from the target mark, or cause two diffracted light beams (for example, with the same diffraction order) from the target mark to interfere and detect them can be used singularly or in appropriate combination.

FIG. 8 shows a block diagram illustrating an input/output relationship of the main control apparatus 50, which is a main constituent of the control system of the exposure apparatus 100 and controls the respective constituent parts.

Next is a description of a flow of operations for exposing the sheet S including a parallel processing operation using the two stages $SST_1$, $SST_2$ in the exposure apparatus 100 of the present embodiment, based on FIG. 9 to FIG. 17. In the following operation description, a multitude of drawings are used. The same members may not be denoted by the same reference symbols according to the drawings. That is, different reference symbols may be used for the same members in different drawings. However, the drawings show the same construction regardless of the presence or absence of the reference symbols. The same applies to the drawings that have been used for the above description.

Figure 9:
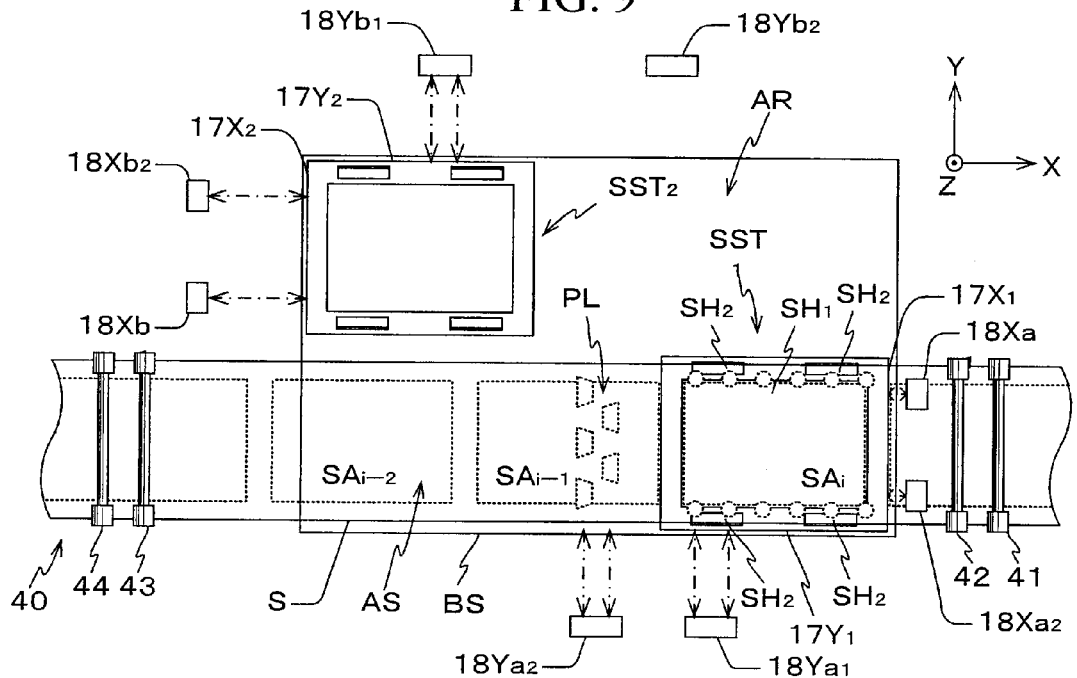
FIG. 9 is a diagram (No. 1) for explaining a flow of operations for exposing a sheet in the exposure apparatus of FIG. 1.

FIG. 9 shows a state where, after exposure on the first (i−1) segmented regions $SA_1$ to $SA_{i−1}$ out of the segmented regions arrayed on the sheet S are completed, exposure processing on the next segmented region $SA_i$ is about to start. In the state of FIG. 9, the stage $SST_1$ used for moving the sheet S when the segmented region $SA_i$ is exposed is on standby at a position at the +X end portion in the scan region AS (a standby position). The stage $SST_2$ used for moving the sheet S when the segmented region $SA_{i−1}$, which lies immediately before the segmented region $SA_i$, was exposed is retracted to a position at the −X end portion in the avoiding region AR.

The loading of the mask M onto the mask stage MST and the mask alignment (the positioning of the mask) of the mask M are performed typically before the start of exposure on the first segmented region $SA_1$ on the sheet S. Therefore, in the state of FIG. 9, the loading and the mask alignment of the mask M are obviously completed. In addition, the mask stage MST has been moved to a scan start position (an acceleration start position) for exposure on the segmented region $SA_i$.

a. First, the central portion of the sheet S including the segmented region $SA_i$ is held on the stage $SST_1$ in the following procedure of a1. to a4.

a1. To be more specific, the main control apparatus 50 stops the rotation of the rollers of the transfer roller portion 42 of the sheet transfer system 40, and then extract the sheet S from the roller $40_1$ by rotating the rollers of the transfer roller portion 41 or by other methods, as has been described with reference to FIG. 6C. Alternatively, the main control apparatus 50 stops the rotation of the rollers of the transfer roller portions 43, 41, and then rotates the transfer roller portion 42 in the reverse direction, to thereby pull back the sheet S from the region directly below the projection optical system PL. In either case, a predetermined length of the sheet S is allowed to sag in a loop between the transfer roller portions 41, 42. The predetermined length is approximately a distance between the transfer roller portions 42, 43.

a2. Next, the main control apparatus 50 controls the sheet transfer system 40 based on the positional information of the stage $SST_1$ from the stage interferometer system 18a (18Xa₁, 18Xa₂, 18Ya₁, and 18Ya₂), and pulls back the sheet S in the +X direction, or feeds the sheet S in the −X direction, to thereby align the segmented region $SA_i$ on the sheet S with (the holding surface of) the sheet holder $SH_1$ of the stage $SST_1$. Here, as has been described with reference to FIG. 6G, the sheet S is positioned after it is extended between the transfer roller portions 42, 43 with an appropriate tension being applied.

Furthermore, the main control apparatus 50 finely drives the stage $SST_1$ to align (the holding surface of) the sheet holder $SH_1$ with the segmented region $SA_i$ on the sheet S. In this condition, there is provided a slight space between the sheet S and (the holding surface of) the sheet holder $SH_1$ of the stage $SST_1$.

Figure 10:
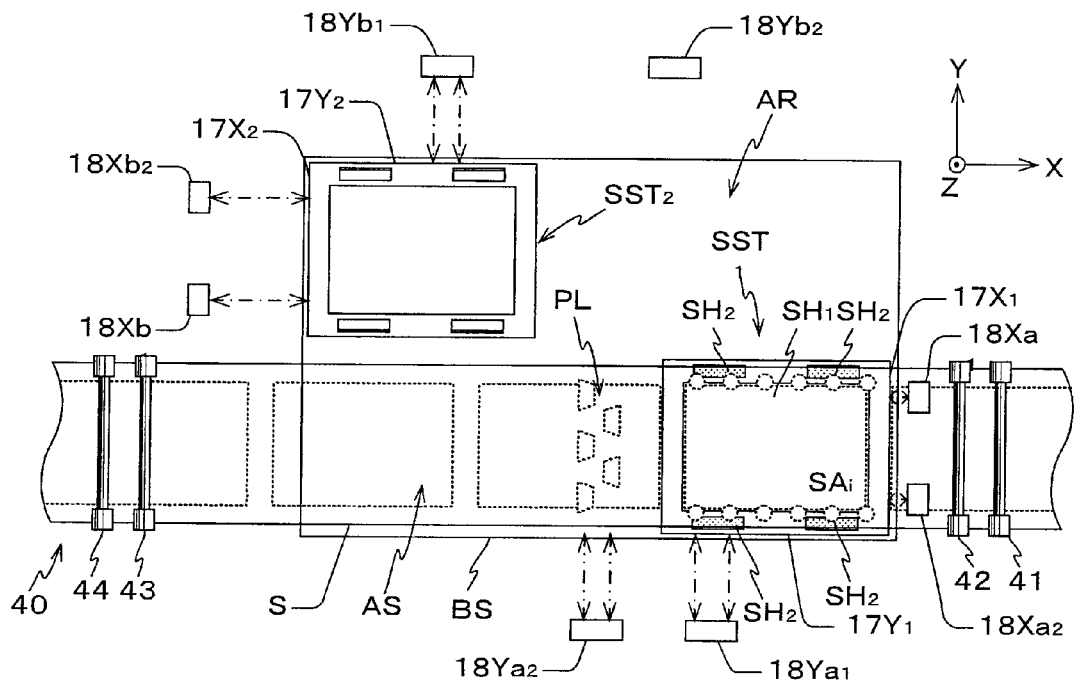
FIG. 10 is a diagram (No. 2) for explaining the flow of operations for exposing the sheet in the exposure apparatus of FIG. 1.
Figure 11:
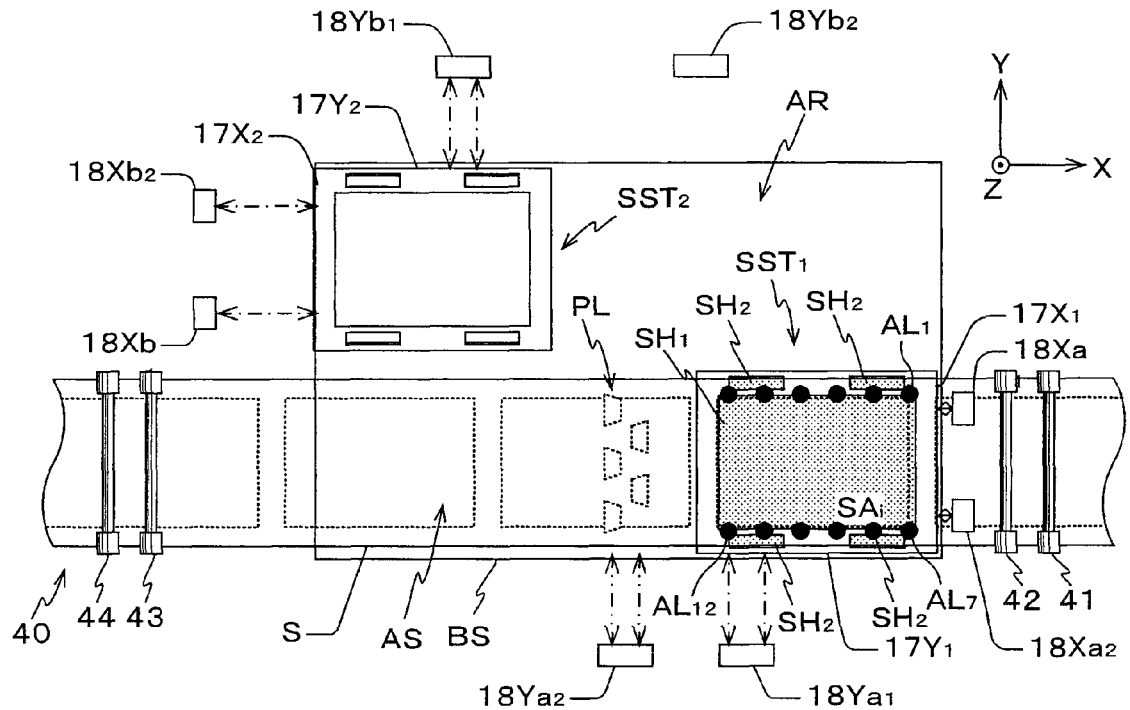
FIG. 11 is a diagram (No. 3) for explaining the flow of operations for exposing the sheet in the exposure apparatus of FIG. 1.

In a state where the stage $SST_1$ and the sheet S are aligned with each other at the standby position, each alignment mark AM affixed on the segmented region $SA_i$ is positioned within a detection field of view of each of the alignment systems $AL_1$ to $AL_{12}$.

a3. After the alignment, while horizontally holding the table TB of the stage $SST_1$ via the stage drive system SSD (the Z leveling apparatus 38), the main control apparatus 50 finely drives the four auxiliary sheet holders $SH_2$ on the table TB in the +Z direction, and adsorbingly holds the rear surfaces in the outside portions on the ±Y sides of the segmented region $SA_i$ of the sheet S by use of the auxiliary sheet holders $SH_2$. FIG. 10 shows a state where the sheet S is temporarily held on the auxiliary sheet holders $SH_2$ in this manner.

a4. After the temporary hold of the sheet S, the main control apparatus 50 finely drives the four auxiliary sheet holders $SH_2$ in the −Z direction while temporarily holding the sheet S, to thereby bring the rear surface in the central portion of the sheet S including the segmented region $SA_i$ into contact with the holding surface of the sheet holder $SH_1$. The main control apparatus 50 then positions the holding surfaces of the four auxiliary sheet holders $SH_2$ slightly below (on the −Z side of) the holding surface of the sheet holder $SH_1$. As a result, an appropriate tension is applied to the sheet S, and the central portion of the sheet S is fixed on the holding surface of the sheet holder $SH_1$. In this condition, the main control apparatus 50 adsorbingly holds the sheet S on the sheet holder $SH_1$, as shown in FIG. 11. Thereby, the central portion of the sheet S including the segmented region $SA_i$ is held on the stage $SST_1$ in a manner parallel to the XY plane and in a flat manner.

b. Next, an alignment measurement is performed on the sheet S.

As described above, in a state where the stage $SST_1$ is positioned at the standby position, each alignment mark affixed on the segmented region $SA_i$ is positioned within the detection field of vision of each of the alignment systems $AL_1$ to $AL_{12}$. Therefore, as shown in FIG. 11, the main control apparatus 50 uses the alignment systems $AL_1$ to $AL_{12}$ to detect the alignment marks affixed on the segmented region $SA_i$ on the sheet S (measure the positions of the alignment marks from the centers of the index marks). Based on the detection results of the alignment marks and on the positional information of the stage $SST_1$ from the stage interferometer system 18a at the time of the detection, the position coordinates of the 12 alignment marks on the XY coordinates system are obtained. By use of all or part of the position coordinates of the 12 alignment marks, the main control apparatus 50 performs a predetermined calculation using the least squares method, to thereby find distortion, that is, the XY shift, the rotation, the XY scaling, and the degree of orthogonality, of the pattern already formed in the segmented region $SA_i$ on the sheet S.

Figure 12:
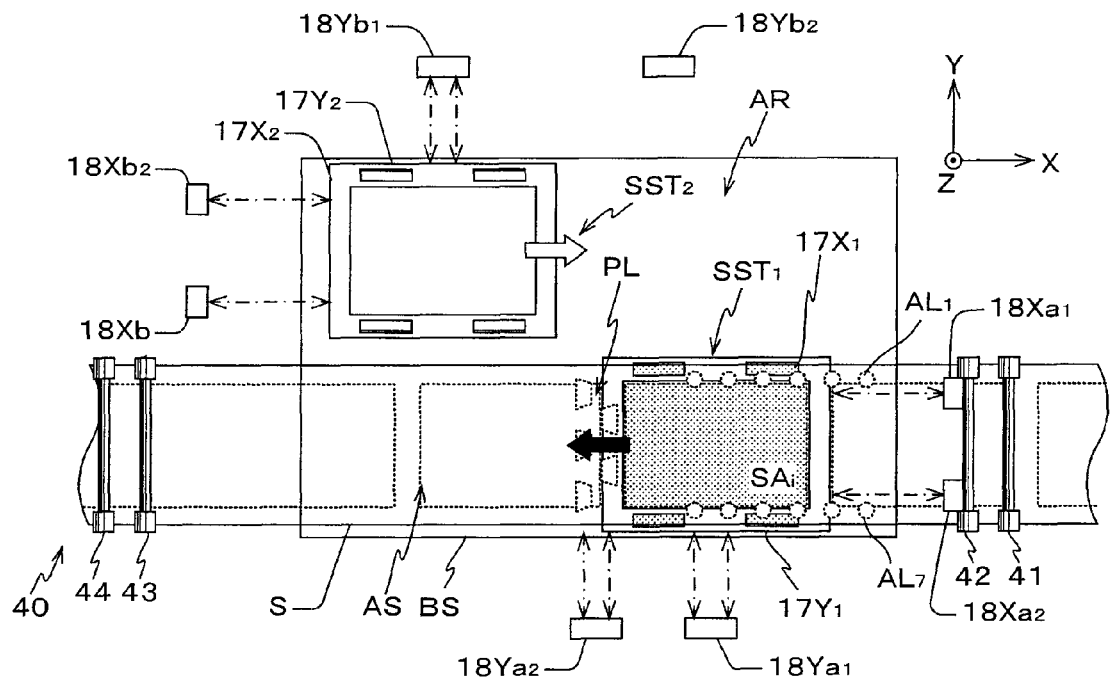
FIG. 12 is a diagram (No. 4) for explaining the flow of operations for exposing the sheet in the exposure apparatus of FIG. 1.
Figure 13:
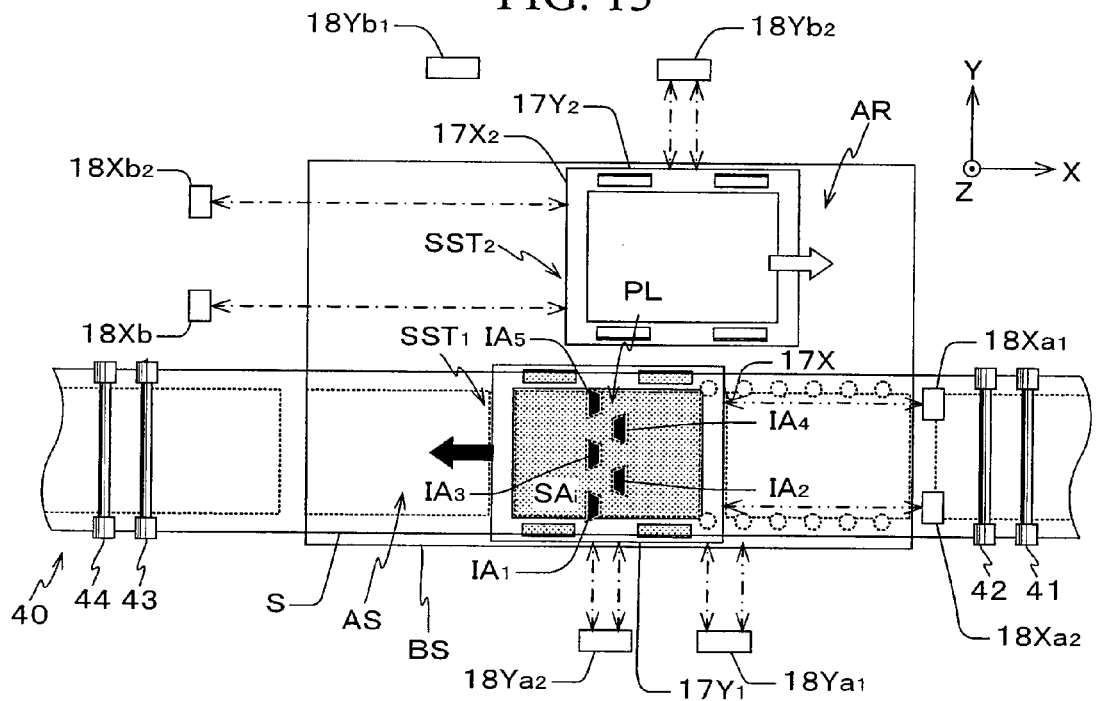
FIG. 13 is a diagram (No. 5) for explaining the flow of operations for exposing the sheet in the exposure apparatus of FIG. 1.

If the number of alignment systems is smaller than the number of alignment marks to be detected, it is required to perform an alignment measurement while the stage $SST_1$ holding the sheet S is moved stepwise in the X axis direction. At this time, the main control apparatus 50 controls the rotation and stopping of the rollers of the sheet transfer system 40 in synchronization with the movement of the stage $SST_1$.

c. Next, a scan exposure is performed on the segmented region $SA_i$ on the sheet S.

c1. To be more specific, based on the results of the alignment measurement, especially on the XY shift, the main control apparatus 50 moves the stage $SST_1$ holding the sheet S to the scan start position (the acceleration start position) for exposure, and aligns the stage $SST_1$ with the mask stage MST holding the mask M. Here, in the present embodiment, the acceleration start position for the stage $SST_1$ (and $SST_2$) is set to the same position as (or the vicinity of the position of) the aforementioned standby position in the scan region AS. Therefore, a fine positional adjustment of the stage $SST_1$ (and $SST_2$) within XY plane is performed.

c2. Next, the main control apparatus 50 starts acceleration of the stages $SST_1$, MST in the scanning direction (the –X direction). As a result, the stages $SST_1$, MST begin to move in the –X direction. At some time during their movement, specifically, before the end of the acceleration of the stages $SST_1$, MST, one of the length measuring beams from the interferometer $18Ya_2$ begins to hit the reflection surface $17Y_1$, as shown in FIG. 12. Therefore, immediately after that, the main control apparatus 50 switches the interferometer for measuring the Y position of the stage $SST_1$ from the interferometer $18Ya_1$ to the interferometer $18Ya_2$.

c3. When the stages $SST_1$, MST reach a state of synchronized uniform motion after completion of the acceleration of the stages $SST_1$, MST, the illumination beams $IL_2$, $IL_4$ begin to illuminate the pattern region on the mask M, to thereby start exposure. With the advancement of the synchronized uniform movement of the stages $SST_1$, MST, the illumination beams $IL_1$ to $IL_5$ respectively illuminates the illumination regions $IAM_1$ to $IAM_5$ (see FIG. 2) on the mask M, as shown in FIG. 13. The pattern's partial images in the illumination regions $IAM_1$ to $IAM_5$ are projected onto the projection regions $IA_1$ to $IA_5$ on the sheet S held on the stage $SST_1$ respectively via the projection optical systems $PL_1$ to $PL_5$ (see FIG. 3).

When the entire area of the pattern region of the mask M is illuminated by the illumination beams $IL_1$ to $IL_5$, that is, when the pattern region of the mask M pass through the illumination regions $IAM_1$ to $IAM_5$, the scan exposure on the segmented region $SA_i$ is completed. As a result, the pattern of the mask M is transferred to the segmented region $SA_i$. That is, a latent image of the pattern of the mask M is formed in the resist layer that is formed on the surface of the sheet S.

During the scan exposure, the main control apparatus 50 drives the table TB of the stage $SST_1$ in the Z axis direction while keeping the table TB horizontal, to thereby position the surface of the sheet S held on the table TB (the sheet holder $SH_1$) at a focal position (within a depth of focus) of the projection optical system PL. Furthermore, during the scan exposure, the main control apparatus 50 controls the synchronous drive of (relative position and relative speed between) the stage $SST_1$ and the mask stage MST based on the results of the alignment measurement (that is, the XY shift, the rotation, the XY scaling, and the degree of orthogonality that are obtained above), to thereby correct distortion of the entire image of the pattern projected onto the sheet S. At the same time, the main control apparatus 50 controls the drive of the optical element groups (lens groups) that respectively constitute the projection optical systems $PL_1$ to $PL_5$ via the lens controller LC, to thereby correct distortion of the partial images that are projected respectively onto the projection regions $IA_1$ to $IA_5$ on the sheet S. As a result, the projection image of the pattern of the mask M is highly accurately superimposed on the pattern that has been already formed in the segmented region $SA_i$.

Figure 14:
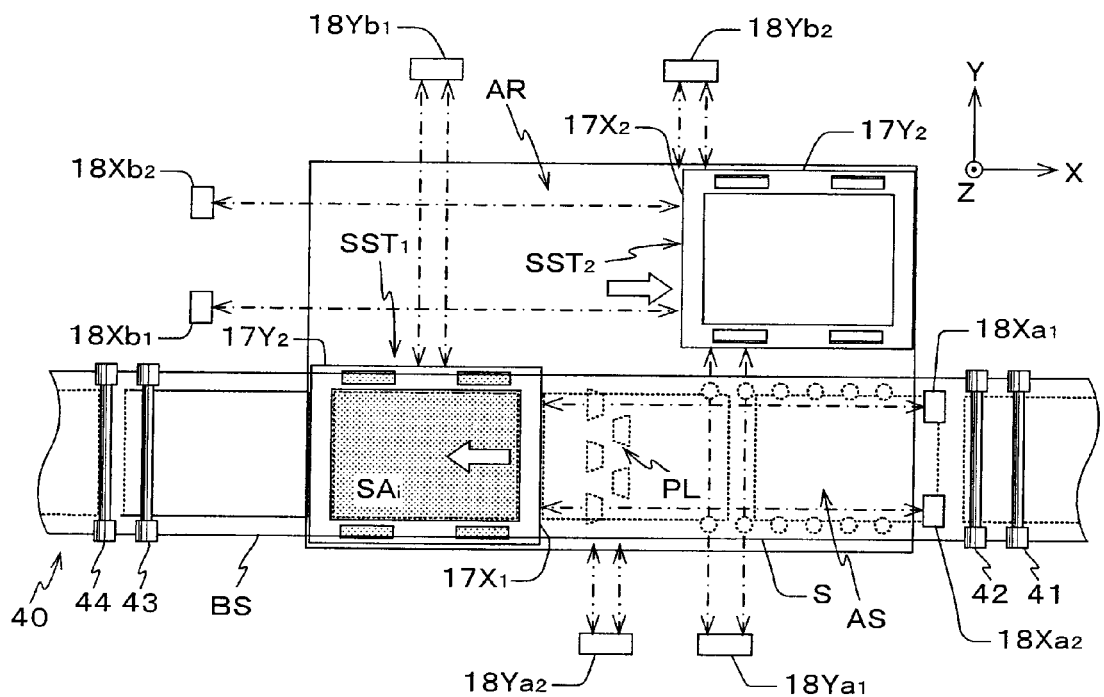
FIG. 14 is a diagram (No. 6) for explaining the flow of operations for exposing the sheet in the exposure apparatus of FIG. 1.

After completion of the scan exposure on the segmented region $SA_i$, the stages $SST_1$, MST are decelerated, and come to a stop when they reach their respective scan stop positions (deceleration stop positions), as shown in FIG. 14. Here, during the scan exposure on the segmented region $SA_i$, the length measuring beams from the interferometer $18Yb_1$ begin to hit the stage $SST_1$. Therefore, after completion of the scan exposure on the segmented region $SA_i$, the main control apparatus 50 begins to decelerate the stages $SST_1$, MST. At the same time, the main control apparatus 50 switches the interferometers for measuring the Y position of the stage $SST_1$ from the interferometer $18Ya_2$ to interferometer $18Yb_1$ (see FIG. 14). In the present embodiment, the deceleration end position of the stages $SST_1$, $SST_2$ in scanning is set to coincide with the –X end of the base member BS.

When driving the stage $SST_1$ holding the sheet S in the –X direction during the scan exposure, the main control apparatus 50 appropriately rotates and stops the drive rollers of the sheet transfer system 40 as the stage $SST_1$ moves so that the movement of the stage $SST_1$ will not be prohibited by the tension acting on the sheet S, similarly to the above.

Figure 15:
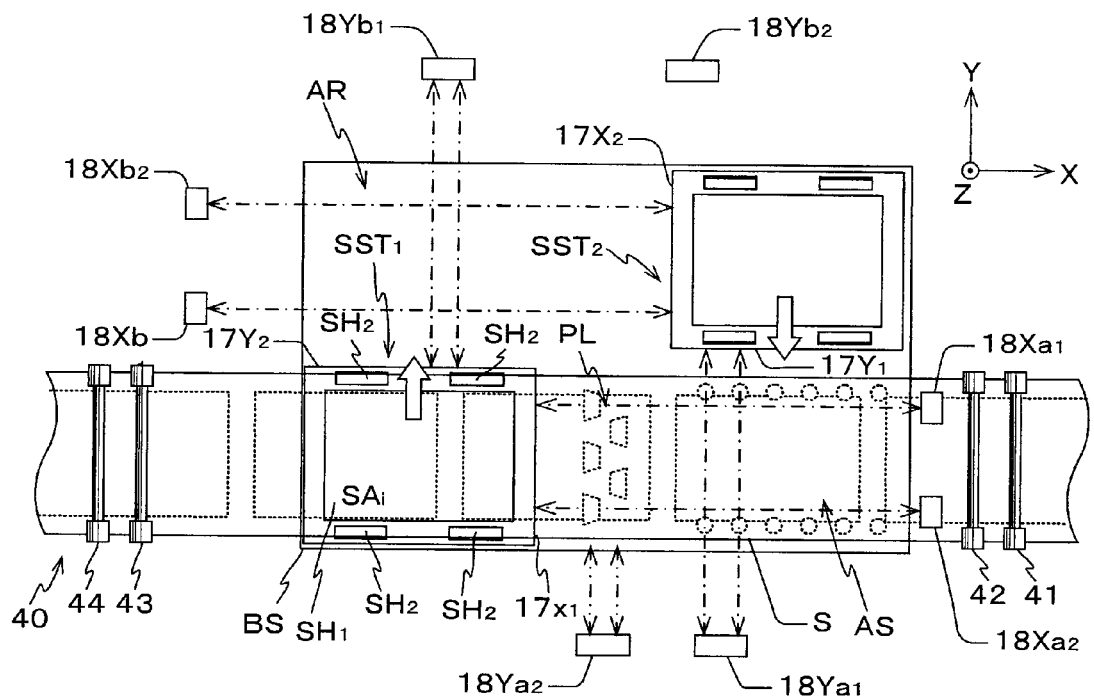
FIG. 15 is a diagram (No. 7) for explaining the flow of operations for exposing the sheet in the exposure apparatus of FIG. 1.
Figure 16:
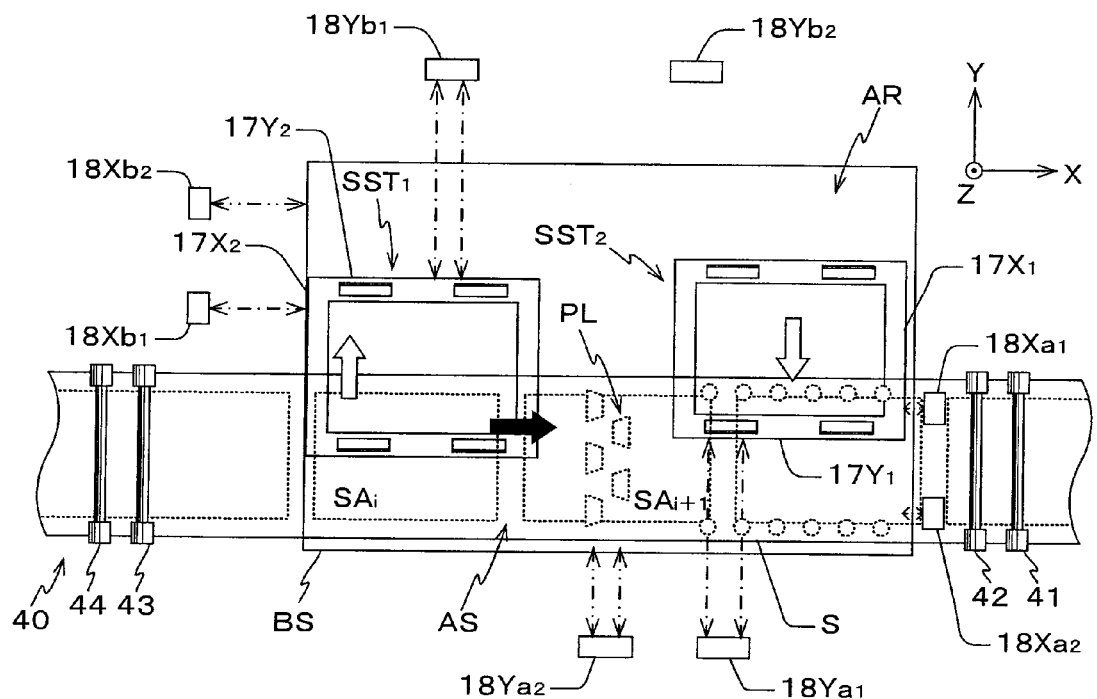
FIG. 16 is a diagram (No. 8) for explaining the flow of operations for exposing the sheet in the exposure apparatus of FIG. 1.

In parallel with the aforementioned alignment measurement and scan exposure, the main control apparatus 50 moves the stage $SST_2$ from the –X end to the +X end in the avoiding region AR, as shown in FIG. 12 and FIG. 13. Based on the positional information from the auxiliary interferometer system 18b, the main control apparatus 50 drives the stage $SST_2$ in the direction of the outlined arrow of FIG. 12 and FIG. 13. Here, in accordance with the X position of the stage $SST_2$, the interferometer for measuring its Y position is switched from the interferometer $18Yb_1$ to the interferometer $18Yb_2$. Furthermore, as shown in FIG. 14, when the stage $SST_2$ is moved to the +X end in the avoiding region AR, the interferometer for measuring the Y position is switched from the interferometer $18Yb_2$ to the interferometer $18Ya_1$.

d. Next, as preprocessing for exposing the next segmented region $SA_{i+1}$, the stages $SST_1$, $SST_2$ are exchanged according to the following procedure of d1. to d3.

d1. When the stage $SST_1$ stops at the –X end in the scan region AS as a deceleration stop position, the main control apparatus 50 releases the adsorbing hold of the sheet S by the sheet holder $SH_1$ and the auxiliary sheet holders $SH_2$, to thereby free the sheet S from the stage $SST_1$, as shown in FIG. 15. Furthermore, the main control apparatus 50 retracts the table TB of the stage $SST_1$ in the lower direction (the −Z direction). This brings the sheet S into an extended state between the transfer roller portions 42, 43, with a slight space between itself and the sheet holder $SH_1$ of the stage $SST_1$.

d2. Next, as shown in FIG. 15, the main control apparatus 50 drives the stage $SST_1$ in the direction shown with the outlined arrow (the +Y direction) at the −X end portion of the base member BS, to thereby retract the stage $SST_1$ in the avoiding region AR. Here, as shown in FIG. 15 and FIG. 16, in accordance with the Y position of the stage $SST_1$, the interferometers for measuring its X position is switched from the interferometers $18Xa_1$, $18Xa_2$ to the interferometers $18Xb_1$, $18Xb_2$ (the interferometers to be used are toggled between the interferometers $18Xa_1$, $18Xa_2$ and $18Xb_1$, $18Xb_2$).

d3. In parallel with the retraction of the stage $SST_1$, the main control apparatus 50 drives the stage $SST_2$ in the direction shown with the outlined arrow (the −Y direction) at the +X end portion of the base member BS as shown in FIG. 15, to thereby move the stage $SST_2$ to the aforementioned standby position in the scan region AS. Here, as shown in FIG. 15 and FIG. 16, in accordance with the Y position of the stage $SST_2$, the interferometers for measuring its X position is switched from the interferometers $18Xb_1$, $18Xb_2$ to the interferometers $18Xa_1$, $18Xa_2$ (the interferometers to be used are toggled between the interferometers $18Xb_1$, $18Xb_2$ and $18Xa_1$, $18Xa_2$).

e. Furthermore, in parallel with the aforementioned switching between the stages $SST_1$, $SST_2$, the main control apparatus 50 returns the mask stage MST to the scan start position (the acceleration start position) at a high speed. Additionally, in parallel with the aforementioned switching between the stages $SST_1$, $SST_2$, the main control apparatus 50 controls the sheet transfer system 40 to pull back the sheet S in the direction shown with the filled arrow (the +X direction), as shown in FIG. 16.

Figure 17:
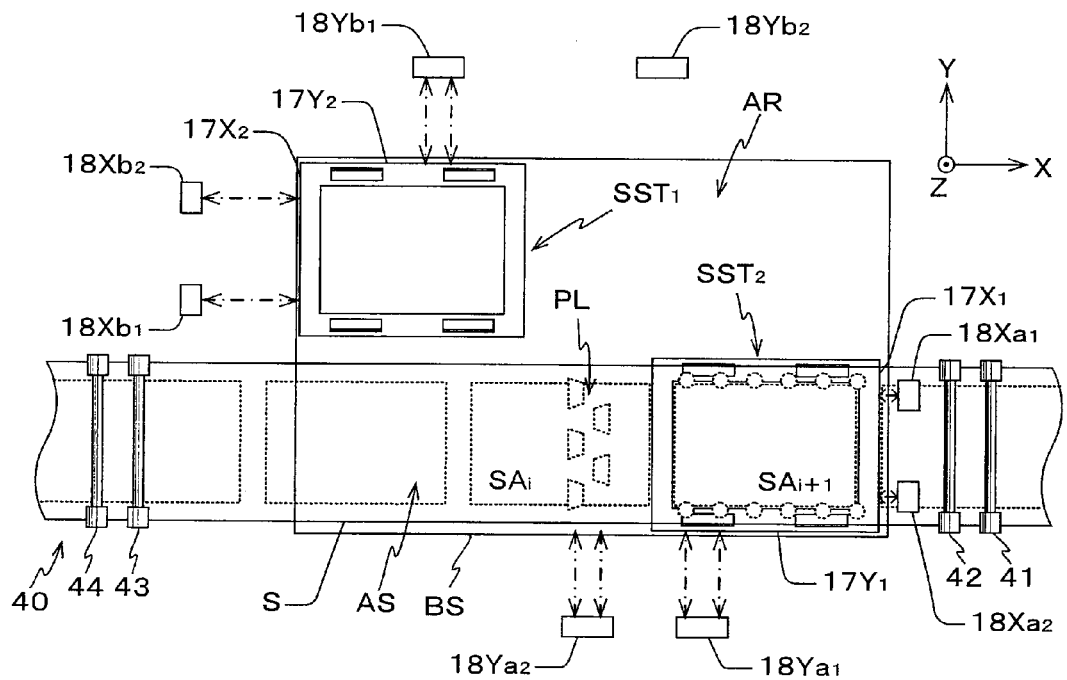
FIG. 17 is a diagram (No. 9) for explaining the flow of operations for exposing the sheet in the exposure apparatus of FIG. 1.

After completion of the switching between the stage $SST_1$, $SST_2$, and the pull back of the sheet S, the stage $SST_2$ is on standby at the standby position, and the central portion of the sheet S including the next segmented region $SA_{1+i}$ is aligned with the stage $SST_2$ on standby, as shown in FIG. 17. In addition, the stage $SST_1$ is retracted in the avoiding region AR. This state is the same as that shown in FIG. 9, the exception being that the stages $SST_1$, $SST_2$ are switched and that the sheet S is fed one segmented region.

After completion of the switching between the stages, the main control apparatus 50 uses the stage $SST_2$ instead of the stage $SST_1$ to start exposure on the segmented region $SA_{i+1}$ similarly to the above. After this, the main control apparatus 50 similarly repeats the aforementioned procedure from a. to e., to thereby expose all the segmented regions on the sheet S by alternate use of the stages $SST_1$, $SST_2$.

As has been described in detail, in scan exposing on the segmented region $SA_i$ of the sheet S, the stage $SST_1$ adsorbs, at the aforementioned standby position at the +X end of the scan region AS, the rear surface portion corresponding to the segmented region $SA_i$ of the sheet S onto the holding surface of the sheet holder $SH_1$. Then, in synchronization with the mask M (the mask stage MST), the stage $SST_1$ moves in the X axis direction (the −X direction) with a predetermined stroke. At this time, the illumination beams $IL_1$ to $IL_5$ each corresponding to a part of the pattern formed in the pattern region of the mask M are irradiated onto the resist-coated surface of the sheet S respectively via the projection optical systems $PL_1$ to $PL_5$. As a result, the segmented region $SA_i$ of the sheet S is exposed with the images of the pattern (the partial images) in the illumination regions $IAM_1$ to $IAM_5$. With the passage of the illumination regions $IAM_1$ to $IAM_5$ over the entire area of the pattern region, the pattern is transferred (formed). After completion of the scan exposure on the segmented region $SA_i$ of the sheet S, the stage $SST_2$ is moved to the aforementioned standby position within the XY plane, and adsorbs the rear surface portion corresponding to the next segmented region $SA_{i+1}$ of the sheet S onto the holding surface of the sheet holder $SH_1$. Therefore, after adsorption of the sheet S, the stage $SST_2$ can be moved in the X axis direction (the −X direction) with a predetermined stroke in synchronization with the mask M (the mask stage MST). During the movement, the segmented region $SA_{i+1}$ of the sheet S can be exposed to form a pattern by the scan exposure method similarly to the above. This makes it possible to form a pattern sequentially on the segmented regions $SA_i$, $SA_{i+1}$ of the sheet S. With the repetition of: the scan exposure on the sheet S; the movement of the stage to the standby position; and the adsorption of the rear surface corresponding to the segmented region of the sheet S onto the holding surface of the sheet holder $SH_1$ by alternate use of the stages $SST_1$, $SST_2$ in this manner, it is possible to expose all the segmented regions on the sheet S to form patterns at high throughput. Therefore, it is possible to contribute to the manufacture of electronic devices such as flexible large-screen displays without making the apparatus larger.

In the above embodiment, the description has been for the case where a first stage is retracted after completion of the scan exposure and, at the same time, a second stage is moved to (the standby position in) the scan region, by way of example. However, the embodiment is not limited to this. In parallel with at least a part of the scan exposure by use of the first stage, the second stages may be moved to the standby position in the scan region. As a result, compared with the case where the movement of the second stage to the standby position is started after completion of the scan exposure by use of the first stage, it is possible to start the subsequent operation by use of the second stage more speedily, enabling improvement in throughput.

Figure 18:
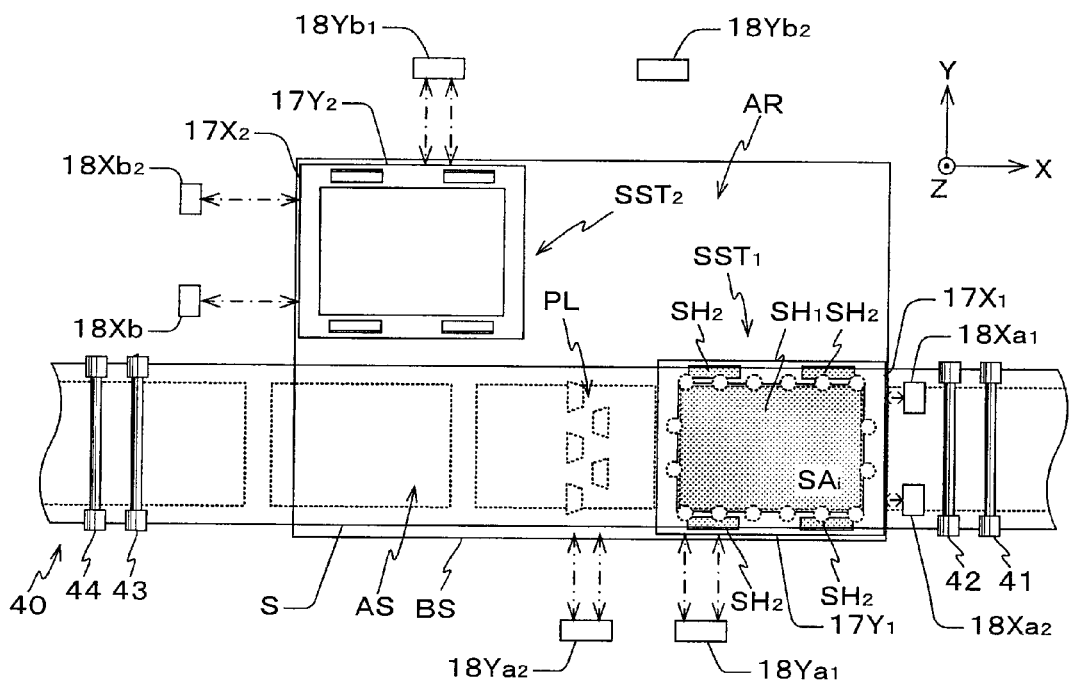
FIG. 18 is a diagram showing an arrangement of an alignment system according to a modification.

In the exposure apparatus 100 of the above embodiment, the alignment systems $AL_1$ to $AL_{12}$ arrayed along the X axis direction and spaced in the Y axis direction are used to perform an alignment measurement on the sheet S. However, the construction is not limited to this. For example, alignment marks may be arranged around the segmented region $SA_i$ of the sheet S, spaced away from each other by a predetermined distance. Correspondingly to the arrangement of the alignment marks, alignment systems may be arranged along the surrounding portion of the segmented region $SA_i$, as shown in FIG. 18. Then, all the alignment marks may be detected simultaneously.

<Second Embodiment>

Next is a description of a second embodiment of the present invention based on FIG. 19 to FIG. 37. Here, components the same as or similar to those of the aforementioned first embodiment are denoted by the same or like reference symbols, and description thereof is simplified or omitted.

Figure 19:
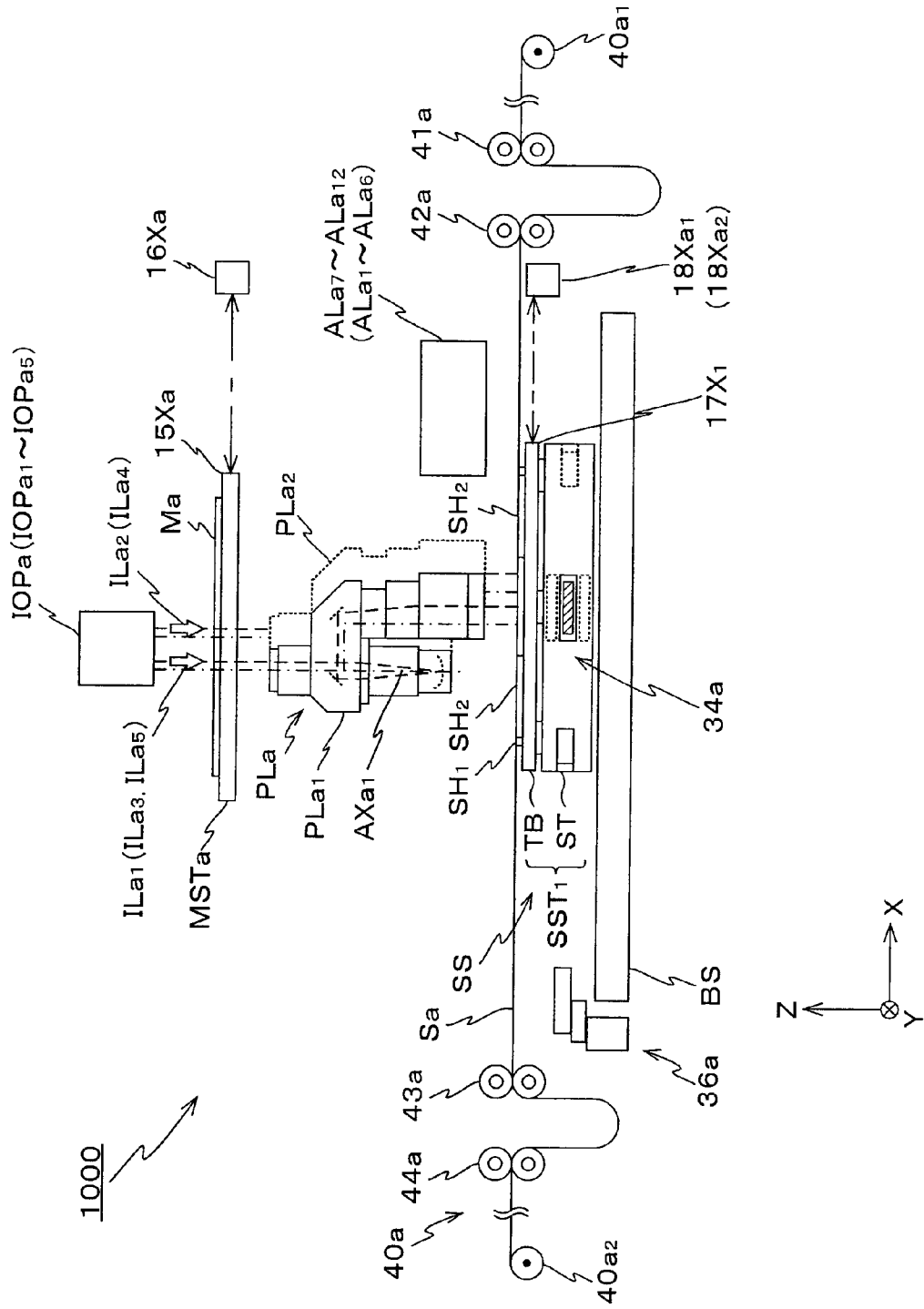
FIG. 19 is a side view of an exposure apparatus of a second embodiment, seen from the −Y direction.
Figure 20:
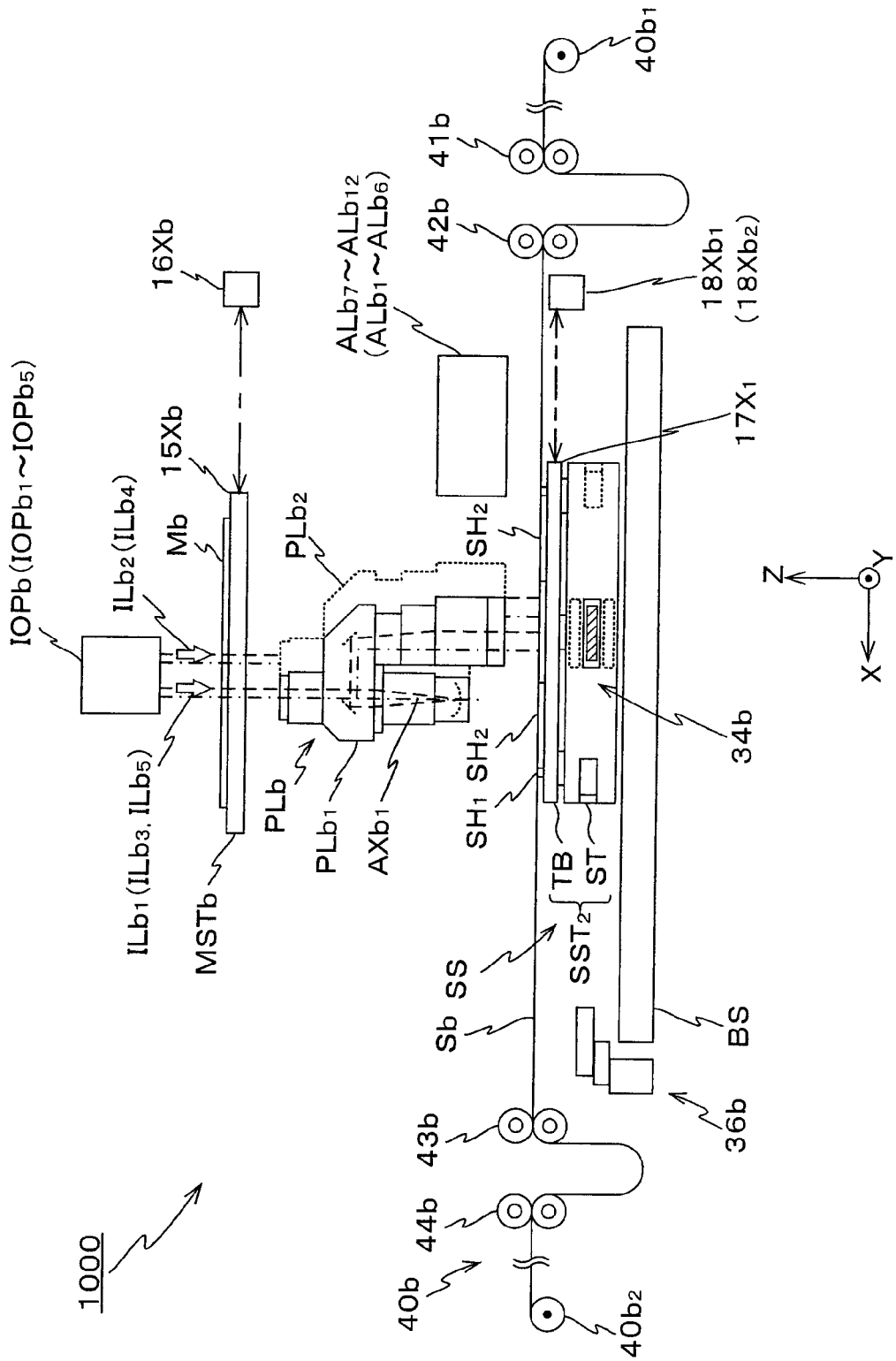
FIG. 20 is a side view of the exposure apparatus of the second embodiment, seen from the +Y direction.

FIG. 19 and the FIG. 20 show a schematic construction of an exposure apparatus 1000 of the second embodiment. FIG. 19 is a side view of the exposure apparatus 1000 seen from the −Y direction. FIG. 20 is a side view of the exposure apparatus 1000 seen from the +Y direction. The exposure apparatus 1000 is an exposure apparatus (a scanner) that transfers a pattern formed on two masks Ma, Mb onto two sheets Sa, Sb, respectively.

The exposure apparatus 1000 includes: illumination systems IOPa, IOPb; mask stages MSTa, MSTb for respectively holding masks Ma, Mb; projection optical systems PLa, PLb for projecting an image of a pattern formed on the masks Ma, Mb onto sheets Sa, Sb, respectively; a stage apparatus SS including stages $SST_1$, $SST_2$ for holding the sheets Sa, Sb; sheet transfer systems 40a, 40b for respectively transferring the sheets Sa, Sb; and a control system for these. In FIG. 19, the illumination system IOPa, the mask stage MSTa, the projection optical system PLa, the stage $SST_1$, the sheet transfer system 40a are omitted. Furthermore, the illumination system IOPb, the mask stage MSTb, the projection optical system PLb, the stage $SST_2$, the sheet transfer system 40b, and the sheet Sb that are positioned on the +Y side (on the behind side in the figure) of the sheet Sa are omitted.

The sheets Sa, Sb for use in the exposure apparatus 1000 of the present embodiment are set in a state of being wound in a roll around rollers $40a_1$, $40b_1$, respectively. The sheet Sa is extracted from the roller $40a_1$ by transfer roller portions 41a to 44a provided in the first sheet transfer system 40a that is constructed similarly to the sheet transfer system 40 in the aforementioned first embodiment. Subsequently the sheet Sa passes through a region directly below the projection optical system PLa, and is then wound by the winding roller $40a_2$.

Similarly, the sheet Sb is extracted from the roller $40b_1$ by transfer roller portions 41b to 44b provided in the second sheet transfer system 40b that is constructed similarly to the sheet transfer system 40. Subsequently, the sheet Sb passes through a region directly below the projection optical system PLb, and is then wound by the winding roller $40b_2$. Furthermore, the surfaces of the sheets Sa, Sb are coated with a photosensitive material (a resist). In the second embodiment, the sheets Sa, Sb are extracted from the rollers $40a_1$, $40b_1$, and are wound by the winding rollers $40a_2$, $40b_2$, respectively, by way of example. However, the construction is not limited to this. Each sheet that is fed from an apparatus for performing pre-exposure processing, for example, a resist coating apparatus for coating a resist and is supplied to an apparatus for performing post-exposure processing, for example, a development apparatus for carrying out development can be exposed by the exposure apparatus 1000.

Each of the illumination systems IOPa, IOPb includes: a plurality of (five, in this case) illumination system modules (hereinafter, each is referred to simply as an illumination system) $IOPa_1$ to $IOPa_5$, $IOPb_1$ to $IOPb_5$. Each of the illumination systems $IOPa_1$ to $IOPa_5$, $IOPb_1$ to $IOPb_5$ is constructed similarly to the illumination systems $IOP_1$ to $IOP_5$ in the first embodiment. As shown in FIG. 19, illumination beams $ILa_1$ to $ILa_5$ are emitted respectively from the illumination system IOPa ($IOPa_1$ to $IOPa_5$) toward the mask Ma along their respective optical axes $AXa_1$ to $AXa_5$ (see FIG. 21). Similarly, as shown in FIG. 20, five illumination beams $ILb_1$ to $ILb_5$ are emitted respectively from the illumination system IOPb ($IOPb_1$ to $IOPb_5$) toward the mask Mb along their respective optical axes $AXb_1$ to $AXb_5$.

Figure 21:
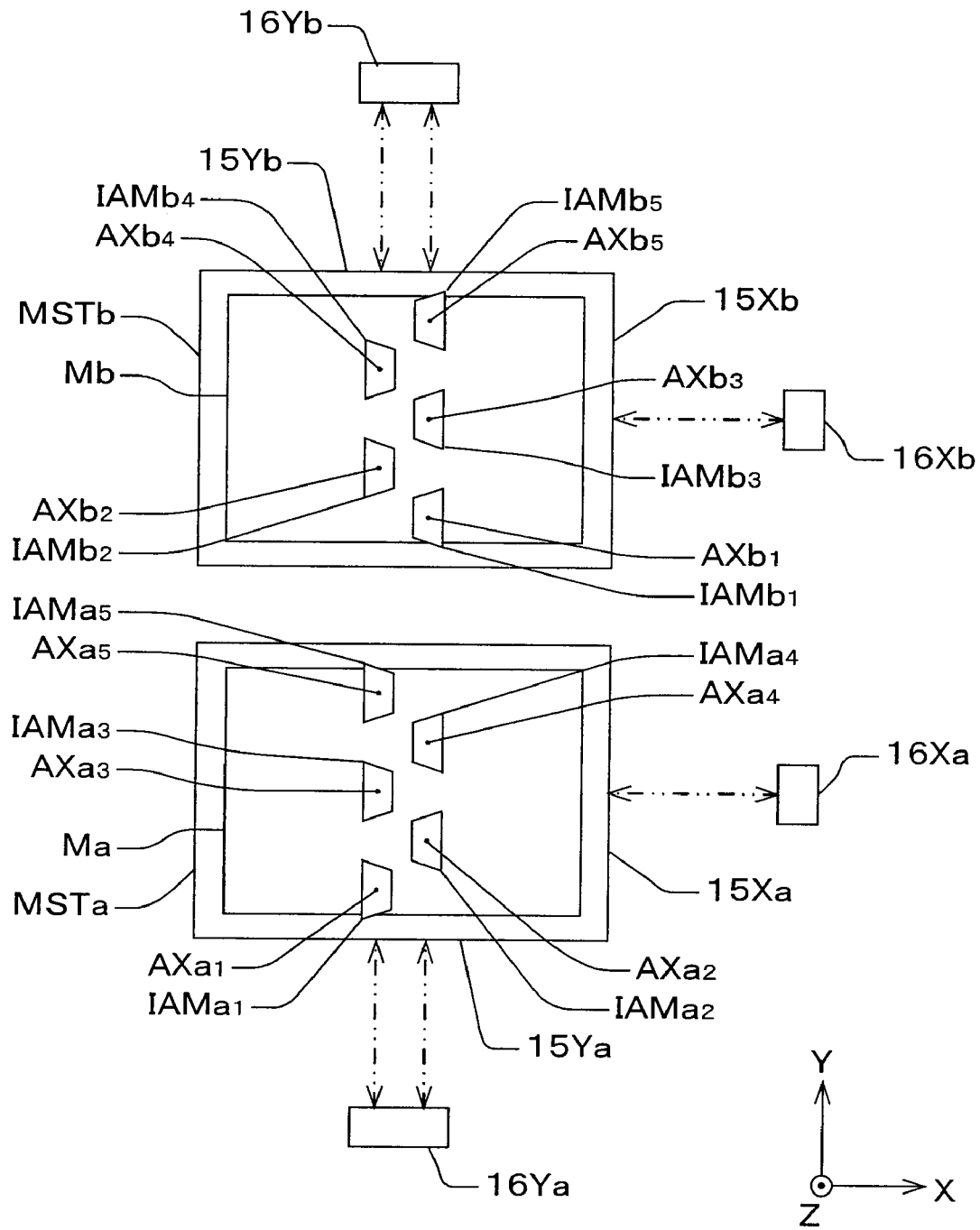
FIG. 21 is a plan view showing a schematic construction of a mask stage provided in the exposure apparatus of the second embodiment.

As shown in FIG. 21, the optical axes $AXa_1$ to $AXa_5$ and the optical axes $AXb_1$ to $AXb_5$ are arranged in a zigzag manner within the XY plane (the pattern surface of the mask Ma and the pattern surface of the mask Mb, respectively). However, the optical axes $AXa_1$ to $AXa_5$ and the optical axes $AXb_1$ to $AXb_5$ are symmetrical in arrangement to each other with respect to the Y axis.

The illumination systems $IOPa_1$ to $IOPa_5$ respectively use the illumination beams $ILa_1$ to $ILa_5$ to illuminate the illumination regions $IAMa_1$ to $IAMa_5$ on the mask Ma around the optical axes $AXa_1$ to $AXa_5$ with a uniform luminance. On the other hand, the illumination systems $IOPb_1$ to $IOPb_5$ respectively use the illumination beams $ILb_1$ to $ILb_5$ to illuminate the illumination regions $IAMb_1$ to $IAMb_5$ on the mask Mb around the optical axes $AXb_1$ to $AXb_5$ with a uniform luminance.

The mask stages MSTa, MSTb are arranged below (on the −Z side of) the illumination systems IOPa, IOPb in a manner spaced from each other in the Y axis direction. On the mask stages MSTa, MSTb, there are respectively fixed rectangular masks Ma, Mb each with a rectangular pattern region formed on its pattern surface (the surface on the −Z side) by, for example, vacuum attraction. The mask stages MSTa, MSTb are capable of being finely driven within the XY plane and are also capable of being driven in the scanning direction (the X axis direction) at a predetermined scanning speed with a predetermined stroke respectively by the first and second mask stage drive systems MSDa, MSDb (see FIG. 27).

Positional information of the mask stage MSTa within the XY plane is always measured with a resolution of, for example, approximately 0.25 to 1 nm by interferometers 16Xa, 16Ya that constitute part of a first mask stage interferometer system 16a. Similarly, positional information of the mask stage MSTb within the XY plane is always measured with a resolution of, for example, approximately 0.25 to 1 nm by interferometers 16Xb, 16Yb that constitute part of a second mask stage interferometer system 16b.

The +X side surface and the −Y side surface of the mask stage MSTa are mirror-finished, to thereby form reflection surfaces 15Xa, 15Ya as shown in FIG. 21. The interferometer 16Xa irradiates a plurality of length measuring beams along optical paths parallel to the X axis onto the reflection surface 15Xa, and receives reflected beams off the reflection surface 15Xa, to thereby measure an X position and a rotation in the θz direction of the mask stage MSTa. A substantial length measurement axis of the interferometer 16Xa is parallel to the X axis that is orthogonal to the optical axis $AXa_3$. The interferometer 16Ya irradiates two length measuring beams along optical paths parallel to the Y axis that are orthogonal respectively to the optical axes $AXa_1$ and $AXa_2$ onto the reflection surface 15Ya, and receives reflected beams off the reflection surface 15Ya, to thereby measure a Y position of the mask stage MSTa. Note that, instead of the aforementioned reflection surfaces 15Xa, 15Ya, movement mirrors made of flat mirrors may be fixed on the mask stage MSTa.

On the other hand, the +X side surface and the +Y side surface of the mask stage MSTb are mirror-finished, to thereby form reflection surfaces 15Xb, 15Yb. The interferometer 16Xb irradiates a plurality of length measuring beams along optical paths parallel to the X axis onto the reflection surface 15Xb, and receives reflected beams off the reflection surface 15Xb, to thereby measure an X position and a rotation in the θz direction of the mask stage MSTb. A substantial length measurement axis of the interferometer 16Xb is parallel to the X axis that is orthogonal to the optical axis $AXb_3$. The interferometer 16Yb irradiates two length measuring beams along optical paths parallel to the Y axis that are orthogonal respectively to the optical axes $AXb_4$ and $AXb_5$ onto the reflection surface 15Yb, and receives reflected beams off the reflection surface 15Yb, to thereby measure a Y position of the mask stage MSTb. Note that, instead of the aforementioned reflection surfaces 15Xb, 15Yb, movement mirrors made of flat mirrors may be fixed on the mask stages MSTa, MSTb.

Figure 27:
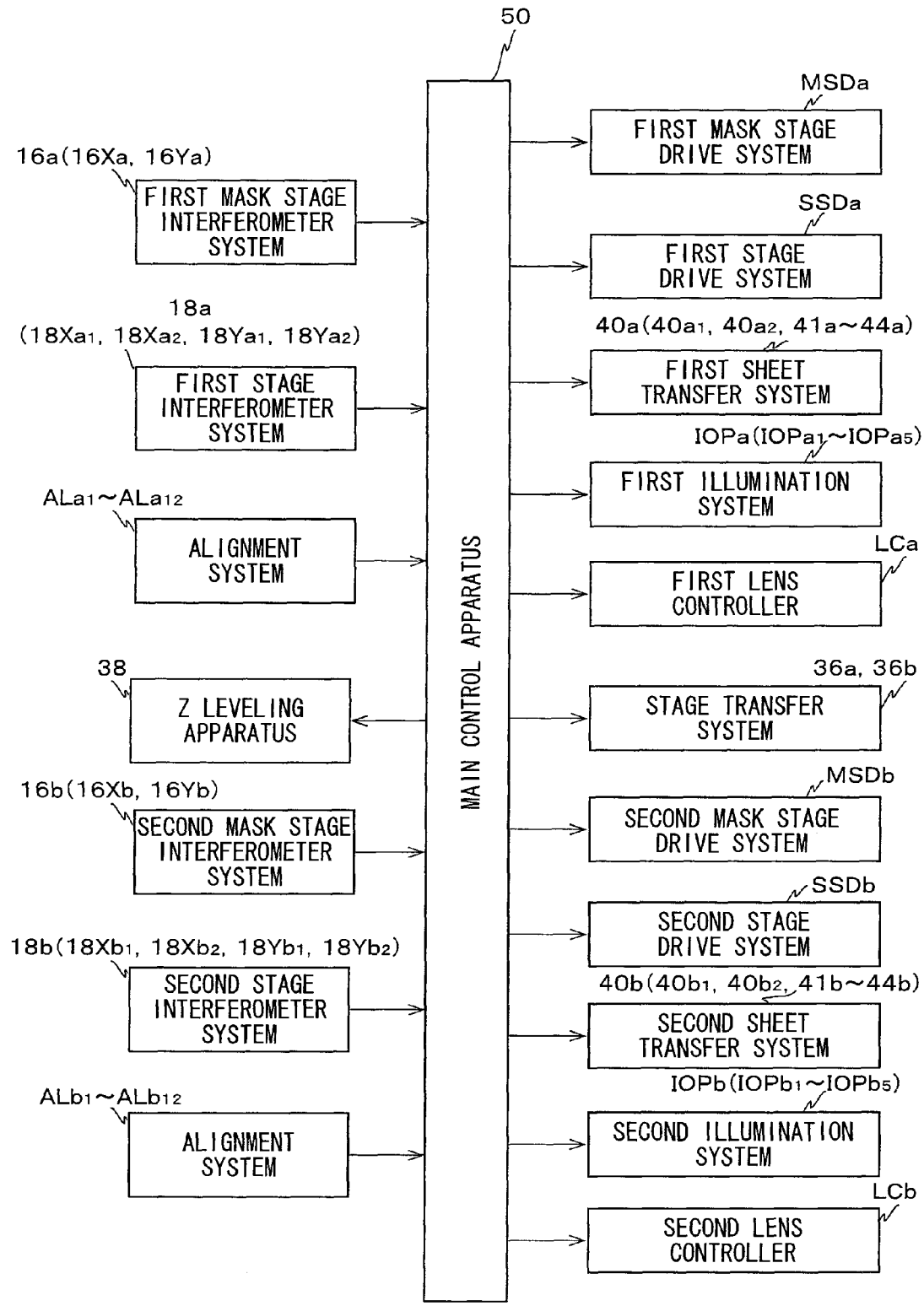
FIG. 27 is a block diagram showing an input/output relationship of a main control apparatus provided in the exposure apparatus of the second embodiment.

Measurement information from the first and second mask stage interferometer systems 16a, 16b is supplied to the main control apparatus 50 (see FIG. 27). Based on the supplied positional information, the main control apparatus 50 controls the mask stages MSTa, MSTb independently via the first and second mask stage drive systems MSDa, MSDb, respectively.

The projection optical systems PLa, PLb are arranged respectively below (on the −Z side of) the mask stages MSTa, MSTb. Here, correspondingly to the arrangement of the mask stages MSTa, MSTb, the projection optical systems PLa, PLb are spaced away from each other in the Y axis direction, and also arranged oppositely with respect to the X axis direction.

Figure 22:
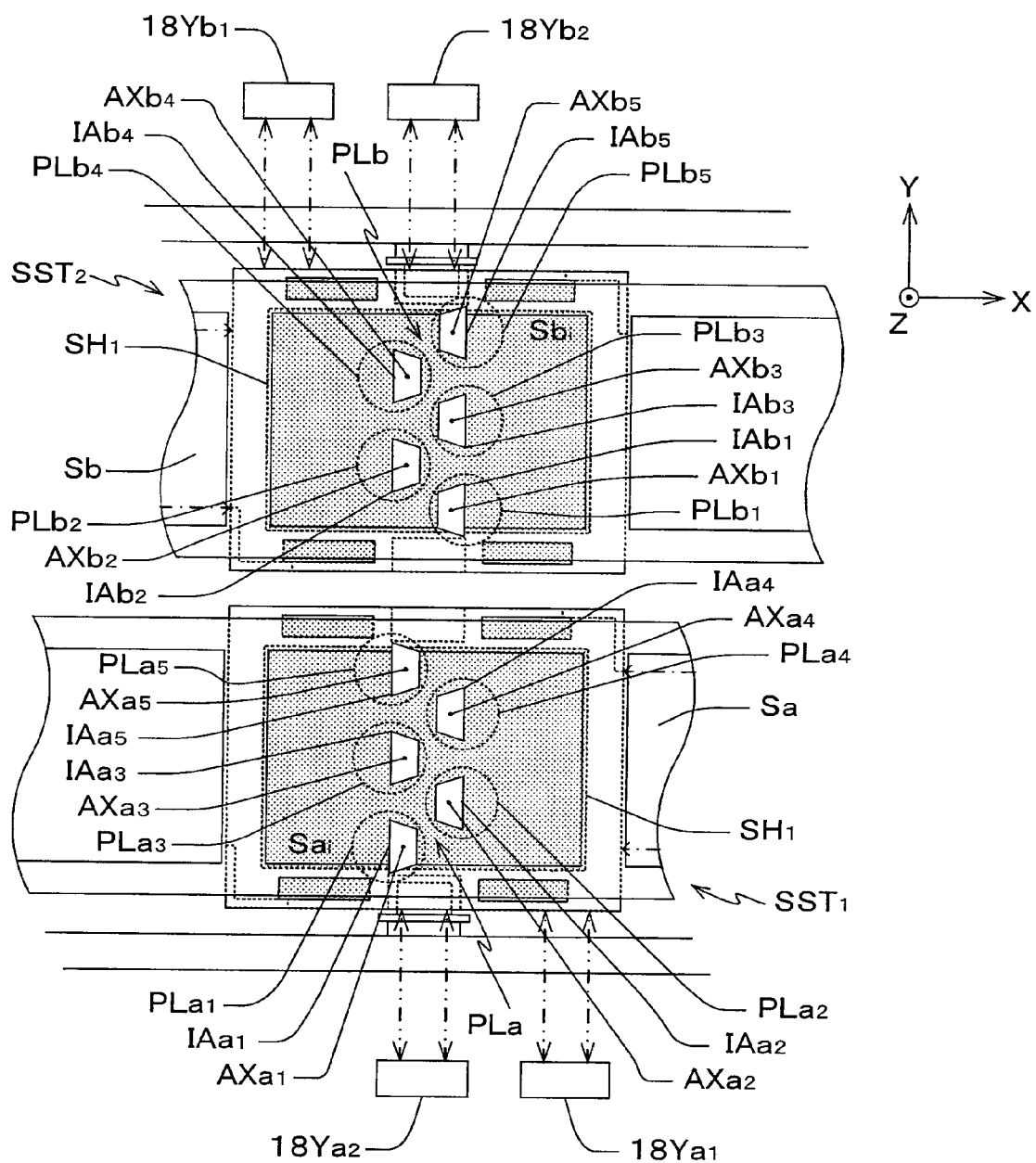
FIG. 22 is a plan view showing an arrangement of projection optical systems provided in the exposure apparatus of the second embodiment and projection regions (exposure regions) on sheets.

As shown for example in FIG. 22, the projection optical system PLa includes five projection optical system modules (hereinafter, each is referred to simply as a projection optical system) $PLa_1$ to $PLa_5$ that are staggered correspondingly to the arrangement of the optical axes $AXa_1$ to $AXa_5$. Similarly, the projection optical system PLb includes five projection optical systems $PLb_1$ to $PLb_5$ that are staggered correspondingly to the arrangement of the optical axes $AXb_1$ to $AXb_5$. Note that, as each of the projection optical systems $PLa_1$ to $PLa_5$, $PLb_1$ to $PLb_5$, a bilateral telecentric cata-dioptric system that forms an equal-size erect image is used similarly to the case of the first embodiment.

Via the projection optical systems $PLa_1$ to $PLa_5$, pattern's partial images in the illumination regions $IAMa_1$ to $IAMa_5$ on the mask Ma are projected respectively onto the projection regions $IAMa_1$ to $IAMa_5$ on the sheet Sa. Then, similarly to the above, the scan exposure causes the pattern on the mask Ma to be transferred to (a single segmented region $SAa_i$ of) the sheet Sa via the projection optical systems $PLa_1$ to $PLa_5$.

Similarly, via the projection optical systems $PLb_1$ to $PLb_5$, pattern's partial images in the illumination regions $IAMb_1$ to $IAMb_5$ on the mask Mb are projected respectively onto the projection regions $IAMb_1$ to $IAMb_5$ on the sheet Sb. Then, similarly to the above, the scan exposure causes the pattern on the mask Mb to be transferred to (a single segmented region $SAb_i$ of) the sheet Sb via the projection optical systems $PLb_1$ to $PLb_5$. Details of the scan exposure will be described later.

The exposure apparatus 1000 includes first and second lens controllers LCa, LCb (see FIG. 27) that correct distortion (positional displacement and/or shape error) respectively by the projection optical systems $PLa_1$ to $PLa_5$, $PLb_1$ to $PLb_5$. The first and second lens controllers LCa, LCb are constructed similarly to the aforementioned lens controller LC.

The stage apparatus SS is arranged below (on the −Z side of) the projection optical systems PLa, PLb, as shown in FIG. 19 and FIG. 20. The stage apparatus SS includes: a base member BS that is supported on the floor substantially horizontally by a vibration absorption mechanism (not shown in the figure); two stages $SST_1$, $SST_2$ that move on the base member BS while holding the sheet Sa or Sb; first and second stage drive systems SSDa, SSDb (see FIG. 27) that scan-drive the stages $SST_1$, $SST_2$ respectively in first and second scan regions $AS_1$, $AS_2$ shown in FIG. 26; stage transfer systems 36a, 36b (see FIG. 27) that transfer the stages $SST_1$, $SST_2$ between the first and second scan regions $AS_1$, $AS_2$; a first stage interferometer system 18a and a second stage interferometer system 18b (see FIG. 27) that measure positional information of the stages $SST_1$, $SST_2$ respectively in the first and second scan regions $AS_1$, $AS_2$.

Figure 26:
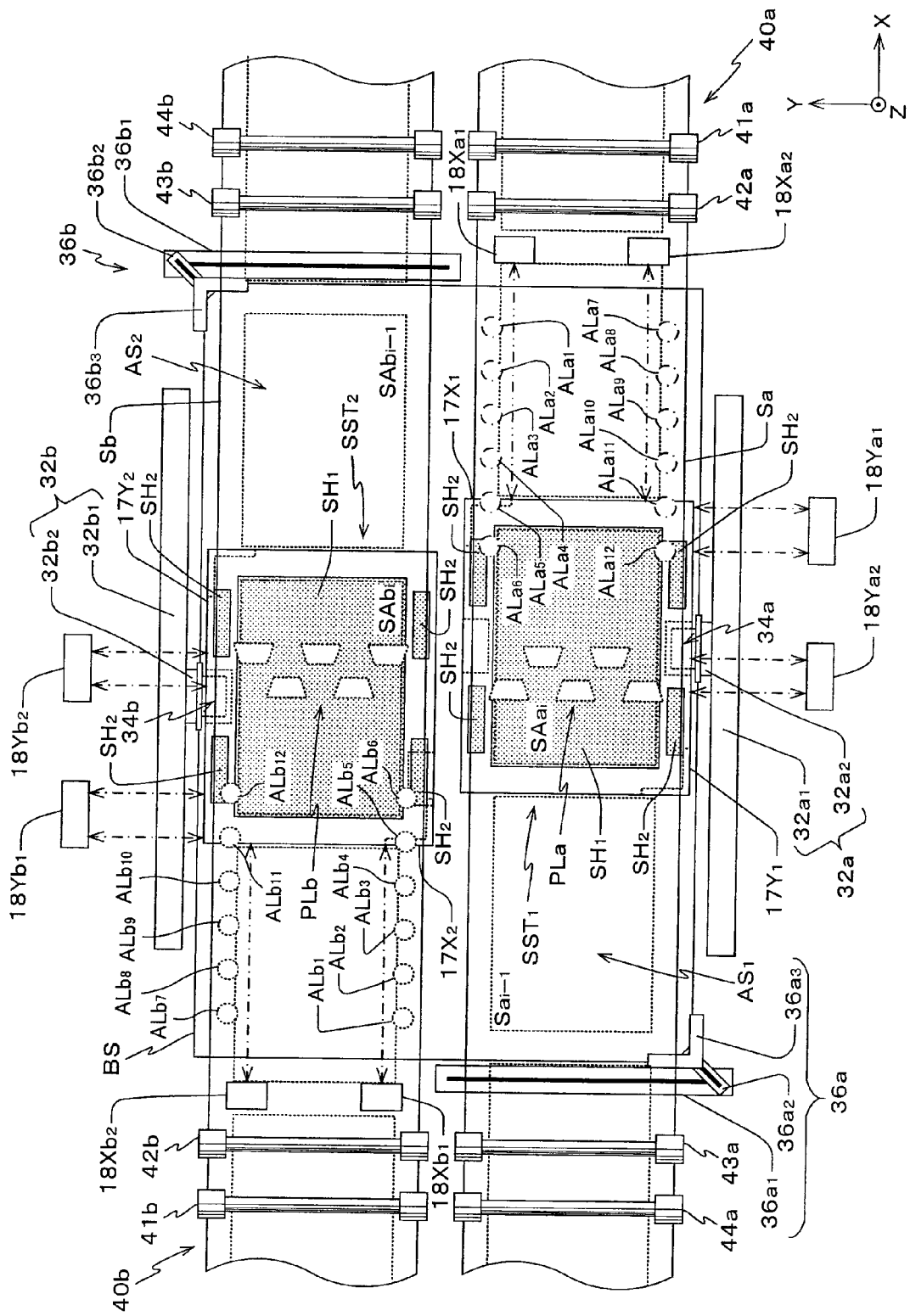
FIG. 26 is a plan view showing a schematic construction of a stage apparatus provided in the exposure apparatus of the second embodiment.

Here, as shown in, for example, FIG. 26, the first and second scan regions $AS_1$, $AS_2$ are respectively regions of the −Y side half portion and the +Y side half portion on a top surface (a guide surface) of the base member BS including the regions directly below the projection optical systems PLa, PLb. In FIG. 26, the stage $SST_1$ is positioned in the first scan region $AS_1$, and the stage $SST_2$ is positioned in the second scan region $AS_2$.

Figure 23A:
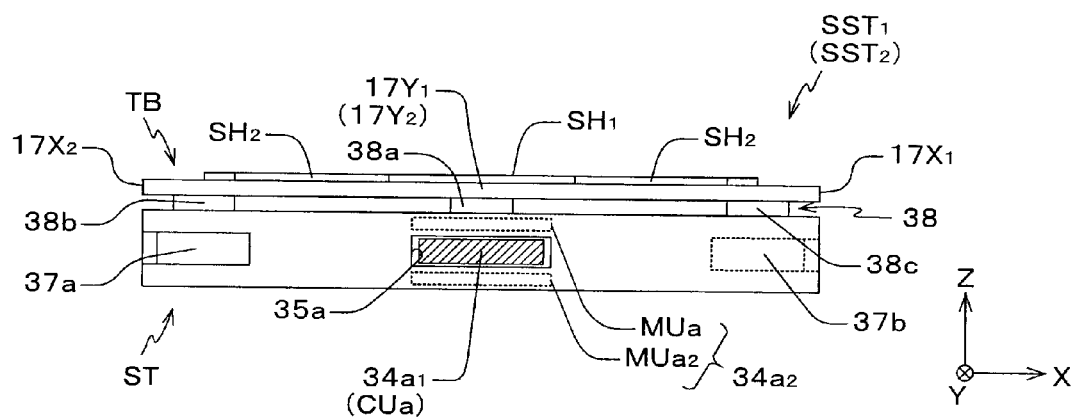
FIG. 23A and FIG. 23B are respectively a side view and a plan view showing a schematic construction of a stage.

As shown in FIG. 23A, each of the stages $SST_1$, $SST_2$ includes a stage main unit ST; a table TB; and a Z leveling apparatus 38 (three Z drive mechanisms 38a, 38b, and 38c). The stages $SST_1$, $SST_2$ are constructed similarly to the stages $SST_1$, $SST_2$ of the aforementioned first embodiment. Accordingly, through control over the Z leveling apparatus 38, it is possible to finely drive the table TB on the stage main unit ST in directions of three degrees of freedom of: the Z axis direction, the θx direction, and the θy direction. However, no mover is provided on the bottom portion of the stage main unit ST. Correspondingly, no stator is provided in the interior of the base member BS. That is, in the second embodiment, no flat motors that drive the stages $SST_1$, $SST_2$ along the top surface (the guide surface) of the base member BS are provided. Therefore, the exposure apparatus 1000 is provided with the aforementioned first and second stage drive systems SSDa, SSDb (see FIG. 27) that respectively drive the stages $SST_1$, $SST_2$ in the first and second scan regions $AS_1$, $AS_2$.

Figure 23B:
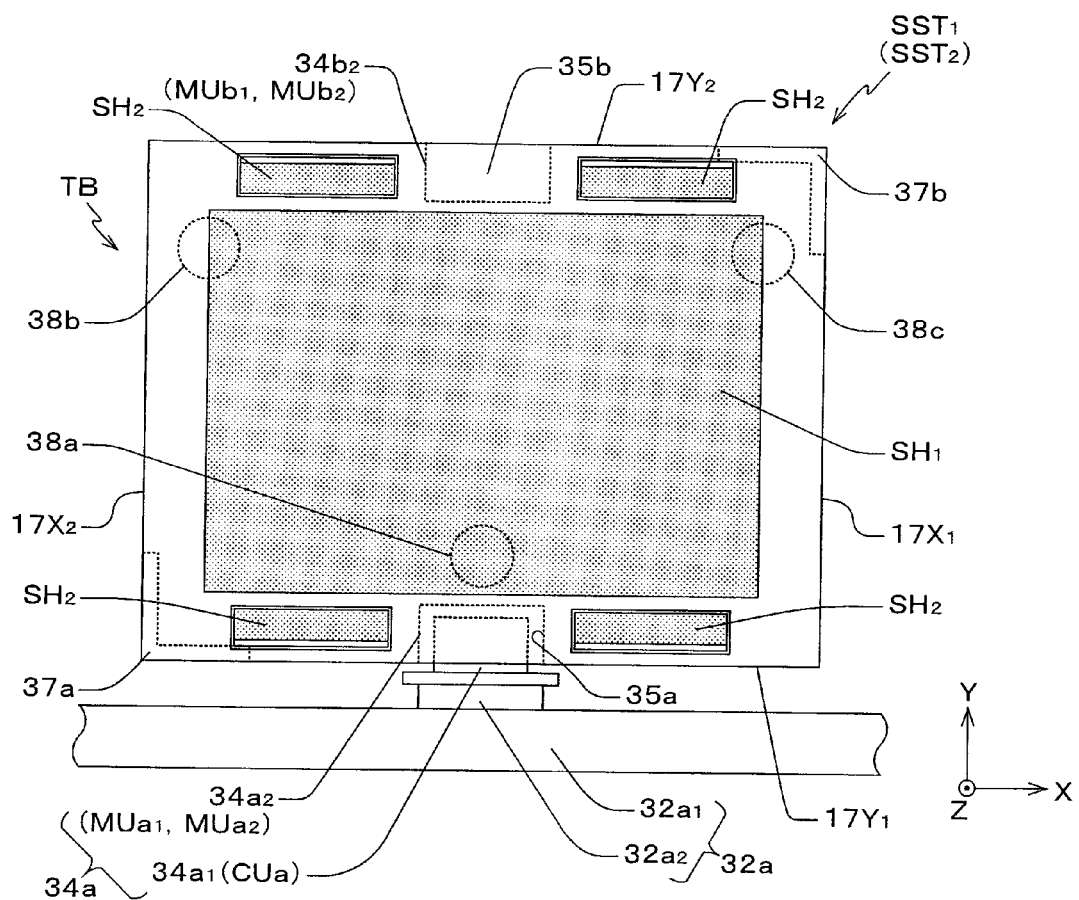

As shown in, for example, FIG. 23B and FIG. 26, the first stage drive system SSDa includes: a fine movement apparatus 34a for finely moving the stage $SST_1$ ($SST_2$) within the XY plane; and a rough movement apparatus 32a for driving the fine movement apparatus 34a in the scanning direction (the −X direction) in the first scan region $AS_1$.

The rough movement apparatus 32a is a kind of linear motor. As shown in FIG. 26, it includes: a stator $32a_1$; and a mover $32a_2$. The stator $32a_1$ has a magnet unit (or a coil unit) with a U-shaped cross-section (opening on the +Y side). The magnet unit is installed on the −Y side of the base member BS, with its longitudinal direction in the X axis direction. The mover $32a_2$ has a coil unit (or a magnet unit) that engages the stator $32a_1$ in a non-contact manner, and is driven in the longitudinal direction (the X axis direction) by a driving force (an electromagnetic force) that is generated between itself and the stator $32a_1$.

The fine movement apparatus 34a is a kind of flat motor. As shown in FIG. 23A and FIG. 23B, it includes: a stator $34a_1$ made of a rectangular-plate-like protrusion portion provided on the +Y side of the mover $32a_2$; and a mover $34a_2$ provided on a side surface on the −Y side of the stage $SST_1$ ($SST_2$) of the stage main unit ST.

The stator $34a_1$ includes a coil unit CUa made of a plurality of X coils and Y coils that are contained in the protrusion portion in a predetermined positional relationship.

As shown in FIG. 23A and FIG. 23B, on the −Y side surface of each of the stages $SST_1$, $SST_2$ (the stage main unit ST), there is formed a recessed portion 35a into which the stator $34a_1$ can be inserted in a non-contact manner.

On the other hand, as shown in FIG. 23A, the mover $34a_2$ includes a pair of magnet units $MUa_1$, $MUa_2$ that are arranged on top and bottom opposing surfaces of the recessed portion 35a of each of the stages $SST_1$, $SST_2$ (the stage main unit ST).

Here, although description of the arrangement and the like of the magnets, the coils, and the like is omitted, the mover $34a_2$ (the stage main unit ST) is configured to be finely driven in the X axis direction, the Y axis direction, and the θz direction with respect to the stator $34a_1$ by an electromagnetic interaction between the magnet units $MUa_1$, $MUa_2$ of the mover $34a_2$ and the coil unit CUa. The electromagnetic interaction is produced by appropriate control of the direction and size of the electric current for each of the coils that constitute the coil unit CUa of the stator $34a_1$.

On the other hand, the second stage drive system SSDb is made of: a fine movement apparatus 34b for finely driving the stage $SST_1$ ($SST_2$) within the XY plane; and a rough movement apparatus 32b for driving the fine movement apparatus 34b in the scanning direction (the +X direction) in the second scan region $AS_2$.

The rough movement apparatus 32b is a linear motor similar to the rough movement apparatus 32a. As shown in FIG. 26, the rough movement apparatus 32b includes a stator $32b_1$ and a mover $32b_2$, and is constructed similarly to the rough movement apparatus 32a, although the two apparatuses are symmetrical with respect to the X axis.

The fine movement apparatus 34b is a flat motor similar to the fine movement apparatus 34a. As is seen from, for example, FIG. 25(A), the fine movement apparatus 34b includes a stator $34b_1$ and a mover $34b_2$, and is constructed similarly to the fine movement apparatus 34a, although the two apparatuses are symmetrical with respect to the X axis.

Therefore, similarly to the case of the fine movement apparatus 34a, the mover $34b_2$ (the stage main unit ST) can be driven in the X axis direction, the Y axis direction, and the θz direction with respect to the stator $34b_1$ that constitutes the fine movement apparatus 34b.

As will be understood from the above description, the stages $SST_1$, $SST_2$ are independently driven in the directions of three degrees of freedom (the X, Y, and θz directions), in the first scan region $AS_1$ by the first stage drive system SSDa (see FIG. 27) and in the second scan region $AS_2$ by the second stage drive system SSDb (see FIG. 27).

The stage transfer system 36a (see FIG. 27) transfers the stage $SST_1$, $SST_2$ from the first scan region $AS_1$ to the second scan region $AS_2$. The stage transfer system 36b (see FIG. 27) transfers the stages $SST_1$, $SST_2$ from the second scan region $AS_2$ to the first scan region $AS_1$.

As shown in FIG. 26, the stage transfer system 36a includes: a guide $36a_1$ that is arranged close to the end surface on the −X side of the base member BS, is slightly longer than the width of the sheet Sa, and extends in the Y axis direction; an oblong slider $36a_2$ whose longitudinal direction forms an angle of 45° from the X axis and the Y axis and which is attached to the guide $36a_1$ slidably in the longitudinal direction of the guide $36a_1$; and an L-shaped arm member $36a_3$ attached to the slider $36a_2$ movably in the longitudinal direction of the slider $36a_2$.

To describe this in more detail, on a top surface of the guide $36a_1$, there is formed a guide groove along its longitudinal direction (the Y axis direction). In a side surface of the guide groove, there are arranged a plurality of magnets (or coils) that function as a stator of a first linear motor, mutually spaced away by a predetermined distance along the longitudinal direction. A coil (or magnet), which functions as a mover, is fixed to a lower end portion of the slider $36a_2$. The coil (or magnet) engages an inside of the guide groove. The slider $36a_2$ is driven in the Y axis direction by the first linear motor.

On a top surface of the slider $36a_2$, there is formed a formed a guide groove along its longitudinal direction. In a side surface of the guide groove, there are arranged a plurality of magnets (or coils) that function as a stator of a second linear motor, mutually spaced away by a predetermined distance along the longitudinal direction. A coil (or magnet), which functions as a mover, is fixed to a lower end portion of the arm member $36a_3$. The coil (or magnet) engages an inside of the guide groove. The arm member $36a_3$ is driven in a direction forming a degree of 45° from the X axis and the Y axis by the second linear motor.

As shown in FIG. 23A and FIG. 23B, in the corner portion at the −X side end and the −Y side end of each of the stages $SST_1$, $SST_2$ (the stage main units ST), there is formed an L-shaped recessed portion 37a that is to be engaged by the arm member $36a_3$.

The slider $36a_2$ and the arm member $36a_3$ of the stage transfer system 36a are controlled by the main control apparatus 50 via the first and second linear motors (see FIG. 27).

Here, a procedure when the main control apparatus 50 uses the stage transfer system 36a to transfer the stage $SST_1$ ($SST_2$) from the first scan region $AS_1$ to the second scan region $AS_2$ will be described.

Figure 24A:
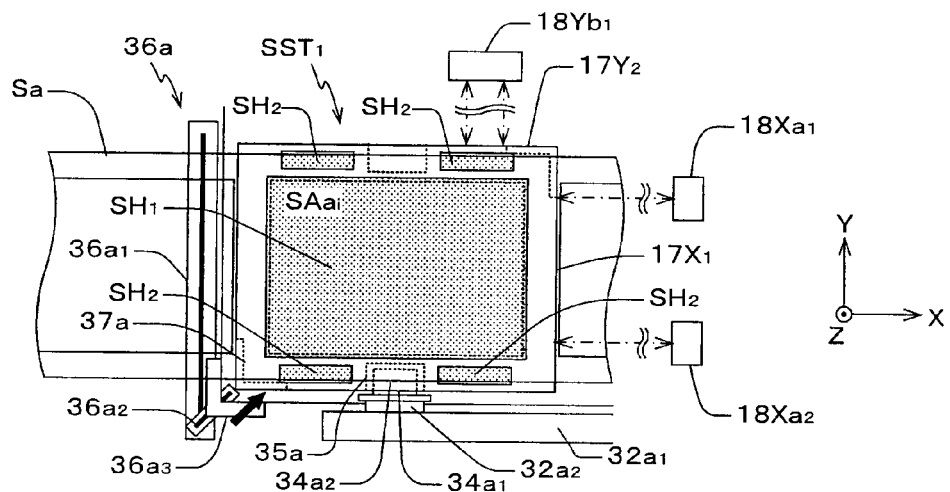
FIG. 24(A) to FIG. 24(C) are diagrams (No. 1) for explaining a construction of a stage transfer system, and a transfer procedure of a stage.
Figure 24B:
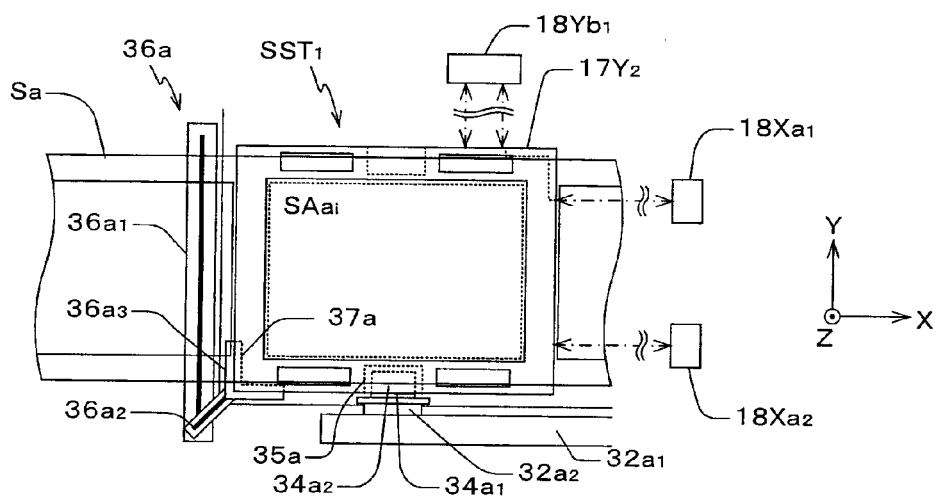

First, as shown in FIG. 24(A), the arm member $36a_3$ is slid on the slider $36a_2$ toward the stage $SST_1$ ($SST_2$) at rest at the −X end of the first scan region $AS_1$, that is, in the direction shown with the filled arrow. This causes the edges of the arm member $36a_3$ to engage the recessed portion 37a of the stage $SST_1$ ($SST_2$), as shown in FIG. 24(B).

Figure 24C:
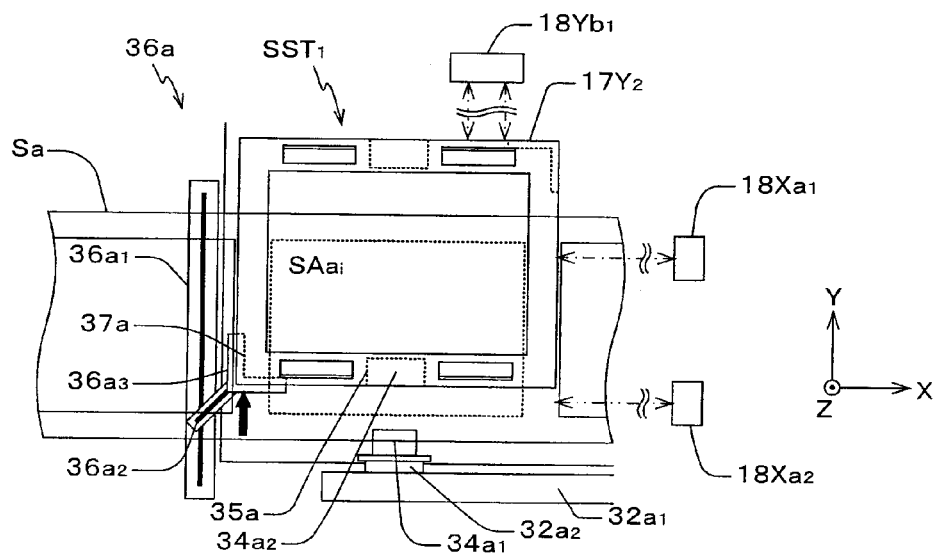

Next, the electric power supply to the stator $34a_1$ (the coil unit CUa) that functions as the fine movement apparatus 34a of the first stage drive system SSDa is stopped. This releases the restraint between the stator $34a_1$ and the mover $34a_2$ by an electromagnetic force. Next, as shown in FIG. 24(C), the slider $36a_2$ is driven on the guide $36a_1$ in the direction shown with the filled arrow (the +Y direction). This transfers the stage $SST_1$ ($SST_2$) in the +Y direction, that is, toward the second scan region $AS_2$. At some time during the transfer, the stator $34a_1$ is detached from the recessed portion 35a of the stage $SST_1$ ($SST_2$).

Figure 25A:
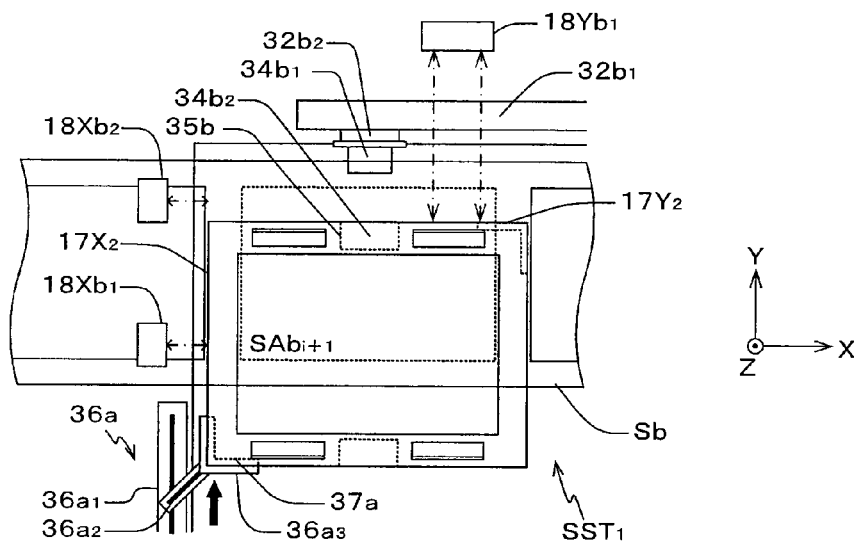
FIG. 25(A) to FIG. 25(C) are diagrams (No. 2) for explaining the transfer procedure of the stage.

At this time, as shown in FIG. 25(A), the stator $34b_1$ of the fine movement apparatus 34b, with which the mover $32b_2$ of the rough movement apparatus 32b of the second stage drive system SSDb is integrated, is on standby at a position facing the recessed portion 35b of the stage $SST_1$ ($SST_2$).

Figure 25B:
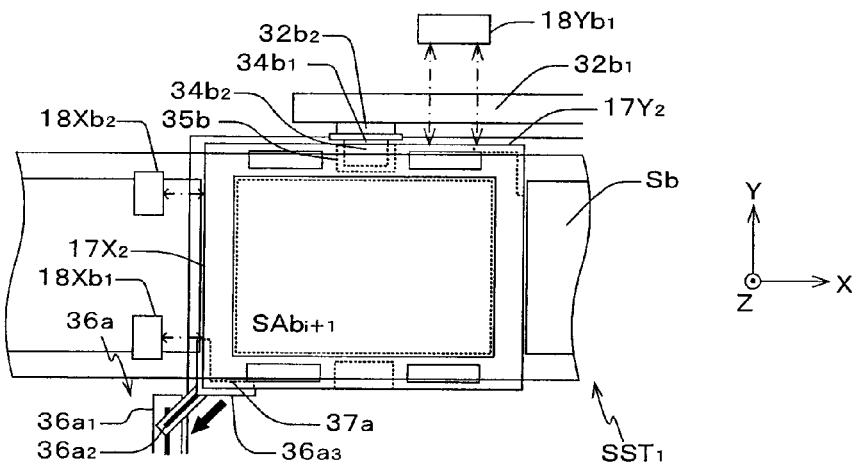
Figure 25C:
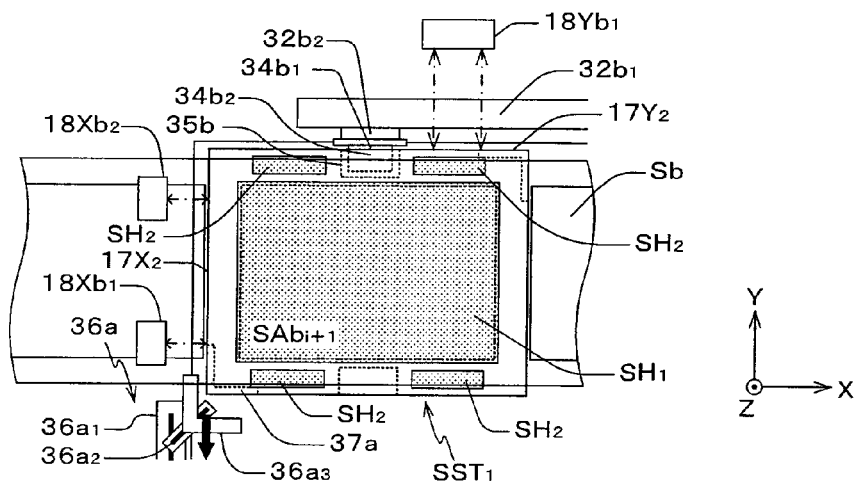

When the stage $SST_1$ ($SST_2$) is transferred to the +Y end (on the top surface) of the base member BS, the stator $34b_1$ engages (is inserted into) the recessed portion 35b of the stage $SST_1$ ($SST_2$) in a non-contact manner, as shown in FIG. 25(B). After the engagement, electric current is supplied to the stator $34b_1$ (the coil unit CUb). Thereby, the stator $34b_1$ and the mover $34b_2$ are restrained by an electromagnetic force, thus constituting the fine movement apparatus 34b of the second stage drive system SSDb. After that, as shown in FIG. 25(B), the arm member $36a_3$ is retracted in the direction shown with the filled arrow. After the retraction, as shown in FIG. 25(C), the slider $36a_2$ is driven in the direction shown with the filled arrow (the −Y direction), to thereby return the slider $36a_2$ to the first scan region $AS_1$. As a result, the stage $SST_1$ ($SST_2$) becomes capable of being driven in the second scan region $AS_2$ by means of the second stage drive system SSDb.

On the other hand, the stage transfer system 36b is provided in vicinity of the +Y side half portion at the +X end portion of the base member BS, as shown in FIG. 26. The stage transfer system 36b includes a guide $36b_1$, a slider $36b_2$, and an arm member $36b_3$. The stage transfer system 36b is constructed similarly to the stage transfer system 36a although the two systems are symmetrical with respect to the center of the base member BS. Correspondingly, in the corner portion at the +X side end and the +Y side end of each of the stages $SST_1$, $SST_2$ (the stage main units ST), there is formed a recessed portion 37b that is to be engaged by the arm member $36b_3$, as shown in FIG. 23A, FIG. 23B, and the like. A vacuum chuck may be provided on internal surfaces of the arm members $36a_3$, $36b_3$. In this case, it is not necessary to form the recessed portion 37a, 37b in the stage main unit ST.

Similarly to transferring the stages $SST_1$, $SST_2$ from the first scan region $AS_1$ to the second scan region $AS_2$ by use of the stage transfer system 36a, the main control apparatus 50 is capable of transferring the stages $SST_1$, $SST_2$ from the second scan region $AS_2$ to the first scan region $AS_1$ by use of the stage transfer system 36b.

As shown in FIG. 26, the first stage interferometer system 18a includes interferometers $18Xa_1$, $18Xa_2$, $18Ya_1$, and $18Ya_2$, and always measures the positional information within the XY plane (including the rotation information in the θz direction) of the stage $SST_1$ or $SST_2$ (the table TB) that is positioned in the first scan region $AS_1$ with a resolution of, for example, 0.25 to 1 nm.

On the other hand, the second stage interferometer system 18b includes interferometers $18Xb_1$, $18Xb_2$, $18Yb_1$, and $18Yb_2$, and always measures the positional information within the XY plane (including the rotation information in the θz direction) of the stage $SST_1$ or $SST_2$ (the table TB) that is positioned in the second scan region $AS_2$ with a resolution of, for example, 0.25 to 1 nm.

As shown in FIG. 26, the interferometers $18Xa_1$, $18Xa_2$ and $18Ya_1$, $18Ya_2$ are arranged respectively on the +X side and the −Y side of first scan region $AS_1$ (the projection optical system PL) so as to be capable of respectively facing the reflection surfaces $17X_1$ and $17Y_1$ of the stage $SST_1$ or $SST_2$ positioned in the scan region AS. The interferometers $18Xb_1$, $18Xb_2$ and $18Yb_1$, $18Yb_2$ are arranged respectively on the −X side and the +Y side of the second scan region $AS_2$ so as to respectively face the reflection surfaces $17X_2$ and $17Y_2$ of the stage $SST_1$ or $SST_2$ positioned in the second scan region $AS_2$.

The interferometers $18Xa_1$, $18Xa_2$ each irradiate a length measuring beam parallel to the X axis onto the reflection surface $17X_1$ of the stage $SST_1$ positioned in the first scan region $AS_1$, and receive a reflected beam off the reflection surface $17X_1$, to thereby measure the X position of the stage $SST_1$. The interferometers $18Ya_1$, $18Ya_2$ each irradiate two length measuring beams parallel to the Y axis onto the reflection surface $17Y_1$, and receive reflected beams off the reflection surface $17Y_1$, to thereby measure the Y position of the stage $SST_1$. Here, one of the two length measuring beams of the interferometer $18Ya_2$ is irradiated onto the reflection surface $17Y_1$ along an optical path parallel to the Y axis orthogonal to the optical axes $AXa_1$, $AXa_3$, and $AXa_5$. The other of the two length measuring beams of the interferometer $18Ya_2$ is irradiated onto the reflection surface $17Y_1$ along an optical path parallel to the Y axis orthogonal to the optical axes $AXa_2$, $AXa_4$. The two length measuring beams of the interferometer $18Ya_1$ are irradiated onto the reflection surface $17Y_1$ along an optical path parallel to the Y axis that passes through a center of detection of the adjacent alignment systems out of the alignment systems (described later).

The measurement information from the first stage interferometer system 18a ($18Xa_1$, $18Xa_2$, $18Ya_1$, and $18Ya_2$) is supplied to the main control apparatus 50 (see FIG. 27). In the case where the stage $SST_1$ is positioned in the first scan region $AS_1$, the length measuring beams of at least one of the interferometers $18Ya_1$, $18Ya_2$ or the interferometer $18Yb_1$ are inevitably irradiated onto the corresponding reflection surface ($17Y_1$ or $17Y_2$) of the stage $SST_1$, irrespective of the X position of the stage $SST_1$. Therefore, the main control apparatus 50 uses the measurement information from any of the interferometers $18Ya_1$, $18Ya_2$, and $18Yb_1$ in accordance with the X position of the stage $SST_1$. In addition, the main control apparatus 50 measures the rotation of the stage $SST_1$ in the θz direction based on the measurement information from the interferometers $18Xa_1$, $18Xa_2$. In the case where the stage $SST_2$ is positioned in the first scan region $AS_1$, its positional information is similarly measured.

The interferometers $18Xb_1$, $18Xb_2$ each irradiate a length measuring beam parallel to the X axis onto the reflection surface $17X_2$ of the stage $SST_2$ positioned in the second scan region $AS_2$, and receive a reflected beam off the reflection surface $17X_2$, to thereby measure the X position of the stage $SST_2$. The interferometers $18Yb_1$, $18Yb_2$ each irradiate two length measuring beams parallel to the Y axis onto the reflection surface $17Y_2$ and receive reflected beams off the reflection surface $17Y_2$, to thereby measure the Y position of the stage $SST_2$. Here, from the interferometers $18Yb_1$, $18Yb_2$, length measuring beams are irradiated onto the reflection surface $17Y_2$ along the optical paths similar to those of the interferometers $18Ya_1$, $18Ya_2$.

The measurement information from the second stage interferometer system 18b ($18Xb_1$, $18Xb_2$, $18Yb_1$, and $18Yb_2$) is supplied to the main control apparatus 50 (see FIG. 27). In the case where the stage $SST_2$ is positioned in the second scan region $AS_2$, the length measuring beams of one of the interferometers $18Yb_1$, $18Yb_2$ or the interferometer $18Ya_1$ are inevitably irradiated onto the corresponding reflection surface ($17Y_2$ or $17Y_1$) of the stage $SST_1$, irrespective of the X position of the stage $SST_1$. Therefore, the main control apparatus 50 uses the measurement information from any of the interferometers $18Yb_1$, $18Yb_2$, and $18Ya_1$ in accordance with the X position of the stage $SST_2$. In addition, the main control apparatus 50 measures the rotation of the stage $SST_2$ in the θz direction based on the measurement information from the interferometers $18Xb_1$, $18Xb_2$. In the case where the stage $SST_1$ is positioned in the second scan region $AS_2$, its positional information is similarly measured.

The main control apparatus 50 controls the drive of the stages $SST_1$, $SST_2$ via the first and second stage drive systems SSDa, SSDb based on the positional information from the first and second stage interferometer systems 18a, 18b.

As each of the interferometers $18Xa_1$, $18Xa_2$, $18Ya_1$, $18Ya_2$, $18Xb_1$, $18Xb_2$, $18Yb_1$, and $18Yb_2$, a multiaxial interferometer that irradiates a plurality of length measuring beams spaced in the Z axis direction onto the reflection surface can be used. In this case, the main control apparatus 50 is capable of obtaining not only the positional information (the rotation information (including a yawing amount (a rotation amount θz in the θz direction)) of the stages $SST_1$, $SST_2$ (the tables TB) within the XY plane, but also the inclination information (a pitching amount (a rotation amount θx in the θx direction) and a rolling amount (a rotation amount θy in the θy direction)) of the stages $SST_1$, $SST_2$ (the tables TB) with respect to the XY plane.

In addition, the exposure apparatus 1000 of the second embodiment has 12 alignment systems $ALa_1$ to $ALa_{12}$ and 12 alignment systems $ALb_1$ to $ALb_{12}$ respectively provided on the +X side of the projection optical system PLa and the −X side of the projection optical system PLb. The alignment systems $ALa_1$ to $ALa_{12}$ and the alignment systems $ALb_1$ to $ALb_{12}$ are for detecting alignment marks affixed respectively on segmented regions on the sheets Sa and Sb. Note that the alignment systems $ALa_1$ to $ALa_{12}$ and the $ALb_1$ to $ALb_{12}$ are constructed and arranged similarly to the alignment systems $AL_1$ to $AL_{12}$ of the first embodiment.

FIG. 27 shows a block diagram illustrating an input/output relationship of the main control apparatus 50, which is a main constituent of the control system of the exposure apparatus 1000 and controls the respective constituent parts.

Next is a description of a parallel processing operation using the two stages $SST_1$, $SST_2$ in the exposure apparatus 1000 of the present embodiment, based on FIG. 28 to FIG. 37. In the following operation description, a multitude of drawings are used. The same members may not be denoted by the same reference symbols according to the drawings. That is, different reference symbols may be used for the same members in different drawings. However, the drawings show the same construction regardless of the presence or absence of the reference symbols. The same applies to the drawings that have been used for the above description.

Figure 28:
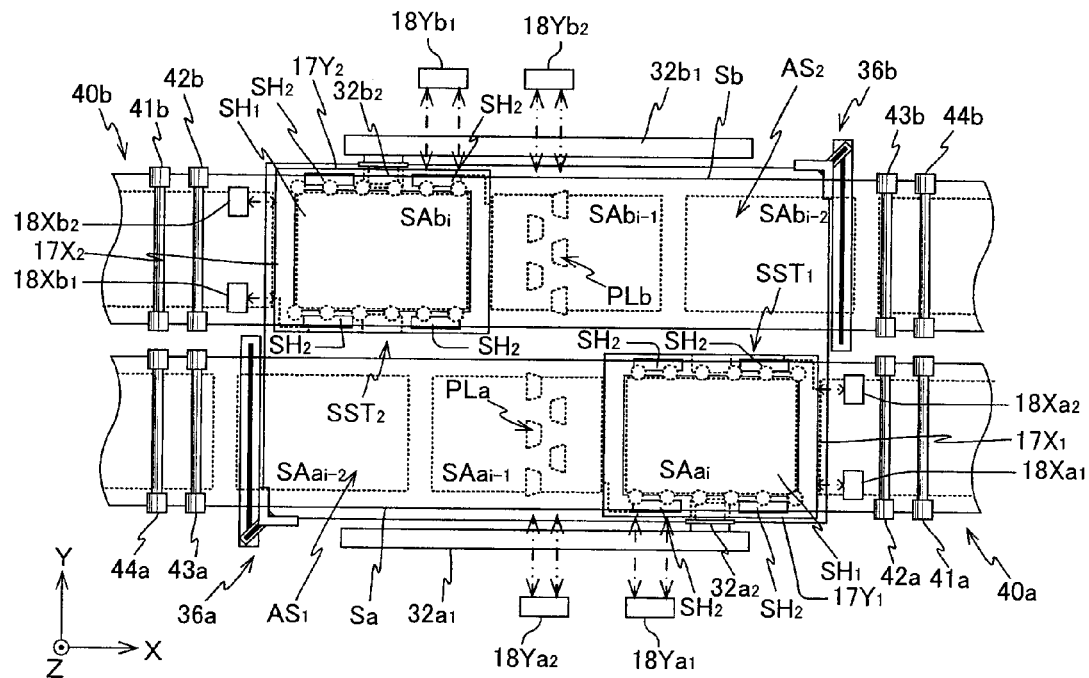
FIG. 28 is a diagram (No. 1) for explaining the parallel processing operation using the two stages in the exposure apparatus of the second embodiment.

FIG. 28 shows a state where, after exposure on the first (i−1) segmented regions $SAa_1$ to $SAa_{i−1}$ out of the segmented regions arrayed on the sheet Sa are completed and also exposure on the first (i−1) segmented regions $SAb_1$ to $SAb_{i−1}$ out of the segmented regions arrayed on the sheet Sb are completed, exposure processing on the next segmented regions $SAa_i$, $SAb_i$ is about to start. In the state of FIG. 28, the stage $SST_1$ used for moving the sheet Sa when the segmented region $SAa_i$ is exposed is on standby at a position at the +X end portion in the first scan region $AS_1$ (a first standby position). The stage $SST_2$ used for moving the sheet Sb when the segmented region $SAb_1$ is exposed is on standby at a position at the −X end portion in the second scan region $AS_2$ (a second standby position).

The loading of the masks Ma, Mb onto the mask stages MSTa, MSTb and the mask alignment (the positioning of the mask) of the masks Ma, Mb are performed typically before the start of exposure on the first segmented regions $SAa_1$, $SAb_1$ on the sheets Sa, Sb. Therefore, in the state of FIG. 28, the loading and the mask alignment of the masks Ma, Mb are completed. In addition, the mask stages MSTa, MSTb have been moved to a scan start position (an acceleration start position) for exposure on the segmented regions $SAa_i$, $SAb_i$.

f. First, the central portions of the sheets Sa, Sb including the segmented regions $SAa_i$, $SAb_i$ are held respectively on the stages $SST_1$, $SST_2$ in the following procedure of f1. to f4.

f1. To be more specific, similarly to a1. described in the aforementioned first embodiment, the main control apparatus 50 controls the first sheet transfer system 40a to allow a predetermined length of the sheet Sa to sag in a loop between the transfer roller portions 41a, 42a. At the same time, the main control apparatus 50 controls the second sheet transfer system 40b to allow a predetermined length of the sheet Sb to sag in a loop between the transfer roller portions 41b, 42b. The predetermined length is approximately a distance between the transfer roller portions 42a, 43a (42b, 43b).

f2. Next, the main control apparatus 50 controls the sheet transfer system 40a based on the positional information of the stage $SST_1$ from the first stage interferometer system 18a ($18Xa_1$, $18Xa_2$, $18Ya_1$, and $18Ya_2$), and pulls back the sheet Sa in the +X direction, or feeds the sheet Sa in the −X direction, to thereby align the segmented region $SAa_i$ on the sheet Sa with (the holding surface of) the sheet holder $SH_1$ of the stage $SST_1$. Here, the sheet Sa is positioned after it is extended between the transfer roller portions 42a, 43a with an appropriate tension being applied. Furthermore, the main control apparatus 50 finely drives the stage $SST_1$ to align (the holding surface of) the sheet holder $SH_1$ with the segmented region $SAa_i$ on the sheet Sa.

In parallel with the alignment of the sheet Sa, the main control apparatus 50 similarly controls the second sheet transfer system 40b based on the positional information on the stage $SST_2$ from the second stage interferometer system 18b ($18Xb_1$, $18Xb_2$, $18Yb_1$, and $18Yb_2$), to thereby align the segmented region $SAb_i$ on the sheet Sb with (the holding surface of) the sheet holder $SH_1$ of the stage $SST_2$. Furthermore, the main control apparatus 50 finely drives the stage $SST_2$ to align (the holding surface of) the sheet holder $SH_2$ with the segmented region $SAb_i$ on the sheet Sb.

In this condition, there is provided a slight space between the sheet Sa and (the holding surface of) the sheet holder $SH_1$ of the stage $SST_1$. Similarly, there is provided a slight space between the sheet Sb and (the holding surface of) the sheet holder $SH_1$ of the stage $SST_2$.

Figure 29:
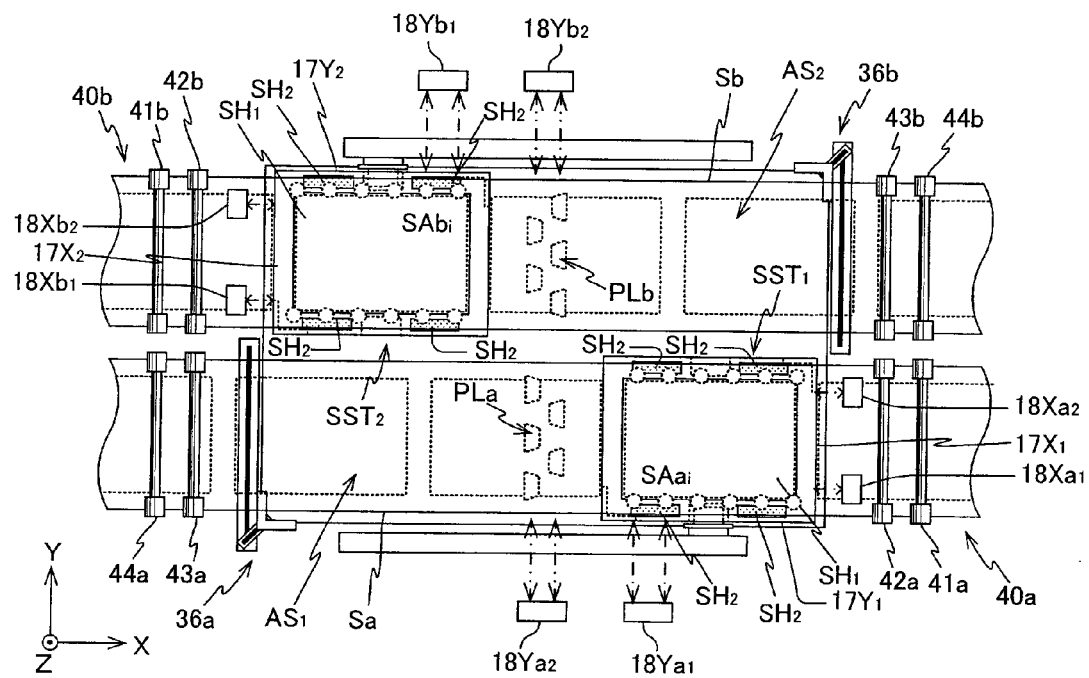
FIG. 29 is a diagram (No. 2) for explaining the parallel processing operation using the two stages in the exposure apparatus of the second embodiment.
Figure 30:
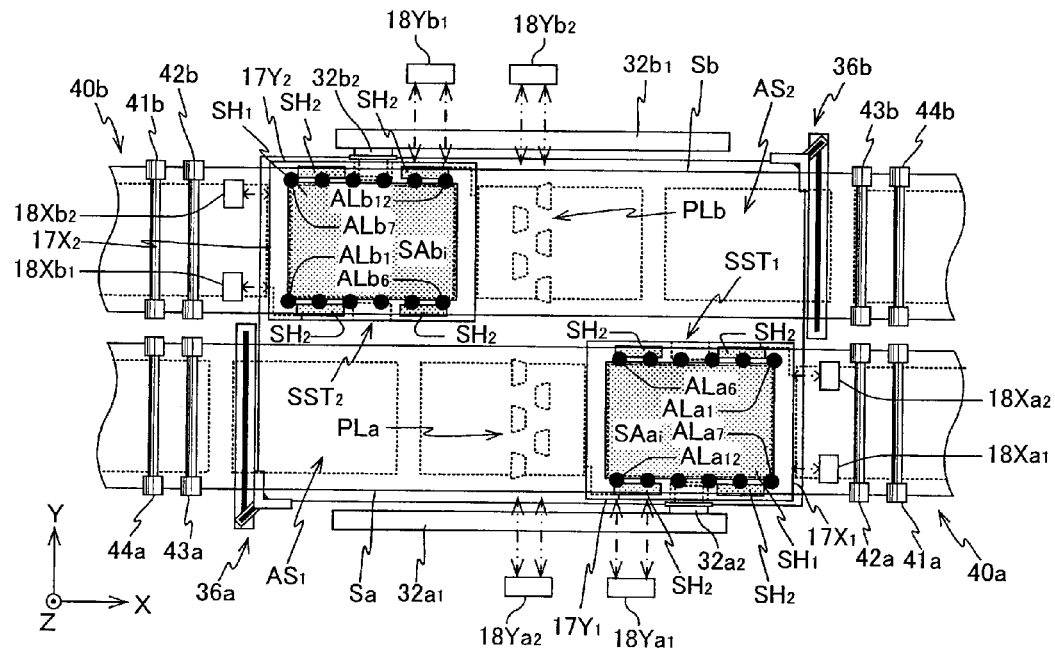
FIG. 30 is a diagram (No. 3) for explaining the parallel processing operation using the two stages in the exposure apparatus of the second embodiment.

In a state where the stage $SST_1$ and the sheet Sa are aligned with each other at the first standby position, each alignment mark affixed on the segmented region $SAa_i$ is positioned within a detection field of view of each of the alignment systems $ALa_1$ to $ALa_{12}$. Similarly, in a state where the stage $SST_2$ and the sheet Sb are aligned with each other at the second standby position, each alignment mark affixed on the segmented region $SAb_i$ is positioned within a detection field of view of each of the alignment systems $ALb_1$ to $ALb_{12}$.

f3. After alignment, while horizontally holding the table TB of the stage $SST_1$ via the first stage drive system SSD (the Z leveling apparatus 38), the main control apparatus 50 finely drives the four auxiliary sheet holders $SH_2$ on the table TB in the +Z direction, and adsorbingly holds the rear surfaces in the outside portions on the ±Y sides of the segmented region $SAa_i$ of the sheet Sa by use of the auxiliary sheet holders $SH_2$. Similarly, the main control apparatus 50 adsorbingly holds the rear surface in the outside portions on the ±Y sides of the segmented region $SAb_i$ of the sheet Sb by use of the auxiliary sheet holders $SH_2$ on the stage $SST_2$ (the table TB). FIG. 29 shows a state where the sheets Sa, Sb are temporarily held respectively on the stages $SST_1$, $SST_2$ (the auxiliary sheet holders $SH_2$) in this manner.

f4. After the temporary hold of the sheets Sa, Sb, the main control apparatus 50 finely drives the four auxiliary sheet holders $SH_2$ on the stage $SST_1$ in the −Z direction while temporarily holding the sheet Sa, to thereby bring the rear surface in the central portion of the sheet Sa including the segmented region $SAa_i$ into contact with the holding surface of the sheet holder $SH_1$. The main control apparatus 50 then positions the holding surfaces of the four auxiliary sheet holders $SH_2$ slightly below (on the −Z side of) the holding surface of the sheet holder $SH_1$. As a result, an appropriate tension is applied to the sheet Sa, and the central portion of the sheet Sa is fixed on the holding surface of the sheet holder $SH_1$. In this condition, the main control apparatus 50 adsorbingly holds the sheet Sa on the sheet holder $SH_1$, as shown in FIG. 30. Thereby, the central portion of the sheet Sa including the segmented region $SAa_i$ is held on the stage $SST_1$ in a manner parallel to the XY and in a flat manner.

In parallel with the holding of the sheet Sa, the main control apparatus 50 adsorbingly holds the central portion of the sheet Sb including the segmented region $SAb_i$ on the sheet holder $SH_1$ of the stage $SST_2$ in a similar manner.

g. Next, an alignment measurement is performed on the sheets Sa, Sb.

As described above, in a state where the stage $SST_1$ is positioned at the first standby position, each alignment mark affixed on the segmented region $SAa_i$ is positioned within the detection field of vision of each of the alignment systems $ALa_1$ to $ALa_{12}$. Additionally, in a state where the stage $SST_2$ is positioned at the second standby position, each alignment mark affixed on the segmented region $SAb_i$ is positioned within the detection field of vision of each of the alignment systems $ALb_1$ to $ALb_{12}$. Therefore, as shown in FIG. 30, the main control apparatus 50 uses the alignment systems $ALa_1$ to $ALa_{12}$ to detect the alignment marks affixed on the segmented region $SAa_i$ on the sheet Sa (measure the positions of the alignment marks from the centers of the index marks). Based on the detection results of the alignment marks and on the positional information of the stage $SST_1$ from the first stage interferometer system 18a at the time of the detection, the position coordinates of the 12 alignment marks on the XY coordinates system are obtained. By use of all or part of the position coordinates of the 12 alignment marks, the main control apparatus 50 performs a predetermined calculation using the least squares method, to thereby find distortion, that is, the XY shift, the rotation, the XY scaling, and the degree of orthogonality, of the pattern already formed in the segmented region $SAa_i$ on the sheet Sa.

In parallel with the alignment measurement of the sheet Sa, the main control apparatus 50 similarly uses the alignment systems $ALb_1$ to $ALb_{12}$ to detect the alignment marks affixed on the segmented region $SAb_i$ on the sheet Sb. Based on the detection results of the alignment marks and on the positional information of the stage $SST_2$ from the second stage interferometer system 18$b$ at the time of the detection, the main control apparatus 50 obtains the position coordinates of the 12 alignment marks on the XY coordinates system. Similarly to the above, by use of the position coordinates of the alignment marks, the main control apparatus 50 performs a predetermined calculation, to thereby find distortion, that is, the XY shift, the rotation, the XY scaling, and the degree of orthogonality, of the pattern already formed in the segmented region $SAb_i$ on the sheet Sb.

Figure 31:
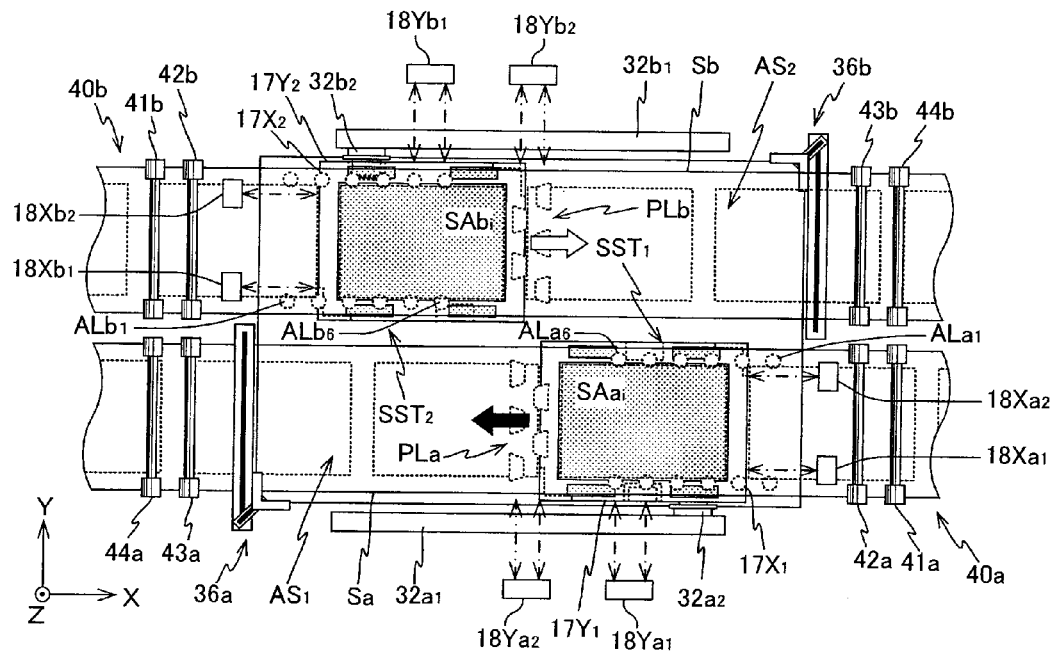
FIG. 31 is a diagram (No. 4) for explaining the parallel processing operation using the two stages in the exposure apparatus of the second embodiment.
Figure 32:
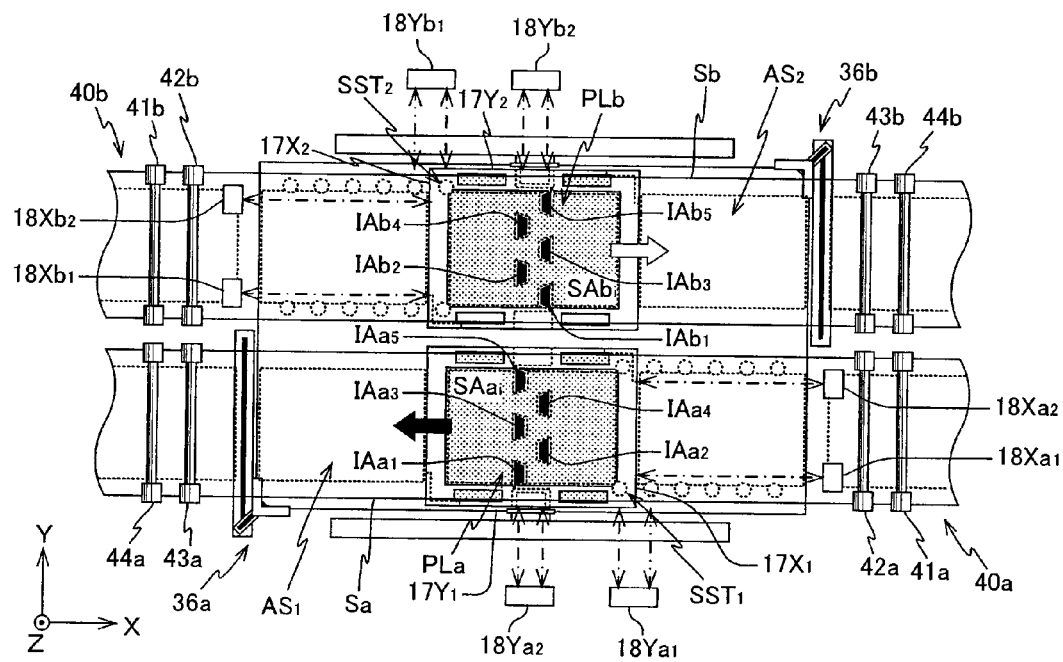
FIG. 32 is a diagram (No. 5) for explaining the parallel processing operation using the two stages in the exposure apparatus of the second embodiment.

If the number of alignment systems is smaller than the number of alignment marks to be detected, it is required to perform an alignment measurement while the stage $SST_1$ holding the sheet Sa and the stage $SST_2$ holding the sheet Sb are moved stepwise in the X axis direction. At this time, the main control apparatus 50 controls the rotation and stopping of the rollers of the sheet transfer systems 40$a$, 40$b$ in synchronization with the movement of the stages $SST_1$, $SST_2$.

h. Next, a scan exposure is performed on the segmented region $SAa_i$ on the sheet Sa and on the segmented region $SAb_i$ on the sheet Sb.

h1. To be more specific, based on the results of the alignment measurement on the sheet Sa, especially on the XY shift, the main control apparatus 50 moves the stage $SST_1$ holding the sheet Sa to the scan start position (the acceleration start position) for exposure, and aligns the stage $SST_1$ with the mask stage MSTa holding the mask Ma. Here, also in the present second embodiment, the acceleration start position for the stage $SST_1$ (and $SST_2$) is set to the same position as (or the vicinity of the position of) the aforementioned first standby position in the first scan region $AS_1$. Therefore, a fine positional adjustment of the stage $SST_1$ (and $SST_2$) within XY plane is performed.

h2. Next, the main control apparatus 50 starts acceleration of the stages $SST_1$, MSTa in the scanning direction (the −X direction). As a result, the stages $SST_1$, MSTa begin to move in the −X direction. At some time during their movement, specifically, before the end of the acceleration of the stages $SST_1$, MSTa, one of the length measuring beams from the interferometer 18$Ya_2$ begins to hit the reflection surface 17$Y_1$, as shown in FIG. 31. Therefore, immediately after that, the main control apparatus 50 switches the interferometer for measuring the Y position of the stage $SST_1$ from the interferometer 18$Ya_1$ to the interferometer 18$Ya_2$.

h3. When the stages $SST_1$, MSTa reach a state of synchronized uniform motion after completion of the acceleration of the stages $SST_1$, MSTa, the illumination beams $IL_{a1}$, $IL_{a5}$ begin to illuminate the pattern region on the mask Ma, to thereby start exposure. With the advancement of the synchronized uniform movement of the stages $SST_1$, MSTa, the illumination beams $ILa_1$ to $ILa_5$ respectively illuminates the illumination regions $IAMa_1$ to $IAMa_5$ (see FIG. 21) on the mask M, as shown in FIG. 32. The pattern's partial images in the illumination regions $IAMa_1$ to $IAMa_5$ are projected onto the projection regions $IAa_1$ to $IAa_5$ on the sheet Sa held on the stage $SST_1$ respectively via the projection optical systems $PLa_1$ to $PLa_5$ (see FIG. 22).

h4. In parallel with the aforementioned operations of h1. to h3., the main control apparatus 50 moves the stage $SST_2$ holding the sheet Sb to the scan start position (the acceleration start position) for exposure, aligns the mask holding the mask Mb with the mask stage MSTb, starts acceleration of the stages $SST_1$, MSTb in the scanning direction (the +X direction), switches the interferometer for measuring the Y position of the stage $SST_2$ before completion of the acceleration from the interferometer 18$Yb_1$ to the interferometer 18$Yb_2$, and performs other operations, similarly to the above. When the stages $SST_2$, MSTb reach a state of synchronized uniform motion after completion of the acceleration of the stages $SST_2$, MSTb, the illumination beams $ILb_1$ to $ILb_5$ begin to illuminate the pattern region on the mask Mb, to thereby start exposure. With the advancement of the synchronized uniform movement of the stages $SST_2$, MSTb, the five illumination beams respectively illuminates the illumination regions $IAMb_1$ to $IAMb_5$ (see FIG. 21) on the mask M, as shown in FIG. 32. The pattern's partial images in the illumination regions $IAMb_1$ to $IAMb_5$ are projected onto the projection regions $IAb_1$ to $IAb_5$ on the sheet Sb held on the stage $SST_2$ respectively via the projection optical systems $PLb_1$ to $PLb_5$ (see FIG. 22).

When the entire area of the pattern region of the mask Ma is illuminated by the illumination beams $ILa_1$ to $ILa_5$, that is, when the pattern region of the mask Ma pass through the illumination regions $IAMa_1$ to $IAMa_5$, the scan exposure on the segmented region $SAa_i$ of the sheet Sa is completed. Similarly, when the entire area of the pattern regions of the mask Mb is illuminated by the illumination beams $ILb_1$ to $ILb_5$, the scan exposure on the segmented region $SAb_i$ of the sheet SAb is completed. As a result, the pattern of the masks Ma, Mb are transferred respectively to the segmented regions $SAa_i$, $Sb_i$ of the sheets Sa, Sb.

During the scan exposure, the main control apparatus 50 drives the table TB of the stage $SST_1$ ($SST_2$)) in the Z axis direction while keeping the table TB horizontal, to thereby position the surface of the sheet Sa (Sb) held on the table TB (the sheet holder $SH_1$) at a focal position (within a depth of focus) of the projection optical system PLa (PLb). Furthermore, during the scan exposure, the main control apparatus 50 controls the synchronous drive of (relative position and relative speed between) the stage $SST_1$ ($SST_2$) and the mask stage MSTa (MSTb) based on the results of the alignment measurement (that is, the XY shift, the rotation, the XY scaling, and the degree of orthogonality that are obtained above), to thereby correct distortion of the entire image of the pattern projected onto the sheet Sa (Sb). Furthermore, the main control apparatus 50 controls the drive of the optical element groups (lens groups) that respectively constitute the projection optical systems $PLa_1$ to $PLa_5$ ($PLb_1$ to $PLb_5$) via the first lens controller LCa (the second lens controller LCb), to thereby correct distortion of the partial images that are projected respectively onto the projection regions $IAa_1$ to $IAa_5$ ($IAb_1$ to $IAb_5$) on the sheet Sa (Sb). As a result, the projection image of the pattern of the mask Ma (Mb) is highly accurately superimposed on the pattern that has been already formed in the segmented region $SAa_i$ ($SAb_i$).

Figure 33:
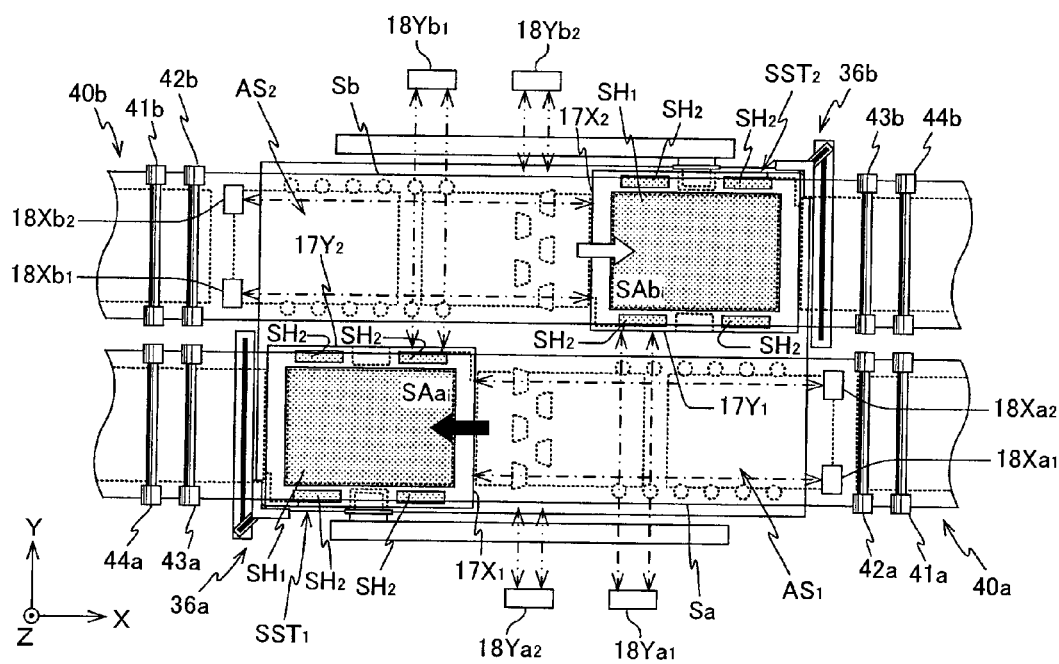
FIG. 33 is a diagram (No. 6) for explaining the parallel processing operation using the two stages in the exposure apparatus of the second embodiment.

After completion of the scan exposure on the segmented region $SAa_i$, the stages $SST_1$, MSTa are decelerated, and come to a stop when they reach their respective scan stop positions (deceleration stop positions), as shown in FIG. 33. Similarly, after completion of the scan exposure on the segmented region $SAb_i$, the stages $SST_2$, MSTb are decelerated, and come to a stop when they reach their respective scan stop positions (deceleration stop positions), as shown in FIG. 33.

Here, during the scan exposures performed in parallel on the segmented regions $SAa_i$, $SAb_i$, the length measuring beams from the interferometer $18Yb_1$ cease to hit the stage $SST_2$ and, at the same time, start to hit the stage $SST_1$. On the other hand, the length measuring beams from the interferometer $18Ya_1$ cease to hit the stage $SST_1$ and, at the same time, start to hit the stage $SST_2$. Therefore, after completion of the scan exposure on the segmented region $SAa_i$, the main control apparatus 50 begins to decelerate the stages $SST_1$, MSTa. At the same time, the main control apparatus 50 switches the interferometers for measuring the Y position of the stage $SST_1$ from the interferometer $18Ya_2$ to interferometer $18Yb_1$. In parallel with this, after completion of the scan exposure on the segmented region $SAb_i$, the main control apparatus 50 begins to decelerate the stages $SST_2$, MSTb. At the same time, the main control apparatus 50 switches the interferometers for measuring the Y position of the stage $SST_2$ from the interferometer $18Yb_2$ to interferometer $18Ya_1$. In the second embodiment, the deceleration end positions of the stages $SST_1$, $SST_2$ in scanning are set to coincide respectively with the −X end and the +X end of the base member BS.

When driving the stage $SST_1$ ($SST_2$) holding the sheet Sa (Sb) in the −X direction (the +X direction) during the scan exposure, the main control apparatus 50 appropriately rotates and stops the drive rollers of the sheet transfer system 40a (40b) as the stage $SST_1$ ($SST_2$) moves so that the movement of the stage $SST_1$ ($SST_2$) will not be prohibited by the tension acting on the sheet Sa (Sb), similarly to the above.

Figure 34:
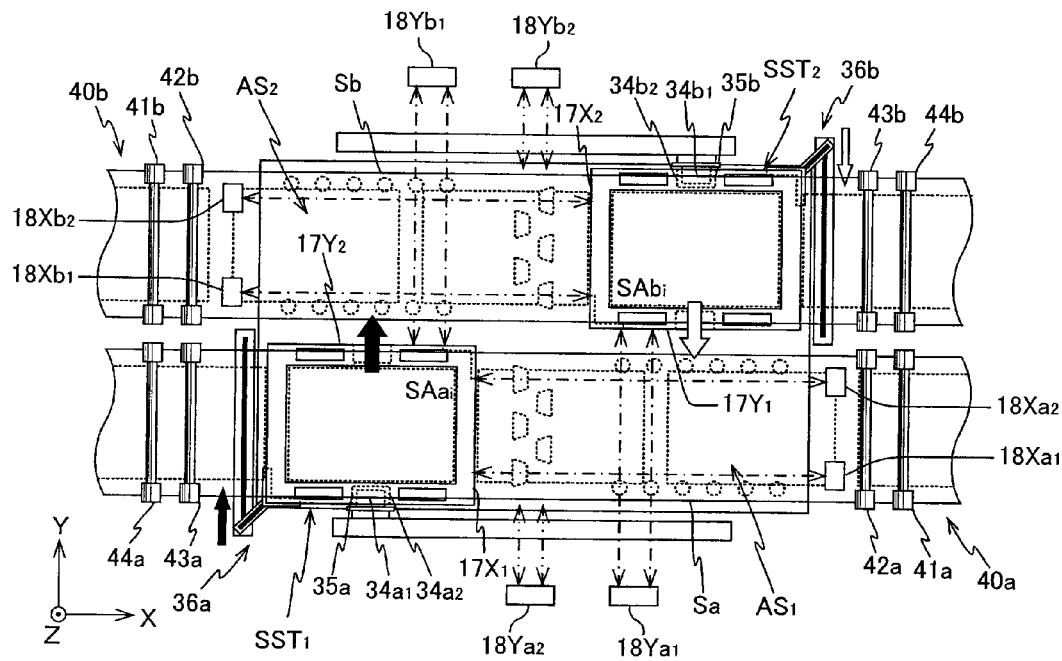
FIG. 34 is a diagram (No. 7) for explaining the parallel processing operation using the two stages in the exposure apparatus of the second embodiment.

Next, as preprocessing for exposing the next segmented regions $SAa_{i+1}$, $SAb_{i+1}$ of the sheets Sa, Sb, the stages $SST_1$, $SST_2$ are exchanged according to the following procedures i1. to i5.

i1. As shown in FIG. 34, when the stage $SST_1$ stops at the −X end in the first scan region $AS_1$ as a deceleration stop position, the main control apparatus 50 releases the adsorbing hold of the sheet Sa by the sheet holder $SH_1$ and the auxiliary sheet holders $SH_2$. Similarly, when the stage $SST_2$ stops at the +X end in the second scan region $AS_2$ as a deceleration stop position, the main control apparatus 50 releases the adsorbing hold of the sheet Sb by the sheet holder $SH_1$ and the auxiliary sheet holders $SH_2$. Furthermore, the main control apparatus 50 retracts the table TB of the stages $SST_1$, $SST_2$ in the lower direction (the −Z direction). This brings the sheet Sa into an extended state between the transfer roller portions 42a, 43a, with a slight space between itself and the sheet holder $SH_1$ of the stage $SST_1$. Similarly, this brings the sheet Sb into an extended state between the transfer roller portions 42b, 43b, with a slight space between itself and the sheet holder $SH_1$ of the stage $SST_2$.

i2. Next, as has been described with reference to FIG. 24(A) to FIG. 24(C) and FIG. 25(A) to FIG. 25(C), the main control apparatus 50 uses the stage transfer system 36a to transfer the stage $SST_1$ from the first scan region $AS_1$ to the second standby position in the second scan region $AS_2$. To be more specific, the main control apparatus 50 first causes the arm member $36a_3$ to engage the recessed portion 37a of the stage $SST_1$, as shown in FIG. 34. Next, the main control apparatus 50 releases the restraint between the stator $34a_1$ and the mover $34a_2$ that constitute the fine movement apparatus 34a of the first stage drive system SSDa. Then, the main control apparatus 50 drives the slider $36a_2$ in the direction shown with the filled arrow (the +Y direction) in FIG. 34. As a result, the stage $SST_1$ is transferred (driven) in the +Y direction as shown with the filled arrow in FIG. 34, toward the second scan region $AS_2$, removing the stator $34a_1$ from the recessed portion 35a of the stage $SST_1$.

In parallel with the transfer of the stage $SST_1$, the main control apparatus 50 uses the stage transfer system 36b to transfer the stage $SST_2$ from the second scan region $AS_2$ to the first standby position in the first scan region $AS_1$. The main control apparatus 50 first causes the arm member $36b_3$ to engage the recessed portion 37b of the stage $SST_2$. Next, the main control apparatus 50 releases the restraint between the stator $34b_1$ and the mover $34b_2$ that constitute the fine movement apparatus 34b of the second stage drive system SSDb. Then, the main control apparatus 50 drives the slider $36b_2$ in the direction shown with the outlined arrow (the −Y direction) in FIG. 34. As a result, the stage $SST_2$ is transferred (driven) in the −Y direction shown with the outlined arrow in FIG. 34, toward the first scan region $AS_1$, removing the stator $34b_1$ from the recessed portion 35b of the stage $SST_2$.

Figure 35:
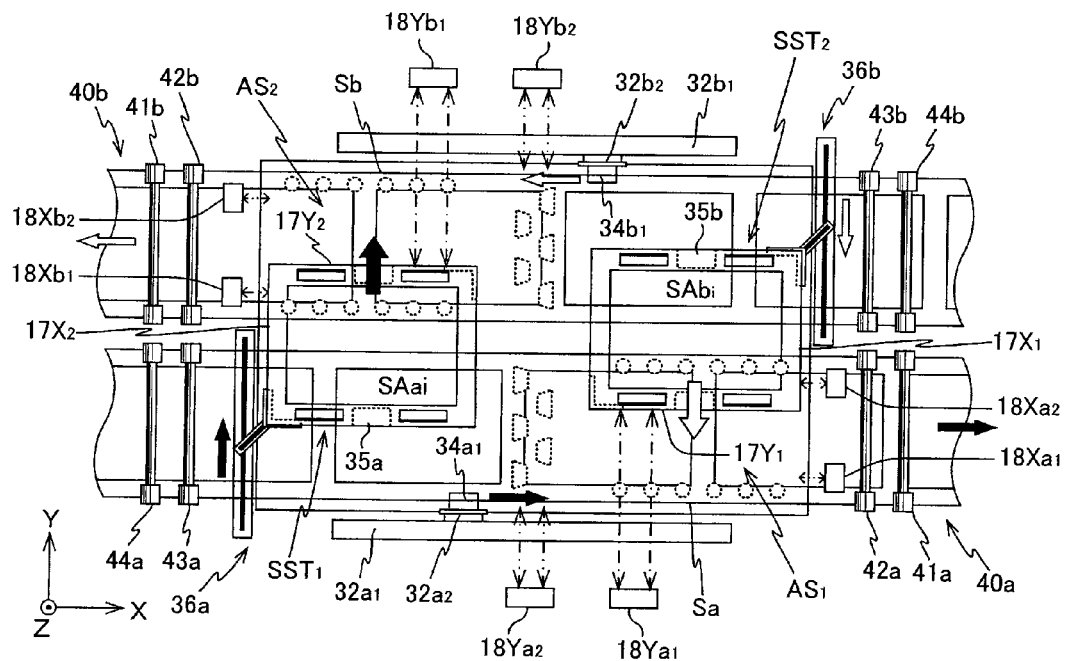
FIG. 35 is a diagram (No. 8) for explaining the parallel processing operation using the two stages in the exposure apparatus of the second embodiment.

As shown in FIG. 34 and FIG. 35, during the transfer of the stage $SST_1$, in accordance with the X position of the stage $SST_1$, the interferometers for measuring its Y position are switched from the interferometers $18Xa_1$, $18Xa_2$ to the interferometers $18Xb_1$, $18Xb_2$ (the interferometers to be used are toggled between the interferometers $18Xa_1$, $18Xa_2$ and $18Xb_1$, $18Xb_2$). Similarly, during the transfer of the stage $SST_2$, in accordance with the Y position of the stage $SST_2$, the interferometers for measuring its X position are switched from the interferometers $18Xb_1$, $18Xb_2$ to the interferometers $18Xa_1$, $18Xa_2$ (the interferometers to be used are toggled between the interferometers $18Xa_1$, $18Xa_2$ and $18Xb_1$, $18Xb_2$).

i3. During the transfer of the stage $SST_1$, the main control apparatus 50 drives the mover $32b_2$, which constitutes the rough movement apparatus 32b of the second stage drive system SSDb, in the −X direction as shown with the outlined arrow in FIG. 35, and positions the stator $34b_1$ fixed on the mover $32b_2$ so as to face the recessed portion 35b of the stage $SST_1$ in transfer. Similarly, the main control apparatus 50 drives the mover $32a_2$, which constitutes the rough movement apparatus 32a of the first stage drive system SSDa, in the +X direction as shown with the filled arrow in FIG. 35, and positions the stator $34a_1$ fixed on the mover $32a_2$ so as to face the recessed portion 35a of the stage $SST_2$ in transfer.

Figure 36:
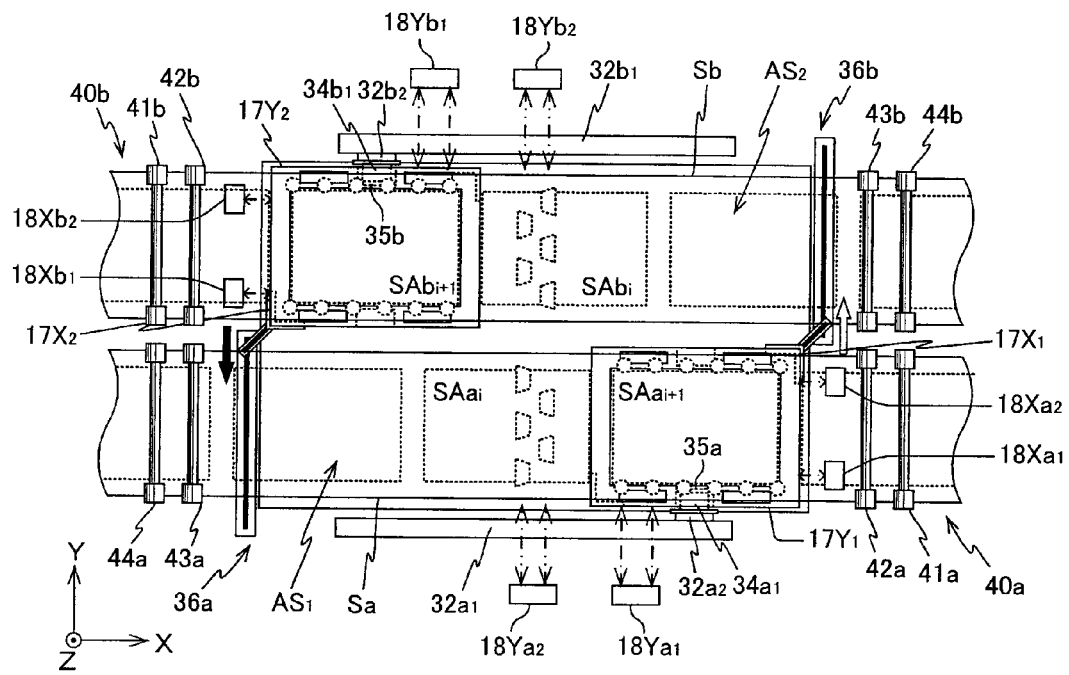
FIG. 36 is a diagram (No. 9) for explaining the parallel processing operation using the two stages in the exposure apparatus of the second embodiment.

As shown in FIG. 36, when the stage $SST_1$ is transferred to the second standby position at the +Y end (on the top surface) of the base member BS by the stage transfer system 36a, the stator $34b_1$, which is fixed on the mover $32b_2$ of the rough movement apparatus 32b of the second stage drive system SSDb, engages (is inserted into) the recessed portion 35b of the stage $SST_1$ in a non-contact manner. Similarly, When the stage $SST_2$ is transferred to the first standby position at the −Y end (on the top surface) of the base member BS by the stage transfer system 36b, the stator $34a_1$, which is fixed on the mover $32a_2$ of the rough movement apparatus 32a of the first stage drive system SSDa, engages (is inserted into) the recessed portion 35a of the stage $SST_2$ in a non-contact manner.

i4. After engagement of the stator $34b_1$ with the recessed portion 35b of the stage $SST_1$, the main control apparatus 50 restrains the stator $34b_1$ and the mover $34b_2$ provided in the stage $SST_1$. As a result, the fine movement apparatus 34b of the second stage drive system SSDb is constituted. Similarly, after engagement of the stator $34a_1$ with the recessed portion 35a of the stage $SST_2$, the main control apparatus 50 restrains the stator $34a_1$ and the mover $34a_2$ provided in the stage $SST_2$. As a result, the fine movement apparatus 34b of the first stage drive system SSDa is constituted.

i5. After that, the main control apparatus 50 drives the slider 36a$_2$ in the −Y direction as shown with a filled arrow in FIG. 36, to thereby return the slider 36a$_2$ to its original position. At the same time, the main control apparatus 50 drives the slider 36b$_2$ in the +Y direction as shown with an outlined arrow in FIG. 36, to thereby return the slider 36b$_2$ to its original position.

As a result, the stage SST$_1$ becomes capable of being driven in the second scan region AS$_2$ by means of the second stage drive system SSDb, and the stage SST$_2$ becomes capable of being driven in the first scan region AS$_1$ by means of the first stage drive system SSDa.

j. Furthermore, in parallel with the switching between (transfer of) the stages SST$_1$, SST$_2$, the main control apparatus 50 controls the sheet transfer system 40a to pull back the sheet Sa in the direction shown with a filled arrow (the +X direction) in FIG. 35, and controls the sheet transfer system 40b to pull back the sheet Sb in the direction shown with the outlined arrow (the −X direction) in FIG. 35.

k. Furthermore, in parallel with the switching between the stages SST$_1$, SST$_2$, the main control apparatus 50 returns the mask stages MSTa, MSTb to their respective scan start positions (the acceleration start positions) at a high speed.

Figure 37:
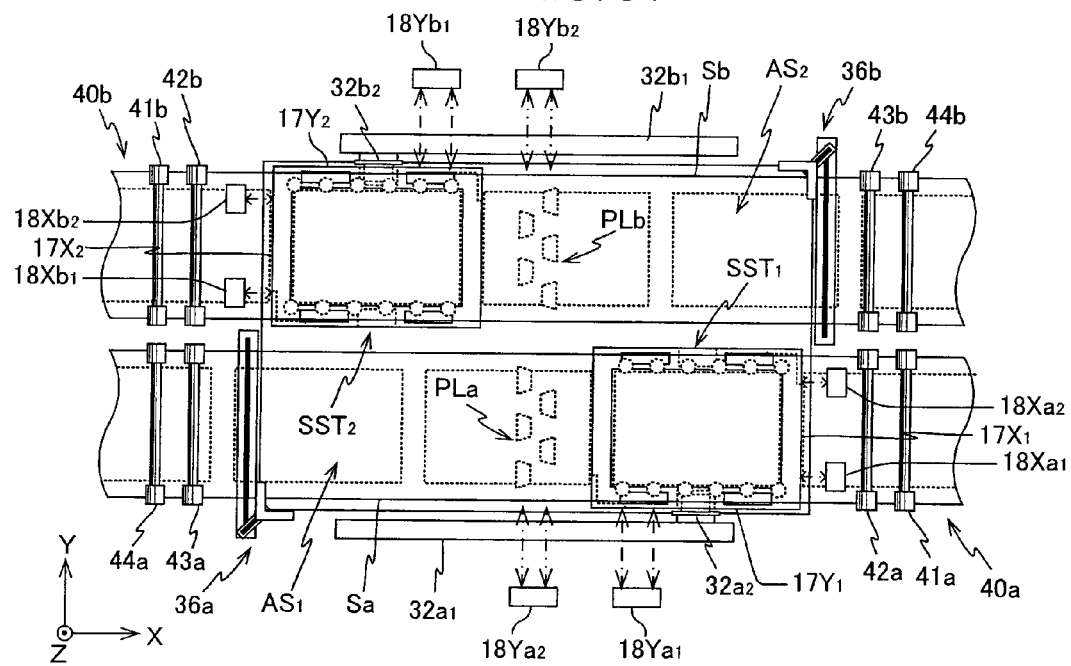
FIG. 37 is a diagram (No. 10) for explaining the parallel processing operation using the two stages in the exposure apparatus of the second embodiment.

As shown in FIG. 37, after completion of the switching between the stage SST$_1$, SST$_2$, and the pull back of the sheets Sa, Sb, the stage SST$_1$ is on standby at the second standby position in the second scan region AS$_2$, and the central portion of the sheet Sb including the next segmented region SAb$_{i+1}$ is aligned with the stage SST$_1$ on standby. In addition, the stage SST$_2$ is on standby at the first standby position in the first scan region AS$_1$, and the central portion of the sheet Sa including the next segmented region SAa$_{i+1}$ is aligned with the stage SST$_2$ on standby. This state is the same as that shown in FIG. 28, the exception being that the stages SST$_1$, SST$_2$ are switched and that the sheets Sa, Sb are fed one segmented region.

Similarly to the above, after completion of the switching between the stages, the main control apparatus 50 uses the stage SST$_2$ instead of the stage SST$_1$ to start exposure on the segmented region SAa$_{i+1}$ of the sheet Sa. In addition, the main control apparatus 50 uses the stage SST$_1$ instead of the stage SST$_2$ to start exposure on the segmented region SAb$_{i+1}$ of the sheet Sb. After this, the main control apparatus 50 similarly repeats the procedure from f. to k., to thereby expose all the segmented regions on the sheets Sa, Sb by alternate use of the stages SST$_1$, SST$_2$.

As has been described in detail, according to the exposure apparatus 1000 of the second embodiment, the stage SST$_1$ adsorbs, at the first standby position, the rear surface portion corresponding to the segmented region SAa$_i$ of the sheet Sa onto the holding surface of the sheet holder SH$_1$, and moves in the feed direction of the sheet Sa (the −X direction) with a predetermined stroke. In parallel with this, the stage SST$_2$ adsorbs, at the aforementioned second standby position, the rear surface portion corresponding to the segmented region SAb$_i$ of the sheet Sb onto the holding surface of the sheet holder SH$_1$, and moves in the feed direction of the sheet Sb (the +X direction) with a predetermined stroke. Therefore, in the movements of the stages SST$_1$, S ST$_2$ in the feed directions of the sheets Sa, Sb, the illumination beams ILa$_1$ to ILa$_5$, ILb$_1$ to ILb$_5$ that correspond to parts of a pattern formed respectively in the pattern regions of the masks Ma, Mb are irradiated onto the sheet Sa, Sb whose surface is coated with a resist, via the projection optical systems PLa$_1$ to PLa$_5$, PLb$_1$ to PLb$_5$. Thereby, the segmented region SAa$_i$ of the sheet Sa and the segmented region SAb$_i$ of the sheet Sb are exposed substantially simultaneously to allow the pattern to be formed thereon. This enables exposure (pattern formation) on the sheet at high throughput by parallel processing.

In the second embodiment, a flat motor similar to that of the first embodiment may be provided instead of the first stage drive system SSDa, the second stage drive system SSDb, and the stage transfer systems 36a, 36b. Then, the flat motor may be used to freely drive the stages SST$_1$, SST$_2$ on the top surface of the base member BS within the two-dimensional XY plane.

On the contrary, in the first embodiment, a first stage drive system SSDa, a second stage drive system SSDb, and stage transfer systems 36a, 36b similar to those of the second embodiment may be provided instead of the flat motor. Then, similarly to the second embodiment, the stages SST$_1$, SST$_2$ may be driven on the base member BS.

In the exposure apparatuses of the above embodiments, the auxiliary sheet holders capable of finely moving in the Z axis direction are provided on the top surface of the stage (table). However, instead of or in addition to their capability of finely moving in the Z axis direction, a sheet holder (SH$_1$) may be made capable of finely moving in the Z axis direction. As a result, the auxiliary sheet holders temporarily holding the sheet and the sheet holder are relatively moved in the Z axis direction, to thereby allow the sheet to be attached/detached to/from the stage (the sheet holder).

Furthermore, in the above embodiments, the transfer roller portions provided in the sheet transfer systems 40, 40a, and 40b may be made capable of moving up and down in the Z axis direction. As a result, the transfer roller portions for extending the sheet are moved up and down, to thereby allow the sheet to be attached/detached to/from the stage (the sheet holder).

In the above embodiments, the description has been for the case where the exposure apparatuses are used to perform exposure for the second and subsequent layers on the sheet with a pattern already formed on its plural segmented regions, by way of example. However, the invention is not limited to this. It is obviously possible to use the exposure apparatuses of the above embodiments to perform exposure for the first layer on an unexposed sheet S.

In the above embodiments, the interferometer systems 18a and 18b are adopted as position measurement systems for the stages SST$_1$, S ST$_2$. However, instead of these, encoders (or encoder systems each made of a plurality of encoders) may be adopted. Alternatively, the interferometer systems 18a and 18b may be used together with encoders. Furthermore, the interferometer systems are adopted as position measurement systems for the mask stages. However, instead of these, encoders (or encoder systems each made of a plurality of encoders) may be adopted. Alternatively, the interferometer systems may be used together with encoders.

In the exposure apparatus 100, 1000 of the above embodiments, an equal-size multi-lens type projection optical system. However, the type is not limited to this. A magnifying multi-lens type projection optical system such as disclosed in U.S. Patent Application No. 2008/0165334 can be used. Obviously, the projection optical system is not limited to a multi-lens type. In addition, the projection optical system is not limited to an equal system and a multiplication system, but may be a reduction system. Moreover, the projection optical system is not limited to a cata-dioptric system, but may be a refractive system or a reflection system. Furthermore, its projected image may be either of an erect image and an inverted image.

As the light source for the exposure apparatus 100, not only an extra-high voltage mercury lamp that emits a bright line such as the g-line (wavelength: 436 nm), the h-line (wavelength: 405 nm), the i-line (wavelength: 365 nm), but also a solid-state laser (such as third harmonic generation of YAG laser; wavelength: 355 nm), the KrF excimer laser (248 nm), the ArF excimer laser (193 nm), the $F_2$ laser (157 nm) may be used.

In the above embodiments, illustration has been for the case where an optical transmission type masks formed with a predetermined shielding pattern (or phase pattern or dimming pattern) on optical transmission substrates are used to project the pattern of the mask onto sheet(s) via projection optical system(s). However, the invention is not limited to this. Instead of the mask, an electron mask (also referred to as a variable molded mask, an active mask, or an image generator) may be used that forms a transmissive pattern or a reflective patter, or an emission pattern based on electronic data on a pattern by use of a s spatial light modulator (SLM) which is an element for spatially modifying the state of amplitude (intensity), phase, or polarity of light traveling in a predetermined direction, for example, a non-light-emitting image display element such as a digital micro-mirror device (DMD), an electrophoretic display (EPD), electronic paper (or electronic ink), a grating light valve, or the like. Such an electronic mask is disclosed in, for example, U.S. Pat. No. 6,778,257. Furthermore, an electronic mask using a transmissive spatial light modulator such as a transmissive liquid crystal display (LCD) or an electrochromic display (ECD) may be used. For example, when an electronic mask using a DMD or the like is used, energy beams corresponding to a pattern to be formed on a sheet material are projected on the sheet material from the electronic mask via a projection optical system, and an image corresponding to the pattern is formed on the sheet material. In this case, if a projection optical system is not used, energy beams corresponding to the pattern are irradiated onto a sheet from an electronic mask, to thereby form the pattern on the sheet.

Applications of the exposure apparatus are not limited to liquid crystal display elements. The exposure apparatus can be widely used for manufacturing, for example, flexible displays as organic EL display elements, electronic paper, and printed wiring boards.

The apparatus for forming a pattern on a sheet is not limited to the aforementioned exposure apparatus (lithography system). The present invention can be applied also to an apparatus for forming a pattern on a sheet on, for example, the ink jet system. In this case, instead of the aforementioned projection optical systems $PL_1$ to $PL_5$ being arrayed along the Y axis direction, a plurality of heads (or a single large head) for ink jet printing may be arranged along the Y axis direction.

<Device Manufacturing Method>

With the formation of a predetermined pattern on sheet(s) by use of either of the exposure apparatuses of the above embodiments, it is possible to manufacture electronic devices, for example, liquid crystal display elements.

[Pattern Formation Step]

First, either of the exposure apparatuses of the above embodiments performs a so-called optical lithography, in which an image corresponding to a pattern to be formed on a sheet is sequentially formed on the sheet coated with a resist via a projection optical system. Through the optical lithography step, predetermined patterns including a multitude of electrodes and the like are formed on the sheet. After that, the exposed sheet goes through the steps including a development step, an etching step, a resist removal step, and the like. Thereby, the predetermined pattern is formed on the sheet.

[Color Filter Formation Step]

Next, color filters in which a multitude of sets of three dots corresponding to red (R), green (G), and blue (B) arrayed in a matrix, or color filters in which a plurality of sets of three stripes of R, G, and B are arrayed in a horizontal scan line direction are formed.

[Cell Assembly Step]

Subsequent to the color filter formation step, a cell assembly step is performed in which the sheets with the predetermined pattern obtained in the pattern formation step, the color filters obtained in the color filter formation step, and the like are assembled into liquid crystal cells. In the cell assembly step, for example liquid crystal is injected between the sheet with the predetermined pattern obtained in the pattern formation step and the color filer obtained in the color filter formation step. Thereby, liquid crystal panels (liquid crystal cells) are manufactured.

[Module Assembly Step]

Subsequently, components such as an electric circuit and a backlight for enabling a display operation of the assembled liquid crystal cell are attached, to thereby complete liquid crystal display elements. Therefore, in the pattern formation step in the microdevice manufacturing method, it is possible to accurately form a pattern image with a desired line width at a desired position. As a result, it is possible to manufacture liquid crystal display elements with high yields.

The exposure apparatuses and the exposure method of the above embodiments are suitable for manufacturing flexible electronic devices (micro devices) including flexible displays. For example, in the first embodiment, a resist coating apparatus for coating a resist on the surface of the sheet S or another apparatus can be arranged between the roller $40_1$ and the exposure apparatus 100 with respect to the longitudinal direction of the sheet, and a development apparatus for developing the sheet S formed with a pattern can be arranged between the exposure apparatus 100 and the winding roller $40_2$ with respect to the longitudinal direction of the sheet, to thereby construct a production line for manufacturing electronic devices.

In general, through forming patterns on the sheet S by use of either of the exposure apparatuses and the exposure method of the above embodiments, and through processing the sheet S, which is formed with the patterns, based on the patterns, it is possible to manufacture a electronic devices that include at least a part of the sheet S. Here, processing the sheet S based on the formed patterns can appropriately include developing, etching, and printing the sheet S based on the formed patterns. Furthermore, the printing can include coating a predetermined material such as conductive ink on the sheet S based on the formed patterns. Note that the printing can include: previously forming a layer of a functional material (for example, material whose properties such as water repellency, hydrophilicity, or hydrophobicity are changed through irradiation of ultraviolet rays) on the sheet S; forming exposure patterns on the layer of the functional material; and coating the sheet S with the material such as the conductive ink correspondingly to the formed exposure patterns.

INDUSTRIAL APPLICABILITY

The exposure apparatus and the exposure method of the present invention is suitable for forming patterns on a long sheet. Furthermore, the device manufacturing method of the present invention is suitable for manufacturing electronic devices (micro devices).

What is claimed is:

1. A pattern formation apparatus that forms a predetermined pattern in a plurality of regions on a surface of a long sheet material by use of a scan exposure in which the sheet material is scan-moved along a first axis parallel to a longitudinal direction of the sheet material while energy beams corresponding to the pattern are irradiated onto the sheet material, comprising
- first and second movable stages each of which has a reference surface capable of adsorbing a rear surface portion of the sheet material and which is movable within a two-dimensional plane parallel to the reference surface including the first axis,
- wherein the first movable stage adsorbs, at a predetermined adsorption position, a rear surface portion corresponding to a first region of the sheet material onto the reference surface, and moves in a direction parallel to the first axis with a predetermined stroke, and
- wherein the second movable stage moves to the predetermined adsorption position within the two-dimensional plane, and adsorbs a rear surface portion corresponding to a second region of the sheet material onto the reference surface.

2. The pattern formation apparatus according to claim 1,
- wherein the second movable stage adsorbs the rear surface portion corresponding to the second region onto the reference surface, and moves in a direction parallel to the first axis with the predetermined stroke, and
- wherein the first movable stage moves to the predetermined adsorption position within the two-dimensional plane, and adsorbs a rear surface portion corresponding to a third region of the sheet material onto the reference surface.

3. The pattern formation apparatus according to claim 1,
- wherein a movement operation of the first movable stage in the direction parallel to the first axis and a movement operation of the second movable stage toward the predetermined adsorption position are performed at least partially in parallel.

4. The pattern formation apparatus according to claim 1,
- wherein, after the adsorption of the sheet material at the predetermined adsorption position and the movement operation in the direction parallel to the first axis, the first and second movable stages releases the adsorption of the sheet material.

5. The pattern formation apparatus according to claim 4,
- wherein the first and second movable stages move to the predetermined adsorption position along routes different from those in the movement operations.

6. The pattern formation apparatus according to claim 1, further comprising
- a flat motor that drives the first and second movable stages within the two-dimensional plane.

7. The pattern formation apparatus according to claim 5, further comprising
- a transfer apparatus that transfers the first and second movable stages along the different routes.

8. The pattern formation apparatus according to claim 1, further comprising
- a drive apparatus that drives the first and second movable stages when the first and second movable stages are moved in the direction parallel to the first axis with the predetermined stroke.

9. The pattern formation apparatus according to claim 8,
- wherein the drive apparatus comprises: a first drive apparatus that finely drives the first and second movable stages in the direction parallel to the two-dimensional plane; and a second drive apparatus that drives the drive apparatus in the direction parallel to the first axis.

10. The pattern formation apparatus according to claim 9,
- wherein each of the first and second movable stages is attachable/detachable to/from the second drive apparatus via a stator of the first drive apparatus, and
- wherein the first drive apparatus consists of a mover provided in each of the first and second movable stages, and the stator.

11. The pattern formation apparatus according to claim 1,
- wherein the first and second movable stages are floatingly supported above a guide surface parallel to the two-dimensional plane.

12. The pattern formation apparatus according to claim 1, further comprising
- a feeding apparatus that feeds the sheet material from a first side to a second side in the direction parallel to the first axis.

13. The pattern formation apparatus according to claim 12,
- wherein the feeding apparatus comprises a drive roller and a pressure roller which are allowed to be set to a first state capable of sandwiching the sheet material and to a second state capable of releasing the sandwiching of the sheet material, and which rotate in directions reverse to each other about a second axis vertical to the first axis within the two-dimensional plane in the first state.

14. The pattern formation apparatus according to claim 1, further comprising
- a projection optical system which projects energy beams corresponding to the pattern onto the sheet material to form an image corresponding to the pattern on the sheet material.

15. The pattern formation apparatus according to claim 14, further comprising:
- a measurement system that measures positional information of the first and second movable stages within the two-dimensional plane; and
- a control apparatus that drives the first and second movable stages based on a measurement result from the measurement system.

16. The pattern formation apparatus according to claim 15, further comprising:
- a mark detection system that detects a plurality of marks on the sheet material; and
- an adjustment apparatus that adjusts an optical property of the projection optical system,
- wherein, in a state with the rear surface portion corresponding to the predetermined region of the sheet material being adsorbed by the first movable stage onto the reference surface, the control apparatus uses the mark detection system prior to the scan exposure to detect at least a part of a plurality of alignment marks affixed on the predetermined region on the sheet material, and adjusts a formation state of the image via at least one of the adjustment apparatus and the first movable stage based on the detection result and a measurement result from the measurement system at a time of the detection.

17. The pattern formation apparatus according to claim 1, wherein another sheet material is provided, further comprising:
- a first feeding apparatus that feeds a first of the two sheet materials from a first side to a second side in the direction parallel to the first axis; and
- a second feeding apparatus that feeds a second of the two sheet materials from the second side to the first side in the direction parallel to the first axis,
- wherein the first movable stage adsorbs, at the predetermined adsorption position, a rear surface portion corresponding to the predetermined region of the first sheet material onto the reference surface, and moves from the first side to the second side in the direction parallel to the first axis with a predetermined stroke, while the second movable stage adsorbs, at another adsorption position, a rear surface portion corresponding to the predetermined region of the second sheet material onto the reference surface, and moves from the second side to the first side in the direction parallel to the first axis with a predetermined stroke, and wherein, after the movements in the direction parallel to the first axis, the second movable stage moves to the predetermined adsorption position within the two-dimensional plane, while the first movable stage moves to the another adsorption position within the two-dimensional plane.

18. A pattern formation apparatus that forms a predetermined pattern in a plurality of regions on a surface of a long sheet material while energy beams corresponding to the pattern are irradiated onto the sheet material, comprising:

a first feeding apparatus that feeds a long first sheet material from a first side to a second side in a direction parallel to a first axis within a two-dimensional plane;

a second feeding apparatus that feeds a long second sheet material from the second side to the first side in the direction parallel to the first axis, at a position spaced from the first sheet material in a direction parallel to a second axis that crosses the first axis within the two-dimensional plane; and first and second movable stages each of which has a reference surface capable of adsorbing rear surface portions of the first and second sheet materials and which is movable within a two-dimensional plane parallel to the reference surface including the first axis, wherein the first movable stage adsorbs, at a predetermined first adsorption position, a rear surface portion corresponding to a first region of the first sheet material onto the reference surface, and moves in a feed direction of the first sheet material with a predetermined stroke, while the second movable stage adsorbs, at a predetermined second adsorption position, a rear surface portion corresponding to a second region of the second sheet material onto the reference surface, and moves in a feed direction of the second sheet material with a predetermined stroke.

19. The pattern formation apparatus according to claim 18, wherein the second movable stage moves to the first adsorption position within the two-dimensional plane after movement in the feed direction of the second sheet material, while the first movable stage moves to the second adsorption position within the two-dimensional plane.

20. The pattern formation apparatus according to claim 18, wherein the first movable stage releases the adsorption of the first sheet material after movement in the feed direction of the first sheet material, and the second movable stage releases the adsorption of the second sheet material after movement in the feed direction of the second sheet material.

21. The pattern formation apparatus according to claim 18, wherein the first and second movable stages circulate in a closed loop including: a first route for movement in the feed direction of the first sheet material with a predetermined stroke; and a second route for movement in the feed direction of the second sheet material with a predetermined stroke.

22. The pattern formation apparatus according to claim 18, further comprising
a flat motor that drives the first and second movable stages within the two-dimensional plane.

23. The pattern formation apparatus according to claim 21, further comprising
a drive apparatus that drives the first and second movable stages along the first and second routes.

24. The pattern formation apparatus according to claim 23, wherein the drive apparatus includes: two first drive apparatuses that finely drive the first and second movable stages in the direction parallel to the two-dimensional plane; and two second drive apparatuses that respectively drive the two first drive apparatuses, respectively along the first and second routes.

25. The pattern formation apparatus according to claim 24, wherein each of the first and second movable stages is attachable/detachable to/from the two second drive apparatuses via stators of the two first drive apparatuses, and wherein each of the two first drive apparatuses includes: one of movers provided respectively in the first and second movable stages; and one of the stators.

26. The pattern formation apparatus according to claim 23, further comprising
a transfer apparatus that transfers the first and second movable stages between the first and second routes.

27. The pattern formation apparatus according to claim 18, wherein the first and second movable stages are floatingly supported above a guide surface parallel to the two-dimensional plane.

28. The pattern formation apparatus according to claim 18, wherein the first and second feeding apparatuses each comprise a drive roller and a pressure roller which are allowed to be set to a first state of respectively sandwiching the first and second sheet materials and to a second state of respectively releasing the sandwiching of the first and second sheet materials, and which rotate in directions reverse to each other about a second axis vertical to the first axis within the two-dimensional plane in the first state.

29. The pattern formation apparatus according to claim 18, further comprising:
a measurement system that measures positional information of the first and second movable stages within the two-dimensional plane; and
a control apparatus that drives the first and second movable stages based on a measurement result from the measurement system.

30. The pattern formation apparatus according to claim 18, further comprising
first and second projection optical systems which project energy beams corresponding to the pattern respectively onto the first and second sheet materials to form an image corresponding to the pattern respectively on the first and second sheet materials.

31. The pattern formation apparatus according to claim 30, further comprising:
first and second mark detection systems that detect a plurality of marks formed respectively on the first and second sheet materials; and
an adjustment apparatus that adjusts optical properties of the first and second projection optical systems in an individual manner,
wherein, in a state with the rear surface portion corresponding to the first region of the first sheet material being adsorbed by the first movable stage onto the reference surface, the control apparatus uses the first mark detection system to detect at least a part of a plurality of alignment marks affixed on the first region, and adjusts a formation state of the image on the first sheet material via at least one of the adjustment apparatus and the first movable stage based on the detection result and a measurement result from the measurement system at a time of the detection, and wherein, in a state with the rear surface portion corresponding to the second region of the first sheet material being adsorbed by the second movable stage onto the reference surface, the control apparatus uses the second mark detection system to detect at least a part of a plurality of alignment marks affixed on the second region, and adjusts a formation state of the image on the second sheet material via at least one of the adjustment apparatus and the second movable stage based on the detection result and a measurement result from the measurement system at a time of the detection.

32. A pattern formation method of forming a predetermined pattern in a plurality of regions on a surface of a long sheet material by use of a scan exposure in which the sheet material is scan-moved along a first axis parallel to a longitudinal direction of the sheet material while energy beams corresponding to the pattern are irradiated onto the sheet material, wherein a first movable stage adsorbs, at a predetermined adsorption position, a rear surface portion corresponding to a first region of the sheet material onto a reference surface, and moves in a direction parallel to the first axis with a predetermined stroke, and wherein a second movable stage moves to the predetermined adsorption position within the two-dimensional plane, and adsorbs a rear surface portion corresponding to a second region of the sheet material onto the reference surface.

33. The pattern formation method according to claim 32, wherein the second movable stage adsorbs the rear surface portion corresponding to the second region onto the reference surface, and moves in a direction parallel to the first axis with the predetermined stroke, and wherein the first movable stage moves to the predetermined adsorption position within the two-dimensional plane, and adsorbs a rear surface portion corresponding to a third region of the sheet material onto the reference surface.

34. The pattern formation method according to claim 32, wherein a movement operation of the first movable stage in the direction parallel to the first axis and a movement operation of the second movable stage toward the predetermined adsorption position are performed at least partially in parallel.

35. The pattern formation method according to claim 32, wherein, after the adsorption of the sheet material at the predetermined adsorption position and the movement operation in the direction parallel to the first axis, the adsorption of the sheet material by the first and second movable stages is released.

36. The pattern formation method according to claim 35, wherein the first and second movable stages move to the predetermined adsorption position along routes different from those in the movement operations.

37. The pattern formation method according to claim 32, wherein another sheet material is provided;

wherein the first movable stage adsorbs, at the predetermined adsorption position, a rear surface portion corresponding to the first region of the first sheet material onto the reference surface, and moves from the first side to the second side in the direction parallel to the first axis with a predetermined stroke, while the second movable stage adsorbs, at another adsorption position, a rear surface portion corresponding to a predetermined region of the second sheet material onto the reference surface, and moves from the second side to the first side in the direction parallel to the first axis with a predetermined stroke, and wherein, after that, the second movable stage moves to the predetermined adsorption position within the two-dimensional plane, while the first movable stage moves to the another adsorption position within the two-dimensional plane.

38. The pattern formation method according to claim 37, positional information of the first and second movable stages within the two-dimensional plane is measured, and the first and second movable stages are driven based on the measurement result.

39. The pattern formation method according to claim 37, wherein an image corresponding to the pattern is formed on the two sheet materials respectively via first and second projection optical systems, wherein, in a state with a rear surface portion corresponding to the predetermined region of a first of the two sheet materials being adsorbed by one of the first and second movable stages onto the reference surface, at least a part of a plurality of alignment marks affixed on the predetermined region on the first sheet material is detected prior to the scan exposure, and wherein, based on the detection result and positional information of the one of the movable stages, at least either of an optical property of the projection optical system corresponding to the first sheet material and the one of the movable stages is adjusted, to thereby adjust a formation state of the image on the first sheet material.

40. A device manufacturing method comprising:

using the pattern formation method according to any one of claims 32 to 39 to form patterns on a long sheet material; and subjecting the sheet material formed with the patterns to processing.

* * * * *